US012795811B2

(12) United States Patent
Urashima et al.

(10) Patent No.: US 12,795,811 B2
(45) Date of Patent: Nov. 10, 2026

(54) WIRING SUBSTRATE

(71) Applicant: Resonac Corporation, Tokyo (JP)

(72) Inventors: Kosuke Urashima, Tokyo (JP); Motoki Yonekura, Tokyo (JP); Motohiro Arifuku, Tokyo (JP); Tomohiko Kotake, Tokyo (JP); Etsuo Mizushima, Tokyo (JP)

( * ) Notice: Subject to any disclaimer, the term of this patent is extended or adjusted under 35 U.S.C. 154(b) by 155 days.

(21) Appl. No.: 18/555,866

(22) PCT Filed: Nov. 16, 2021

(86) PCT No.: PCT/JP2021/042015
§ 371 (c)(1),
(2) Date: Dec. 18, 2023

(87) PCT Pub. No.: WO2022/224473
PCT Pub. Date: Oct. 27, 2022

(65) Prior Publication Data

US 2024/0224413 A1 Jul. 4, 2024

(30) Foreign Application Priority Data

Apr. 21, 2021 (JP) ................................ 2021-071939

(51) Int. Cl.
*H05K 1/02* (2006.01)
*H05K 3/06* (2006.01)
*H05K 3/28* (2006.01)

(52) U.S. Cl.
CPC ............. *H05K 1/0237* (2013.01); *H05K 3/06* (2013.01); *H05K 3/28* (2013.01); *H05K 2201/0753* (2013.01); *H05K 2201/083* (2013.01); *H05K 2201/10287* (2013.01); *H05K 2203/063* (2013.01)

(58) Field of Classification Search
CPC .. H05K 1/024; H05K 1/0237; H05K 2201/08; H05K 2201/083; H05K 2201/086; H05K 1/0233; H05K 3/28
See application file for complete search history.

(56) References Cited

U.S. PATENT DOCUMENTS

| | | | | |
|---|---|---|---|---|
| 6,111,479 A | | 8/2000 | Myohga et al. | |
| 2008/0022518 A1* | | 1/2008 | Mizutani ................ | H05K 1/024 174/250 |

(Continued)

FOREIGN PATENT DOCUMENTS

| | | |
|---|---|---|
| JP | H5-160344 | 6/1993 |
| JP | H5-315732 | 11/1993 |
| JP | H5-335780 | 12/1993 |

(Continued)

OTHER PUBLICATIONS

International Search Report dated Feb. 15, 2022 for PCT/JP2021/042015.

(Continued)

*Primary Examiner* — Jeremy C Norris
(74) *Attorney, Agent, or Firm* — SHIPWAY IP

(57) ABSTRACT

A wiring substrate includes a substrate, conductor wiring provided on the substrate, and an insulator positioned on at least a part of the periphery of the conductor wiring, in which the insulator contains a magnetic material. The wiring substrate ensures little loss in transmission even in high-frequency band.

8 Claims, 19 Drawing Sheets

(56) References Cited

U.S. PATENT DOCUMENTS

| | | | | |
|---|---|---|---|---|
| 2019/0390061 | A1* | 12/2019 | Cheng | B32B 15/09 |
| 2021/0068255 | A1* | 3/2021 | Takemoto | H05K 1/165 |

FOREIGN PATENT DOCUMENTS

| | | |
|---|---|---|
| JP | H8-017656 | 1/1996 |
| JP | H10-242602 | 9/1998 |
| JP | 2000-040893 | 2/2000 |
| JP | 2000-319386 | 11/2000 |
| JP | 2002-012667 | 1/2002 |
| JP | 2004-056144 | 2/2004 |
| JP | 2006-019567 | 1/2006 |
| JP | 2019-067960 | 4/2019 |
| JP | 2019-165222 | 9/2019 |
| JP | 2021-016006 | 2/2021 |
| WO | 2010/053185 | 5/2010 |
| WO | 2014/034103 | 3/2014 |

OTHER PUBLICATIONS

International Preliminary Report on Patentability with Written Opinion dated Nov. 2, 2023 for PCT/JP2021/042015.

Extended Search Report in corresponding European Application No. 21937963.3 dated Sep. 6, 2024.

* cited by examiner (a)

(b)

(d)

(e)

(a)

(b)

(d)

(e)

(a)

(b)

(c)

WIRING SUBSTRATE

CROSS-REFERENCE TO RELATED APPLICATIONS

This application is a 35 U.S.C. § 371 national phase application of PCT/JP2021/042015, filed on Nov. 16, 2021, which claims priority to Japanese Patent Application No. 2021-071939, filed on Apr. 21, 2021.

TECHNICAL FIELD

The present invention relates to a wiring substrate.

BACKGROUND ART

In a mobile communication device represented by a mobile phone, a network-related electronic device such as a base station device, a server, or a router, a large computer, or the like, there is a demand for transmitting/processing a large amount of information at a high speed with a low loss. In order to respond to such a demand, in a printed circuit board to be mounted in the device as described above, the frequency of an electric signal to be handled has been increased. However, since the electric signal has properties of being easily attenuated as the frequency increases, the printed circuit board handling a high-frequency electric signal is required to have a lower transmission loss than the related art.

In response to the demand described above, for example, countermeasures such as suppressing the transmission loss due to large surface roughness of a conductor layer including wiring by decreasing the surface roughness of the conductor layer (for example, refer to Patent Literature 1 described below) or reducing the transmission loss due to a dielectric by using a polyphenylene ether-containing resin or the like with a small permittivity or dielectric dissipation factor in a substrate material (for example, refer to Patent Literature 2 described below) are known.

CITATION LIST

Patent Literature

Patent Literature 1: Japanese Unexamined Patent Publication No. 2021-016006

Patent Literature 2: International Publication No. 2014/034103 Pamphlet

SUMMARY OF INVENTION

Technical Problem

However, in a case where the frequency of the electric signal is further increased in post 5G/6G, it is difficult to respond to a decrease in the transmission loss only by the countermeasures described above.

Therefore, an object of the present invention is to provide a wiring substrate with a small transmission loss in a high-frequency band.

Solution to Problem

One aspect of the present invention provides a wiring substrate including a substrate, conductor wiring provided on the substrate, and an insulator positioned in at least a part of the periphery of the conductor wiring, in which the insulator contains a magnetic material.

According to the wiring substrate described above, it is possible to decrease the transmission loss in the high-frequency band. As a reason for obtaining such an effect, it is considered that magnetic flux generated at a high frequency passes through the insulator including the magnetic material to reduce an eddy current inside the conductor wiring, and to decrease a skin effect.

In one aspect, the conductor wiring may include a bottom surface positioned on the substrate side, a top surface positioned on a side opposite to the substrate, and a pair of lateral surfaces positioned between the bottom surface and the top surface, and the insulator may cover at least one surface among the bottom surface, the top surface, and the pair of lateral surfaces of the conductor wiring.

In one aspect, the insulator may cover the bottom surface, the top surface, and the pair of lateral surfaces of the conductor wiring.

In one aspect, the insulator may cover only the bottom surface among the bottom surface, the top surface, and the pair of lateral surfaces of the conductor wiring.

In one aspect, the insulator may cover only the top surface among the bottom surface, the top surface, and the pair of lateral surfaces of the conductor wiring.

In one aspect, the insulator may cover only the pair of lateral surfaces among the bottom surface, the top surface, and the pair of lateral surfaces of the conductor wiring.

In one aspect, the insulator may cover only one of the pair of lateral surfaces among the bottom surface, the top surface, and the pair of lateral surfaces of the conductor wiring.

In one aspect, the insulator may cover only the bottom surface and the top surface among the bottom surface, the top surface, and the pair of lateral surfaces of the conductor wiring.

In one aspect, the insulator may cover only the bottom surface and the pair of lateral surfaces among the bottom surface, the top surface, and the pair of lateral surfaces of the conductor wiring.

In one aspect, the insulator may cover only the bottom surface and one of the pair of lateral surfaces among the bottom surface, the top surface, and the pair of lateral surfaces of the conductor wiring.

In one aspect, the insulator may cover only the bottom surface and one of the pair of lateral surfaces among the bottom surface, the top surface, and the pair of lateral surfaces of the conductor wiring.

In one aspect, the insulator may cover only the bottom surface, the top surface, and one of the pair of lateral surfaces among the bottom surface, the top surface, and the pair of lateral surfaces of the conductor wiring.

In one aspect, the insulator may cover only the top surface and the pair of lateral surfaces among the bottom surface, the top surface, and the pair of lateral surfaces of the conductor wiring.

In one aspect, the insulator may cover only the top surface and one of the pair of lateral surfaces among the bottom surface, the top surface, and the pair of lateral surfaces of the conductor wiring.

In one aspect, from the viewpoint of ease of signal propagation, a covering thickness of the insulator may be 0.1 to 100 μm.

In one aspect, from the viewpoint of insulating properties, the magnetic material may be a metal oxide or an amorphous metal.

In one aspect, from the viewpoint of suppressing the transmission loss, a relative magnetic permeability of the insulator may be 2 to 1000.

In one aspect, from the viewpoint of suppressing the transmission loss, a relative permittivity of the insulator may be 1 to 30.

Advantageous Effects of Invention

According to the present invention, it is possible to provide the wiring substrate with a small transmission loss in the high-frequency band.

DESCRIPTION OF EMBODIMENTS

Figure 1:
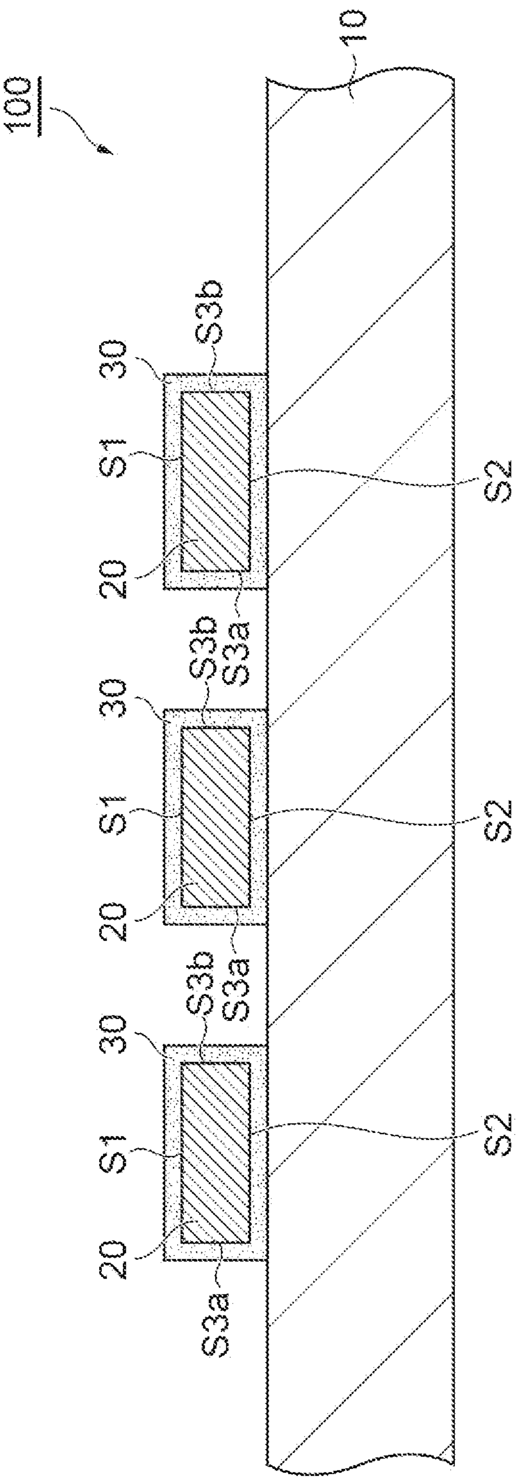
FIG. 1 is a schematic sectional view illustrating one embodiment of a wiring substrate.

Hereinafter, embodiments of the present invention will be described in detail, with reference to the drawings. In the following description, the same reference numerals will be applied to the same or corresponding parts, and the repeated description will be omitted. In addition, a positional relationship such as the left, right, top, and bottom is based on a positional relationship illustrated in the drawings, unless otherwise specified. Further, a dimension ratio in the drawings is not limited to the illustrated ratio.

Note that, the term "layer" includes not only a structure in which a layer is formed on the entire surface but also a structure in which a layer is formed on a part of the surface when observed as a plan view. In addition, materials exemplified below may be used alone, or two or more types thereof may be used in combination, unless otherwise specified. In a case where there are a plurality of substances corresponding to each component in a composition, unless otherwise specified, the content of each component in the composition indicates the total amount of the plurality of substances in the composition. A numerical range represented by using "to" indicates a range including numerical values described before and after "to" as the minimum value and the maximum value, respectively. In numerical ranges described in stages in this specification, the upper limit value or the lower limit value of a numerical range in a certain stage may be replaced with the upper limit value or the lower limit value of a numerical range in the other stage. In the numerical range described in this specification, the upper limit value or the lower limit value of the numerical range may be replaced with values described in Examples. In this specification, "(meth)acrylate" indicates at least one of acrylate and methacrylate corresponding thereto. The same applies to other similar expressions such as a "(meth) acryloyl".

<Wiring Substrate>

A wiring substrate of this embodiment includes a substrate, conductor wiring provided on the substrate, and an insulator provided in at least a part of the periphery of the conductor wiring, in which the insulator contains a magnetic material.

FIG. 1 is a schematic sectional view illustrating one embodiment of the wiring substrate. A wiring substrate 100 illustrated in FIG. 1 includes a substrate 10, a conductor wiring 20 provided on the main surface of the substrate 10, and an insulating magnetic layer 30 consisting of an insulator containing a magnetic material, which is provided on the periphery of the conductor wiring 20. The conductor wiring 20 includes a bottom surface S2 positioned on the substrate 10 side, a top surface S1 positioned on a side opposite to the substrate, and a pair of lateral surfaces **S3*a* and S3*b* positioned between the bottom surface S2 and the top surface S1**.

In the wiring substrate 100 illustrated in FIG. 1, the insulating magnetic layer 30 is provided to cover the bottom surface S2, the top surface S1, and the pair of lateral surfaces **S3*a* and S3*b* of the conductor wiring 20**.

Figure 2:
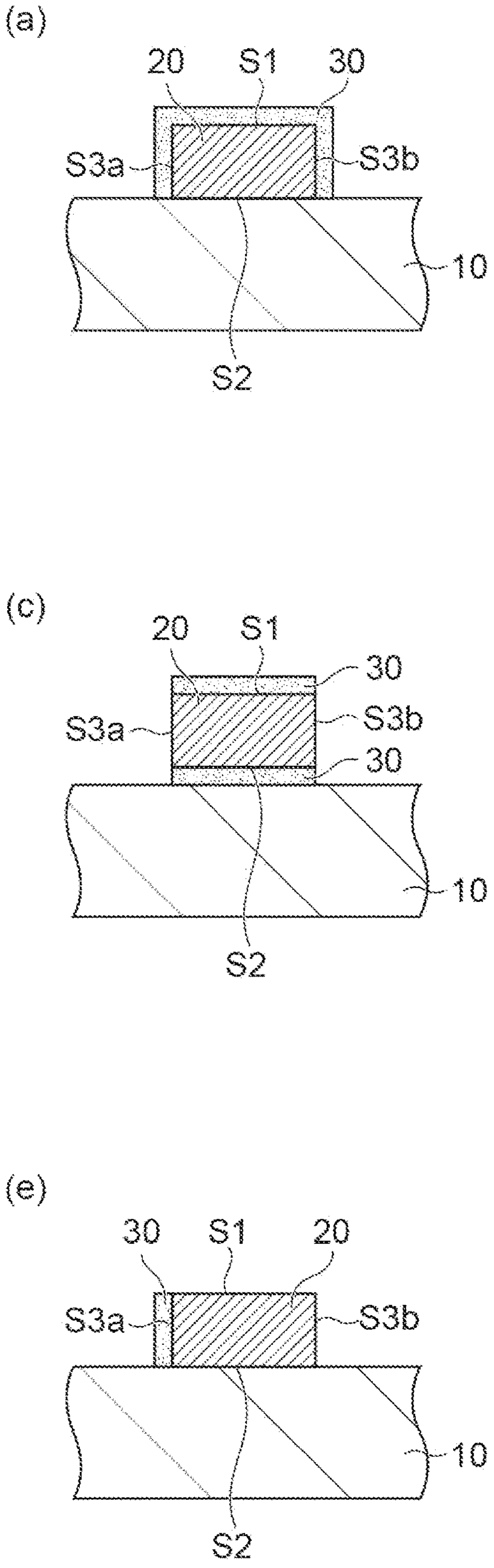
FIG. 2 is a schematic sectional view illustrating another embodiment of the wiring substrate.
Figure 3:
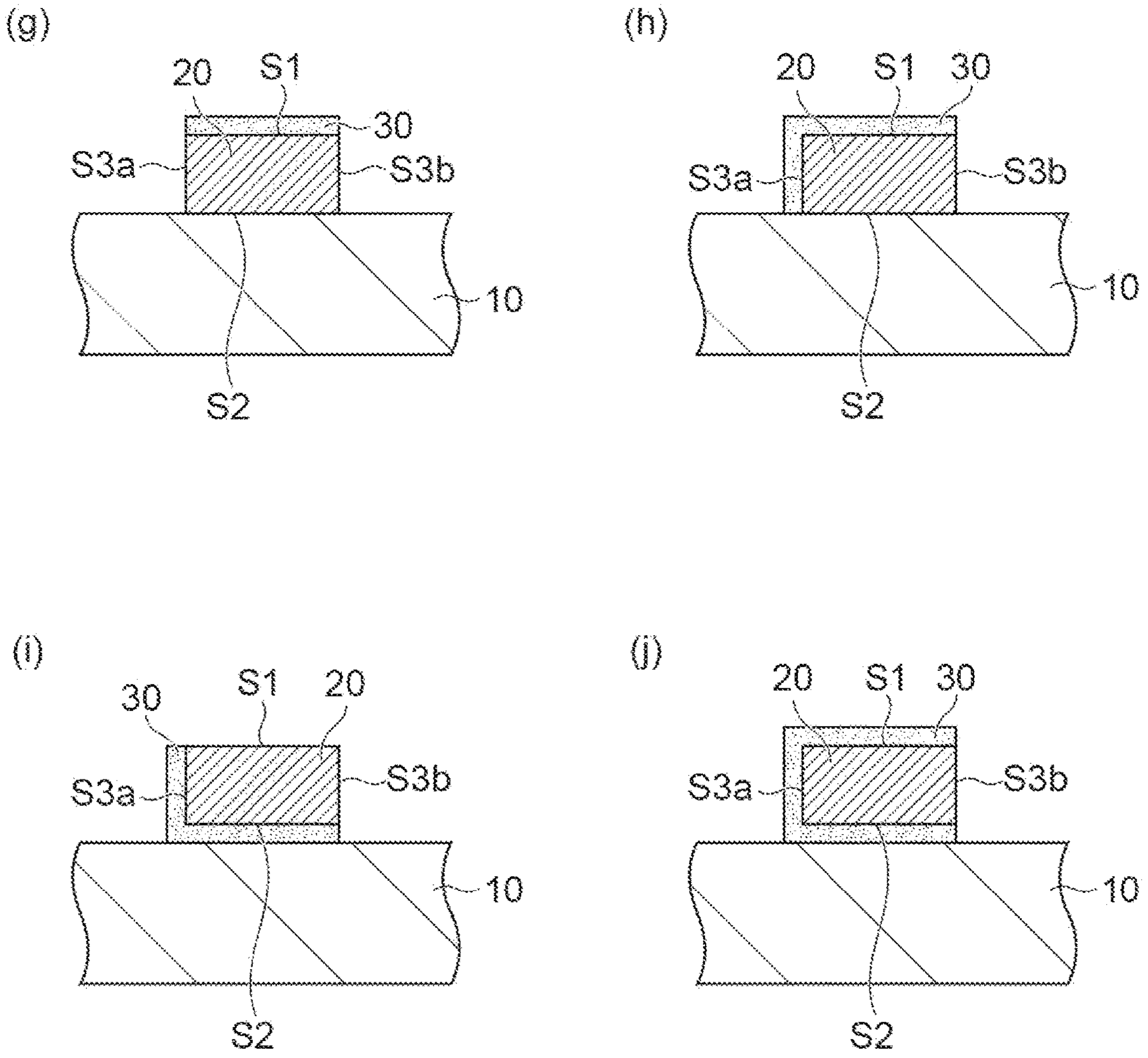
FIG. 3 is a schematic sectional view illustrating another embodiment of the wiring substrate.

The wiring substrate of this embodiment, as illustrated in FIG. 2, may be (a) the insulating magnetic layer 30 covers the top surface S1 and the pair of lateral surfaces **S3*a* and S3*b* of the conductor wiring 20 but does not cover the bottom surface S2, (b) the insulating magnetic layer 30 covers only the bottom surface S2 of the conductor wiring 20, (c) the insulating magnetic layer 30 covers the top surface S1 and the bottom surface S2 of the conductor wiring 20 but does not cover the pair of lateral surfaces S3*a*** and S3*b*, (d) the insulating magnetic layer 30 covers the pair of lateral surfaces S3*a* and S3*b* of the conductor wiring 20 but does not cover the top surface S1 and the bottom surface S2, (e) the insulating magnetic layer 30 covers only one lateral surface S3*a* of the conductor wiring 20, or (f) the insulating magnetic layer 30 covers the bottom surface S2 and the pair of lateral surfaces S3*a* and S3*b* of the conductor wiring 20 but does not cover the top surface S1, or as illustrated in FIG. 3, may be (g) the insulating magnetic layer 30 covers the top surface S1 of the conductor wiring 20 but does not cover the bottom surface S2 and the pair of lateral surfaces S3*a* and S3*b*, (h) the insulating magnetic layer 30 covers the top surface S1 and one lateral surface S3*a* of the pair of lateral surfaces of the conductor wiring 20 but does not cover the bottom surface S2 and the other lateral surface S3*b* of the pair of lateral surfaces, (i) the insulating magnetic layer 30 covers the bottom surface S2 and one lateral surface S3*a* of the pair of lateral surfaces of the conductor wiring 20 but does not cover the top surface S1 and the other lateral surface S3*b* of the pair of lateral surfaces, or (j) the insulating magnetic layer 30 covers the top surface S1, the bottom surface S2, and one lateral surface S3*a* of the pair of lateral surfaces of the conductor wiring 20 but does not cover the other lateral surface S3*b* of the pair of lateral surfaces.

Figure 4:
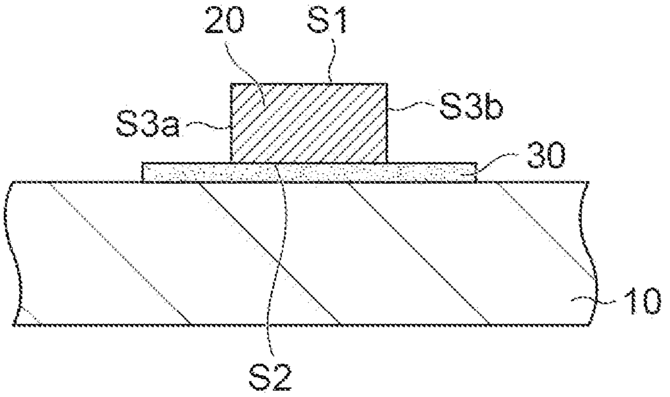
FIG. 4 is a schematic sectional view illustrating another embodiment of the wiring substrate.
Figure 4:
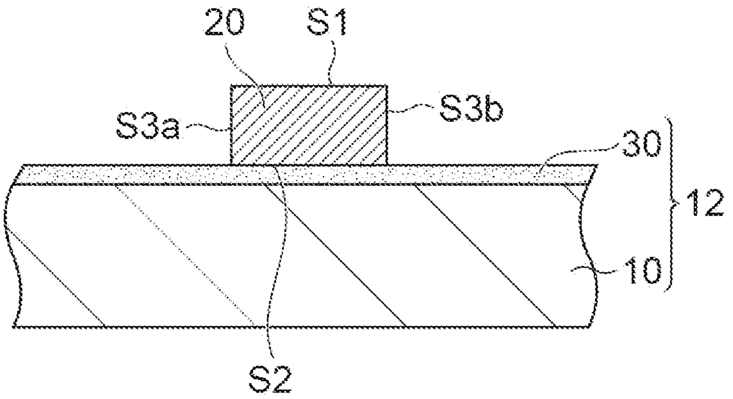

In addition, the insulating magnetic layer 30 covering the conductor wiring 20 may not be provided in accordance with the shape of the surface of the conductor wiring to be covered, or may be wider than the surface of the conductor wiring to be covered. For example, as illustrated in FIG. 4(*a*), the bottom surface S2 of the conductor wiring 20 may be covered with the insulating magnetic layer 30 wider than the bottom surface S2 of the conductor wiring 20. In addition, as illustrated in FIG. 4(*b*), the wiring substrate according to this embodiment may have a configuration including a substrate 12 with an insulating magnetic layer in which the insulating magnetic layer 30 is provided on the main surface of the substrate 10, and the conductor wiring 20 provided on the insulating magnetic layer 30 of the substrate 12 with an insulating magnetic layer. In this case, the bottom surface S2 of the conductor wiring 20 is covered with the insulating magnetic layer 30.

In a case where the wiring substrate of this embodiment includes the insulating magnetic layer covering the lateral surfaces of the conductor wiring, a region in which the insulating magnetic layer does not exist can be provided between the lateral surfaces of the conductor wirings adjacent to each other. For example, the wiring substrate 100 illustrated in FIG. 1 includes the region in which the insulating magnetic layer does not exist between the insulating magnetic layer 30 covering the lateral surface 3*b* of the conductor wiring 20 and the insulating magnetic layer 30 covering the lateral surface 3*a* of the adjacent conductor wiring 20.

As the substrate 10, for example, a substrate obtained by pasting several known prepregs and performing a pressurizing and heating treatment can be used. As the prepreg, a prepreg produced by impregnating a fiber base material (a reinforced fiber) such as a glass fiber and an organic fiber with a prepared resin varnish in accordance with a known method can be used, and examples thereof include a glass-epoxy composite substrate. In addition, as a core material to which the prepreg is pasted, a metal substrate or a ceramic substrate may be used. Further, as the substrate 10, a known low-dielectric substrate such as a substrate using a low-dielectric resin material such as a polyimide-based resin, a fluorine-based resin, and a liquid crystal polymer (LCP) can be used.

Examples of the resin material configuring the substrate 10 include a resin such as a thermosetting resin and a thermoplastic resin. The resin materials may be used alone or two or more types thereof may be used together.

Examples of the thermosetting resin include a polycarbonate resin, a thermosetting polyimide resin, a thermosetting fluorinated polyimide resin, an epoxy resin, a phenolic resin, a urea resin, a melamine resin, a diallyl phthalate resin, a silicone resin, a thermosetting urethane resin, a fluorine resin, and a liquid crystal polymer. Examples of the fluorine resin include a polymer of fluorine-containing olefin such as polytetrafluoroethylene (PTFE).

Examples of the thermoplastic resin include an olefin resin, an acrylic resin, a polystyrene resin, a polyester resin, a polyacrylonitrile resin, a maleimide resin, a polyvinyl acetate resin, an ethylene-vinyl acetate copolymer, a polyvinyl alcohol resin, a polyamide resin, a polyvinyl chloride resin, a polyacetal resin, a polyphenylene oxide resin, a polyphenylene sulfide resin, a polysulfone resin, a polyether sulfone resin, a polyether ether ketone resin, a polyallyl sulfone resin, a thermoplastic polyimide resin, a thermoplastic fluorinated polyimide resin, a thermoplastic urethane resin, a polyether imide resin, a polymethyl pentene resin, a cellulose resin, a liquid crystal polymer, and an ionomer.

The substrate 10 may be a single layer, or may be a multi-layer. The substrate may include a bonding adhesive layer on the surface. The thickness of the substrate 10 may be 10 μm to 1 mm.

Examples of a conductor configuring the conductor wiring 20 include a metal such as copper, gold, silver, and nickel. The conductor wiring 20 may have a predetermined pattern, and for example, may be formed by performing a known patterning treatment such as a photolithography method with respect to a metal foil such as a copper foil, a nickel foil, and an aluminum foil, which bonding-adheres onto the substrate 10. In addition, the conductor wiring 20 may be formed by a semi-additive process.

The thickness of the conductor wiring 20 may be 5 to 50 μm. The width of the conductor wiring 20 may be 5 to 300 μm.

The insulating magnetic layer 30 consists of the insulator containing the magnetic material. In the insulator containing the magnetic material, the magnetic material may be dispersed in an insulating material. In addition, in a case where the magnetic material has insulating properties, the insulator containing the magnetic material may be formed of the magnetic material having the insulating properties.

The magnetic material, for example, may be at least one type of magnetic powder selected from the group consisting of an elemental metal, an alloy, and a metal compound. The alloy may contain at least one type selected from the group consisting of a solid solution, eutectic crystals, an amorphous (non-crystalline) metal, and an intermetallic compound. Examples of the metal compound include a metal oxide.

The magnetic material may be a metal oxide or an amorphous (non-crystalline) metal, or may be a metal glass magnetic powder, from the viewpoint of the insulating properties. Examples of the metal oxide include ferrite. Examples of the amorphous (non-crystalline) metal include a Fe-based nanocrystalline alloy and a Co-based nanocrystalline alloy.

The magnetic powder may contain one type of metal element or a plurality of types of metal elements. The metal element contained in the magnetic powder, for example, may be a base metal element, a noble metal element, a transition metal element, or a rare-earth element. The metal element contained in the magnetic powder, for example, may be at least one type selected from the group consisting of iron (Fe), copper (Cu), titanium (Ti), manganese (Mn), cobalt (Co), nickel (Ni), zinc (Zn), aluminum (Al), tin (Sn), chromium (Cr), barium (Ba), strontium (Sr), lead (Pb), silver (Ag), praseodymium (Pr), neodymium (Nd), samarium (Sm), and dysprosium (Dy). The magnetic powder may contain elements other than the metal element. The magnetic powder, for example, may contain oxygen, boron, or silicon.

As the magnetic powder, at least one type of composition selected from the group consisting of a Fe–Si-based alloy, a Fe—Si—Al-based alloy (sendust), a Fe—Ni-based alloy (permalloy), a Fe—Cu—Ni-based alloy (permalloy), a Fe—Cr—Si-based alloy, a Fe—Cr-based alloy, a Fe—Ni—Cr-based alloy (electromagnetic stainless steel), a Nd—Fe—B-based alloy (a rare-earth magnet), an Al—Ni—Co-based alloy (an alnico magnet), and ferrite can be used. The ferrite, for example, may be spinel ferrite, hexagonal ferrite, or garnet ferrite.

The Fe-based alloy may be a Fe amorphous alloy. A Fe amorphous alloy powder is a non-crystalline powder obtained by rapidly cooling an alloy in which Fe to be a main component is melted at a high temperature together with other elements such as Si, and is also known as metal glass. The Fe amorphous alloy powder can be manufactured in accordance with a method well known in this technical field. As the Fe amorphous alloy powder, a commercially available product such as Product Names "AW2-08" and "KUAMET-6B2", which are manufactured by EPSON ATMIX Corporation, Product Names "DAPMS3", "DAPMS7", "DAPMSA10", "DAPPB", "DAPPC", "DAPMKV49", "DAP410L", "DAP430L", and "DAPHYB Series", which are manufactured by Daido Steel Co., Ltd., and Product Names "MH45D", "MH28D", "MH25D", and "MH20D", which are manufactured by Kobe Steel, Ltd., can be used.

The magnetic powder may contain one type among the elements and the compositions described above, or may contain a plurality of types among the elements and the compositions described above.

The magnetic powder may be in the shape of a sphere, an approximate sphere, a flake, or an ellipse. In addition, the magnetic powder may have various other shapes in which a corner is partially formed. From the viewpoint of fluidity, the magnetic powder may be in the shape of a sphere.

The average particle diameter of the magnetic powder may be 0.005 to 50 μm. The "average particle diameter" described in this specification indicates a particle diameter at a cumulative value of 50% (volume basis) in a particle size distribution. In order for close packing, a mixture of particles with two or three types of average particle diameters can be used as the magnetic powder.

The magnetic powder may include a film on the surface. The film, for example, can be formed of an inorganic salt, an acrylic resin, a silicic acid compound, or the like. In addition, in the magnetic powder, the entire or a part of the surface may be covered with a surface treatment agent. The surface treatment agent, for example, may be an inorganic surface treatment agent such as an inorganic oxide, a phosphoric acid-based compound and a phosphate-based compound, and a silane coupling agent, an organic surface treatment agent such as montan wax, and a resin cured product. As the surface treatment agent, a coupling agent described below can also be used. For example, in a metal-based magnetic powder such as a Fe-based alloy, the entire or a part of the surface may be covered with an insulating material. Examples of the insulating material include silica, titania, calcium phosphate, montan wax, and an epoxy resin cured product.

The magnetic powder may include a magnetic powder of which the surface is covered with the insulating material (hereinafter, referred to as a magnetic powder with insulating coating). Only one type of magnetic powder with insulating coating can be used alone, or two or more types thereof can be used in combination. The average particle diameters of two or more types of magnetic powders with insulating coating may be identical to each other, or may be different from each other. In addition, the magnetic powder with insulating coating and a magnetic powder without insulating coating (hereinafter, referred to as an uncoated magnetic powder) may be used together. The average particle diameter of the uncoated magnetic powder may be identical to or different from the average particle diameter of the magnetic powder with insulating coating. For example, from the viewpoint of exhibiting the insulating properties, the average particle diameter of the uncoated magnetic powder may be less than the average particle diameter of the magnetic powder with insulating coating.

The magnetic powder with insulating coating may be a Fe amorphous alloy powder with insulating coating. As such a magnetic powder with insulating coating, for example, a commercially available product such as "KUAMET9A4" (a Fe—Si—B-based alloy, D50: 20 μm, with insulating coating), manufactured by EPSON ATMIX Corporation, and "SAP-2D(C)" (a Fe—Si—B—PNb—Cr-based alloy, D50: 2.3 μm, with insulating coating), manufactured by SINTOKOGIO, LTD., can be used. As the uncoated magnetic powder, for example, a commercially available product such as "SAP-2D" (a Fe—Si—B—PNb—Cr-based alloy, D50: 2.3 μm, without insulating coating), manufactured by SINTOKOGIO, LTD., or a soft ferrite powder "BSN-125" (a Ni—Zn-based alloy, D50: 10 μm, without insulating coating), manufactured by TODA KOGYO CORP., can be used.

Examples of the insulating material include a resin. The insulating material may be formed of a resin composition. The resin composition may contain an epoxy resin.

Examples of the epoxy resin include an epoxy resin having a condensed-ring structure, such as a naphthalene-type epoxy resin, a naphthalene-type tetrafunctional epoxy resin, a naphthol-type epoxy resin, a naphthylene ether-type epoxy resin, an anthracene-type epoxy resin, a dicyclopentadiene-type epoxy resin, a naphthalene-type epoxy resin, a naphthalene-type tetrafunctional epoxy resin, a naphthol-type epoxy resin, a naphthylene ether-type epoxy resin, and a dicyclopentadiene-type epoxy resin; a bisphenol A-type epoxy resin; a bisphenol F-type epoxy resin; a bisphenol S-type epoxy resin; a bisphenol AF-type epoxy resin; a trisphenol-type epoxy resin; a novolac-type epoxy resin; a naphthol novolac-type epoxy resin; a phenol novolac-type epoxy resin; a tert-butyl-catechol-type epoxy resin; a glycidyl amine-type epoxy resin; a glycidyl ester-type epoxy resin; a cresol novolac-type epoxy resin; a biphenyl-type epoxy resin; a linear aliphatic epoxy resin; an epoxy resin having a butadiene structure; an alicyclic epoxy resin; a heterocyclic epoxy resin; a spiro ring-containing epoxy resin; a cyclohexane dimethanol-type epoxy resin; a trimethylol-type epoxy resin; a tetraphenyl ethane-type epoxy resin; and a bixylenol-type epoxy resin. Only one type of epoxy resin can be used alone, or two or more types thereof can be used in combination.

The epoxy resin may be an epoxy resin having two or more epoxy groups in one molecule. In addition, the epoxy resin may be a liquid or a solid at a temperature of 25° C.

As the epoxy resin that is a liquid at 25° C. (hereinafter, also referred to as a "liquid epoxy resin"), a bisphenol A-type epoxy resin, a bisphenol F-type epoxy resin, a bisphenol AF-type epoxy resin, a naphthalene-type epoxy resin, a glycidyl ester-type epoxy resin, a glycidyl amine-type epoxy resin, a phenol novolac-type epoxy resin, an alicyclic epoxy resin having an ester skeleton, a cyclohexane dimethanol-type epoxy resin, a glycidyl amine-type epoxy resin, and an epoxy resin having a butadiene structure can be used. As the liquid epoxy resin, a commercially available product such as "HP4032", "HP4032D", and "HP4032SS" (a naphthalene-type epoxy resin), which are manufactured by DIC Corporation, "828US" and "jER828EL" (a bisphenol A-type epoxy resin), "jER807" (a bisphenol F-type epoxy resin), "jER152" (a phenol novolac-type epoxy resin), and "630" and "630LSD" (a glycidyl amine-type epoxy resin), which are manufactured by Mitsubishi Chemical Corporation, "ZX1059" (a mixed product of a bisphenol A-type epoxy resin and a bisphenol F-type epoxy resin), manufactured by Nippon Steel & Sumikin Chemical Co., Ltd., "EX-721" (a glycidyl ester-type epoxy resin), manufactured by Nagase ChemteX Corporation, "CELLOXIDE 2021P" (an alicyclic epoxy resin having an ester skeleton) and "PB-3600" (an epoxy resin having a butadiene structure), which are manufactured by Daicel Corporation, "ZX1658" and "ZX1658GS" (liquid 1,4-glycidyl cyclohexane), which are manufactured by Nippon Steel & Sumikin Chemical Co., Ltd., "630LSD" (a glycidyl amine-type epoxy resin), manufactured by Mitsubishi Chemical Corporation, and "EP-3980S" (a glycidyl amine-type epoxy resin), manufactured by ADEKA Corporation, can be used.

As the epoxy resin that is a solid at 25° C., a naphthalene-type tetrafunctional epoxy resin, a cresol novolac-type epoxy resin, a dicyclopentadiene-type epoxy resin, a trisphenol-type epoxy resin, a naphthol-type epoxy resin, a biphenyl-type epoxy resin, a naphthylene ether-type epoxy resin, an anthracene-type epoxy resin, a bisphenol A-type epoxy resin, and a tetraphenyl ethane-type epoxy resin can be used. As the solid epoxy resin, a commercially available product such as "HP4032H" (a naphthalene-type epoxy resin), "HP-4700" and "HP-4710" (a naphthalene-type tetrafunctional epoxy resin), "N-690" (a cresol novolac-type epoxy resin), "N-695" and "N-680" (a cresol novolac-type epoxy resin), "HP-7200" (a dicyclopentadiene-type epoxy resin), and "HP-7200HH", "HP-7200H", "EXA-7311", "EXA-7311-G3", "EXA-7311-G4", "EXA-7311-G4S", and "HP6000" (a naphthylene ether-type epoxy resin), which are manufactured by DIC Corporation, "EPPN-502H" (a trisphenol-type epoxy resin), "NC7000L" (a naphthol novolac-type epoxy resin), and "NC3000H", "NC3000", "NC3000L", and "NC3100" (a biphenyl-type epoxy resin), which are manufactured by Nippon Kayaku Co., Ltd., "ESN475V" (a naphthalene-type epoxy resin) and "ESN485" (a naphthol novolac-type epoxy resin), which are manufactured by Nippon Steel & Sumikin Chemical Co., Ltd., "YX4000H" and "YL6121" (a biphenyl-type epoxy resin), "YX4000HK" (a bixylenol-type epoxy resin), and "YX8800" (an anthracene-type epoxy resin), which are manufactured by Mitsubishi Chemical Corporation, "PG-100" and "CG-500", which are manufactured by Osaka Gas Chemicals Co., Ltd., "YL7760" (a bisphenol AF-type epoxy resin) and "YL7800" (a fluorine-type epoxy resin), which are manufactured by Mitsubishi Chemical Corporation, and "jER1010" (a solid bisphenol A-type epoxy resin), "jER1031S" (a tetraphenyl ethane-type epoxy resin), and "157S70" (a novolac-type epoxy resin), which are manufactured by Mitsubishi Chemical Corporation, can be used.

The resin composition may contain a curing agent. Examples of the curing agent include a phenolic curing agent, a naphthol-based curing agent, a benzoxazine-based curing agent, and a cyanate ester-based curing agent. Only one type of curing agent can be used alone, or two or more types thereof can be used in combination.

As the phenolic curing agent and the naphthol-based curing agent, a phenolic curing agent having a novolac structure, a naphthol-based curing agent having a novolac structure, a nitrogen-containing phenolic curing agent, and a triazine skeleton-containing phenolic curing agent can be used.

As the phenolic curing agent and the naphthol-based curing agent, a commercially available product such as "MEH-7700", "MEH-7810", and "MEH-7851", which are manufactured by Meiwa Plastic Industries, Ltd., "NHN", "CBN", and "GPH", which are manufactured by Nippon Kayaku Co., Ltd., "SN170", "SN180", "SN190", "SN475", "SN485", "SN495V", "SN375", and "SN395", which are manufactured by Nippon Steel & Sumikin Chemical Co., Ltd., "TD2090", "TD2090-60M", "LA-7052", "LA-7054", "LA-1356", "LA-3018", "LA-3018-50P", "EXB-9500", "HPC-9500", "KA-1160", "KA-1163", and "KA-1165", which are manufactured by DIC Corporation, and "GDP-6115L", "GDP-6115H", and "ELPC75", which are manufactured by Gun Ei Chemical Industry Co., Ltd., can be used.

As the benzoxazine-based curing agent, a commercially available product such as "HFB2006M", manufactured by Showa Highpolymer Co., Ltd., and "P-d" and "F-a", which are manufactured by SHIKOKU CHEMICALS CORPORATION, can be used.

Examples of the cyanate ester-based curing agent include a difunctional cyanate resin such as bisphenol A dicyanate, polyphenol cyanate, oligo(3-methylene-1,5-phenylene cyanate), 4,4'-methylene bis(2,6-dimethyl phenyl cyanate), 4,4'-ethylidene diphenyl dicyanate, hexafluorobisphenol A dicyanate, 2,2-bis(4-cyanate) phenyl propane, 1,1-bis(4-cyanate phenyl methane), bis(4-cyanate-3,5-dimethyl phenyl) methane, 1,3-bis(4-cyanate phenyl-1-(methyl ethylidene)) benzene, bis(4-cyanate phenyl) thioether, and bis(4-cyanate phenyl) ether, a polyfunctional cyanate resin derived from phenol novolac and cresol novolac, and a prepolymer in which such cyanate resins are partially triazinized.

As the cyanate ester-based curing agent, a commercially available product such as "PT30" and "PT60" (both are a phenol novolac-type polyfunctional cyanate ester resin) and "BA230" and "BA230S75" (a prepolymer in which a part or all of bisphenol A dicyanate is triazinized to be a trimer), which are manufactured by Lonza K.K., can be used.

When a resin component in the resin composition is set to 100 parts by mass, the content of the curing agent in the resin composition may be 0.1 parts by mass or more, 0.3 parts by mass or more, or 0.5 parts by mass or more, and may be 5 parts by mass or less, 3 parts by mass or less, or 2 parts by mass or less.

The resin composition may contain a curing accelerator. Examples of the curing accelerator include a phosphorus-based curing accelerator, an amine-based curing accelerator, an imidazole-based curing accelerator, a guanidine-based curing accelerator, and a metal-based curing accelerator, and include the phosphorus-based curing accelerator, the amine-based curing accelerator, the imidazole-based curing accelerator, and the metal-based curing accelerator. Only one type of curing accelerator can be used alone, or two or more types thereof can be used in combination.

Examples of the phosphorus-based curing accelerator include triphenyl phosphine, a phosphonium borate compound, tetraphenyl phosphonium tetraphenyl borate, n-butyl phosphonium tetraphenyl borate, tetrabutyl phosphonium decanoate, (4-methyl phenyl) triphenyl phosphonium thiocyanate, tetraphenyl phosphonium thiocyanate, and butyl triphenyl phosphonium thiocyanate.

Examples of the amine-based curing accelerator include trialkyl amine such as triethyl amine and tributyl amine, 4-dimethyl aminopyridine, benzyl dimethyl amine, 2,4,6,-tris(dimethyl aminomethyl) phenol, and 1,8-diazabicyclo(5,4,0)-undecene, and include the 4-dimethyl aminopyridine and the 1,8-diazabicyclo(5,4,0)-undecene.

Examples of the imidazole-based curing accelerator include an imidazole compound such as 2-methyl imidazole, 2-undecyl imidazole, 2-heptadecyl imidazole, 1,2-dimethyl imidazole, 2-ethyl-4-methyl imidazole, 1,2-dimethyl imidazole, 2-ethyl-4-methyl imidazole, 2-phenyl imidazole, 2-phenyl-4-methyl imidazole, 1-benzyl-2-methyl imidazole, 1-benzyl-2-phenyl imidazole, 1-cyanoethyl-2-methyl imidazole, 1-cyanoethyl-2-undecyl imidazole, 1-cyanoethyl-2-ethyl-4-methyl imidazole, 1-cyanoethyl-2-phenyl imidazole, 1-cyanoethyl-2-undecyl imidazolium trimellitate, 1-cyanoethyl-2-phenyl imidazolium trimellitate, 2,4-diamino-6-[2'-methyl imidazolyl-(1')]-ethyl-s-triazine, 2,4-diamino-6-[2'-undecyl imidazolyl-(1')]-ethyl-s-triazine, 2,4-diamino-6-[2'-ethyl-4'-methyl imidazolyl-(1')]-ethyl-s-triazine, a 2,4-diamino-6-[2'-methyl imidazolyl-(1')]-ethyl-s-triazine isocyanuric acid adduct, a 2-phenyl imidazole isocyanuric acid adduct, 2-phenyl-4,5-dihydroxy methyl imidazole, 2-phenyl-4-methyl-5-hydroxy methyl imidazole, 2,3-dihydro-1H-pyrrolo[1,2-a]benzimidazole, 1-dodecyl-2-methyl-3-benzyl imidazolium chloride, 2-methyl imidazoline, and 2-phenyl imidazoline, and an adduct of an imidazole compound and an epoxy resin.

As the imidazole-based curing accelerator, a commercially available product such as "P200-H50", manufactured by Mitsubishi Chemical Corporation, can be used.

Examples of the guanidine-based curing accelerator include dicyandiamide, 1-methyl guanidine, 1-ethyl guanidine, 1-cyclohexyl guanidine, 1-phenyl guanidine, 1-(o-tolyl) guanidine, dimethyl guanidine, diphenyl guanidine, trimethyl guanidine, tetramethyl guanidine, pentamethyl guanidine, 1,5,7-triazabicyclo[4.4.0]deca-5-ene, 7-methyl-1,5,7-triazabicyclo[4.4.0]deca-5-ene, 1-methyl biguanide, 1-ethyl biguanide, 1-n-butyl biguanide, 1-n-octadecyl biguanide, 1,1-dimethyl biguanide, 1,1-diethyl biguanide, 1-cyclohexyl biguanide, 1-allyl biguanide, 1-phenyl biguanide, and 1-(o-tolyl) biguanide.

Examples of the metal-based curing accelerator include an organic metal complex or an organic metal salt of a metal such as cobalt, copper, zinc, iron, nickel, manganese, and tin. Examples of the organic metal complex include an organic cobalt complex such as cobalt (II) acetyl acetate and cobalt (III) acetyl acetate, an organic copper complex such as copper (II) acetyl acetate, an organic zinc complex such as zinc (II) acetyl acetate, an organic iron complex such as iron (III) acetyl acetate, an organic nickel complex such as nickel (II) acetyl acetate, an organic manganese complex such as manganese (II) acetyl acetate. Examples of the organic metal salt include zinc octylate, tin octylate, zinc naphthenate, cobalt naphthenate, tin stearate, and zinc stearate.

When a non-volatile component in the resin composition is set to 100 parts by mass, the content of the curing accelerator in the resin composition may be 0.001 parts by mass or more, 0.005 parts by mass or more, or 0.01 parts by mass or more, and may be 0.1 parts by mass or less, 0.08 parts by mass or less, or 0.05 parts by mass or less.

The resin composition may contain a thermoplastic resin. Examples of the thermoplastic resin include a phenoxy resin, a polyvinyl acetal resin, a polyolefin resin, a polybutadiene resin, a siloxane resin, a poly(meth)acrylic resin, a polyalkylene resin, a polyalkylene oxy resin, a polyisoprene resin, a polyisobutylene resin, a polyimide resin, a polyamide imide resin, a polyether imide resin, a polysulfone resin, a polyether sulfone resin, a polyphenylene ether resin, a polycarbonate resin, a polyether ether ketone resin, and a polyester resin.

Examples of the phenoxy resin include "1256" and "4250" (both are a bisphenol A structure-containing phenoxy resin), "YX8100" (a bisphenol S skeleton-containing phenoxy resin), and "YX6954" (a bisphenol acetophenone structure-containing phenoxy resin), which are manufactured by Mitsubishi Chemical Corporation, and in addition to the examples, a commercially available product such as "FX280" and "FX293", which are manufactured by Nippon Steel & Sumikin Chemical Co., Ltd., and "YX7180", "YX6954", "YX7553", "YX7553BH30", "YL7553BH30", "YL7769", "YL6794", "YL7213", "YL7290", "YL7891", and "YL7482", which are manufactured by Mitsubishi Chemical Corporation, can be used.

The thermoplastic resin may have one or more types of structures selected from a polybutadiene structure, a polysiloxane structure, a poly(meth)acrylate structure, a polyalkylene structure, a polyalkylene oxy structure, a polyisoprene structure, a polyisobutylene structure, and a polycarbonate structure, in the molecules. Such a structure may be contained in a main chain, or may be contained in a side chain. A part or all of the polybutadiene structure may be hydrogenated. The polyalkylene oxy structure may be a polyalkylene oxy structure having 2 to 15 carbon atoms, a polyalkylene oxy structure having 3 to 10 carbon atoms, or a polyalkylene oxy structure having 5 to 6 carbon atoms.

The number average molecular weight (Mn) of the thermoplastic resin may be 1000 or more, 1500 or more, 3000 or more, or 5000 or more, and may be 1000000 or less, or 900000 or less. The number average molecular weight (Mn) indicates a number average molecular weight in terms of polystyrene, which is measured by using gel permeation chromatography (GPC).

The thermoplastic resin may have a functional group capable of reacting with an epoxy resin. The functional group capable of reacting with the epoxy resin may be one or more types of functional groups selected from the group consisting of a hydroxy group, a carboxy group, an acid anhydride group, a phenolic hydroxyl group, an epoxy group, an isocyanate group, and a urethane group.

As the polybutadiene resin, a commercially available product such as "Ricon 130MA8", "Ricon 130MA13", "Ricon 130MA20", "Ricon 131MA5", "Ricon 131MA10", "Ricon 131MA17", "Ricon 131MA20", and "Ricon 184MA6" (acid anhydride group-containing polybutadiene), which are manufactured by Cray Valley S.A., "GQ-1000" (polybutadiene to which a hydroxyl group or a carboxyl group is introduced), "G-1000", "G-2000", and "G-3000" (polybutadiene having a hydroxyl group on both terminals), and "GI-1000", "GI-2000", and "GI-3000" (hydrogenated polybutadiene having a hydroxyl group on both terminals), which are manufactured by Nippon Soda Co., Ltd., and "FCA-061L" (an epoxy resin having a hydrogenated polybutadiene skeleton), manufactured by Nagase ChemteX Corporation, can be used.

As the poly(meth)acrylic resin, a commercially available product such as TEISANRESIN, manufactured by Nagase ChemteX Corporation, "ME-2000", "W-116.3", "W-197C", "KG-25", and "KG-3000", which are manufactured by Negami Chemical Industrial Co., Ltd., can be used.

As the polycarbonate resin, a commercially available product such as "T6002" and "T6001" (polycarbonate diol), which are manufactured by ASAHI KASEI CORPORATION, and "C-1090", "C-2090", and "C-3090" (polycarbonate diol), which are manufactured by Kuraray Co., Ltd., can be used.

As the thermoplastic resin, a commercially available product such as "SMP-2006", "SMP-2003PGMEA", and "SMP-5005PGMEA", which are manufactured by Shin-Etsu Silicone Co., Ltd., linear polyimide containing amine group-terminated polysiloxane and a tetrabasic acid anhydride as a raw material (International Publication No. 2010/053185, Japanese Unexamined Patent Publication No. 2002-12667, Japanese Unexamined Patent Publication No. 2000-319386, and the like), "PTXG-1000" and "PTXG-1800", which are manufactured by ASAHI KASEI FIBERS CORPORATION, "KL-610" and "KL613", which are manufactured by Kuraray Co., Ltd., "SIBSTAR-073T" (a styrene-isobutylene-styrene triblock copolymer) and "SIBSTAR-042D" (a styrene-isobutylene diblock copolymer), which are manufactured by KANEKA CORPORATION, "Denka Butyral 4000-2", "Denka Butyral 5000-A", "Denka Butyral 6000-C", and "Denka Butyral 6000-EP", which are manufactured by Denki Kagaku Kogyo K.K., S-LEC BH Series, BX Series (for example, BX-5Z), KS Series (for example KS-1), BL Series, and BM Series, which are manufactured by SEKISUI CHEMICAL CO., LTD., "RIKACOAT SN20" and "RIKACOAT PN20", which are manufactured by New Japan Chemical Co., Ltd., "Vylomax HR1INN" and "Vylomax HR16NN", which are manufactured by TOYOBO CO., LTD., "KS9100" and "KS9300", which are manufactured by Hitachi Chemical Company, Ltd., "PES5003P", manufactured by SUMITOMO CHEMICAL COMPANY, LIMITED, polysulfone "P1700" and "P3500", which are manufactured by Solvay Advanced Polymers, L.L.C., "AC3832", manufactured by GANZ Chemical Co., Ltd., and the like may be used.

When the non-volatile component in the resin composition is set to 100 parts by mass, the content of the thermoplastic resin in the resin composition may be 0.1 parts by mass or more, 0.3 parts by mass or more, or 0.5 parts by mass or more, and may be 20 parts by mass or less, 10 parts by mass or less, 5 parts by mass or less, or 3 parts by mass or less.

The resin composition may contain an active ester compound having one or more active ester groups in one molecule. Only one type of active ester compound may be used alone, or two or more types thereof may be used in combination.

As the active ester compound, a compound having two or more ester groups with high reaction activity in one molecule, such as phenol esters, thiophenol esters, N-hydroxy amine esters, and esters of a heterocyclic hydroxy compound, can be used. Examples of such an active ester compound include an active ester compound obtained by a condensation reaction between a carboxylic acid compound and/or a thiocarboxylic acid compound and a hydroxy compound and/or a thiol compound.

From the viewpoint of improving heat resistance, the active ester compound may be an active ester compound obtained from a carboxylic acid compound and a hydroxy compound, or may be an active ester compound obtained from a carboxylic acid compound and a phenol compound and/or a naphthol compound. Examples of the carboxylic acid compound include benzoic acid, acetic acid, succinic acid, maleic acid, itaconic acid, phthalic acid, isophthalic acid, terephthalic acid, and pyromellitic acid. Examples of the phenol compound or the naphthol compound include hydroquinone, resorcine, bisphenol A, bisphenol F, bisphenol S, phenolphthalein, methylated bisphenol A, methylated bisphenol F, methylated bisphenol S, phenol, o-cresol, m-cresol, p-cresol, catechol, α-naphthol, β-naphthol, 1,5-dihydroxy naphthalene, 1,6-dihydroxy naphthalene, 2,6-dihydroxy naphthalene, dihydroxy benzophenone, trihydroxy benzophenone, tetrahydroxy benzophenone, phloroglucine, benzene triol, a dicyclopentadiene-type diphenol compound, and phenol novolac. Here, the "dicyclopentadiene-type diphenol compound" indicates a diphenol compound obtained by condensing two molecules of phenol into one molecule of dicyclopentadiene.

Specific examples of the active ester compound include an active ester compound having a dicyclopentadiene-type diphenol structure, an active ester compound having a naphthalene structure, an active ester compound containing acetylated phenol novolac, and an active ester compound containing benzoylated phenol novolac. Note that, the "dicyclopentadiene-type diphenol structure" indicates a divalent structural unit consisting of phenylene-dicyclopentylene-phenylene.

As the active ester compound having a dicyclopentadiene-type diphenol structure, a commercially available product such as "EXB9451", "EXB9460", "EXB9460S", "HPC-8000-65T", "HPC-8000H-65TM", "EXB-8000L-65TM", and "EXB-8150-65T" (manufactured by DIC Corporation) may be used, as the active ester compound having a naphthalene structure, a commercially available product such as "EXB9416-70BK" (manufactured by DIC Corporation) may be used, as the active ester compound containing acetylated phenol novolac, a commercially available product such as "DC808" (manufactured by Mitsubishi Chemical Corporation) may be used, as the active ester compound containing benzoylated phenol novolac, a commercially available product such as "YLH1026" (manufactured by Mitsubishi Chemical Corporation) may be used, as the active ester compound containing acetylated phenol novolac, a commercially available product such as "DC808" (manufactured by Mitsubishi Chemical Corporation) may be used, and as the active ester-based curing agent containing benzoylated phenol novolac, a commercially available product such as "YLH1026" (manufactured by Mitsubishi Chemical Corporation), "YLH1030" (manufactured by Mitsubishi Chemical Corporation), and "YLH1048" (manufactured by Mitsubishi Chemical Corporation) may be used.

In a case where the resin composition contains the active ester compound and the epoxy resin, a quantitative ratio between the epoxy resin and the active ester compound may be 1:0.01 to 1:5, 1:0.05 to 1:3, or 1:0.1 to 1:1.5, at a ratio of [Total number of epoxy groups of epoxy resin]:[Total number of active ester groups of active ester compound].

When the non-volatile component in the resin composition is set to 100 parts by mass, the content of the active ester compound in the resin composition may be 1 part by mass or more, 1.5 parts by mass or more, or 2 parts by mass or more, and may be 40 parts by mass or less, 30 parts by mass or less, 20 parts by mass or less, 10 parts by mass or less, 8 parts by mass or less, or 5 parts by mass or less.

The resin composition may contain a carbodiimide compound having one or more carbodiimide groups (—N═C═N—) in one molecule. As the carbodiimide compound, a compound having two or more carbodiimide groups in one molecule may be used. Only one type of carbodiimide compound may be used alone, or two or more types thereof may be used in combination.

Examples of the carbodiimide compound include a compound containing a structure represented by Formula (A) described below.

$$-(X)_p-N=C=N- \quad (A)$$

[In the formula, X represents an alkylene group, a cycloalkylene group, or an arylene group, which may have a substituent. p represents an integer of 1 to 5. In a case where there are a plurality of X, the plurality of X may be identical to or different from each other.]

The number of carbon atoms of the alkylene group represented by X (not including the number of carbon atoms of the substituent) may be 1 to 20, 1 to 10, 1 to 6, 1 to 4, or 1 to 3. Examples of the alkylene group include a methylene group, an ethylene group, a propylene group, and a butylene group.

The number of carbon atoms of the cycloalkylene group represented by X (not including the number of carbon atoms of the substituent) may be 3 to 20, 3 to 12, or 3 to 6. Examples of the cycloalkylene group include a cyclopropylene group, a cyclobutylene group, a cyclopentylene group, and a cyclohexylene group.

The arylene group represented by X is a group in which two hydrogen atoms on an aromatic ring are removed from aromatic hydrocarbon. The number of carbon atoms of the arylene group (not including the number of carbon atoms of the substituent) may be 6 to 24, 6 to 18, 6 to 14, or 6 to 10. Examples of the arylene group include a phenylene group, a naphthylene group, and an anthracenylene group.

The alkylene group, the cycloalkylene group, or the aryl group represented by X may have a substituent. Examples of the substituent include a halogen atom, an alkyl group, an alkoxy group, a cycloalkyl group, a cycloalkyl oxy group, an aryl group, an aryl oxy group, an acyl group, and an acyl oxy group. Examples of the halogen atom used as the substituent include a fluorine atom, a chlorine atom, a bromine atom, and an iodine atom. The alkyl group or the alkoxy group as the substituent may be linear or branched, and the number of carbon atoms thereof may be 1 to 20, 1 to 10, 1 to 6, 1 to 4, or 1 to 3. The number of carbon atoms of the cycloalkyl group or the cycloalkyl oxy group as the substituent may be 3 to 20, 3 to 12, or 3 to 6. The aryl group as the substituent may be a group in which one hydrogen atom on an aromatic ring is removed from aromatic hydrocarbon, and the number of carbon atoms thereof may be 6 to 24, 6 to 18, 6 to 14, or 6 to 10. The number of carbon atoms of the aryl oxy group as the substituent may be 6 to 24, 6 to 18, 6 to 14, or 6 to 10. The acyl group as the substituent indicates a group represented by Formula: $-C(=O)-R^1$ (in the formula, $R^1$ represents an alkyl group or an aryl group). The alkyl group represented by $R^1$ may be linear or branched, and the number of carbon atoms thereof maybe 1 to 20, 1 to 10, 1 to 6, 1 to 4, or 1 to 3. The number of carbon atoms of the aryl group represented by $R^1$ may be 6 to 24, 6 to 18, 6 to 14, or 6 to 10. The acyl oxy group as the substituent indicates a group represented by Formula: $-O-C(=O)-R^2$ (in the formula, $R^2$ represents an alkyl group or an aryl group).

In Formula (A), p represents an integer of 1 to 5. p may be 1 to 4, 2 to 4, or 2 or 3.

When the mass of all the molecules of the carbodiimide compound is set to 100 parts by mass, the content of the structure represented by Formula (A) in the carbodiimide compound may be 50 parts by mass or more, 60 parts by mass or more, 70 parts by mass or more, 80 parts by mass or more, or 90 parts by mass or more. The carbodiimide compound may substantially consist of the structure represented by Formula (A) except for the terminal structure. Examples of the terminal structure of the carbodiimide compound include an alkyl group, a cycloalkyl group, and an aryl group, which may have a substituent. The alkyl group, the cycloalkyl group, and the aryl group used as the terminal structure may be the same as the alkyl group, the cycloalkyl group, and the aryl group described for the substituent that the group represented by X may have. In addition, the substituent that the group used as the terminal structure may have may be the same as the substituent that the group represented by X may have.

The weight average molecular weight of the carbodiimide compound may be 500 or more, 600 or more, 700 or more, 800 or more, 900 or more, or 1000 or more, and may be 5000 or less, 4500 or less, 4000 or less, 3500 or less, or 3000 or less. The weight average molecular weight of the carbodiimide compound, for example, can be measured by a gel permeation chromatography (GPC) method (in terms of polystyrene).

In a case where the carbodiimide compound contain an isocyanate group ($-N=C=O$) in the molecules, the content of the isocyanate group in the carbodiimide compound (also referred to as a "NCO content") may be 5% by mass or less, 4% by mass or less, 3% by mass or less, 2% by mass or less, 1% by mass or less, or 0.5% by mass or less.

As the carbodiimide compound, a commercially available product such as CARBODILITE (Registered Trademark) V-02B, V-03, V-04K, V-07, and V-09, which are manufactured by Nisshinbo Chemical Inc., and Stabaxol (Registered Trademark) P and P400, and Hycasyl 510, which are manufactured by Rhein Chemie Corporation, may be used.

When the non-volatile component in the resin composition is set to 100 parts by mass, the content of the carbodiimide compound in the resin composition may be 0.1 parts by mass or more, 0.3 parts by mass or more, or 0.5 parts by mass or more, and may be 3 parts by mass or less, 2 parts by mass or less, or 1.5 parts by mass or less.

The resin composition may further contain other additives, as necessary. Examples of the other additives include a flame retardant, an organic metal compound such as an organic copper compound, an organic zinc compound, and an organic cobalt compound, and a resin additive such as a binder, a thickener, an antifoaming agent, a leveling agent, an adhesiveness imparting agent, and a colorant.

From the viewpoint of ease of signal propagation, the covering thickness of the insulating magnetic layer 30 may be 0.1 to 100 μm, may be 0.2 to 30 μm, or may be 0.5 to 10 μm.

In this specification, the covering thickness of the insulating magnetic layer indicates (i) described below in a case where the insulating magnetic layer is provided apart from the conductor wiring, and (ii) described below in a case where the insulating magnetic layer is provided in contact with the conductor wiring.

Figure 5:
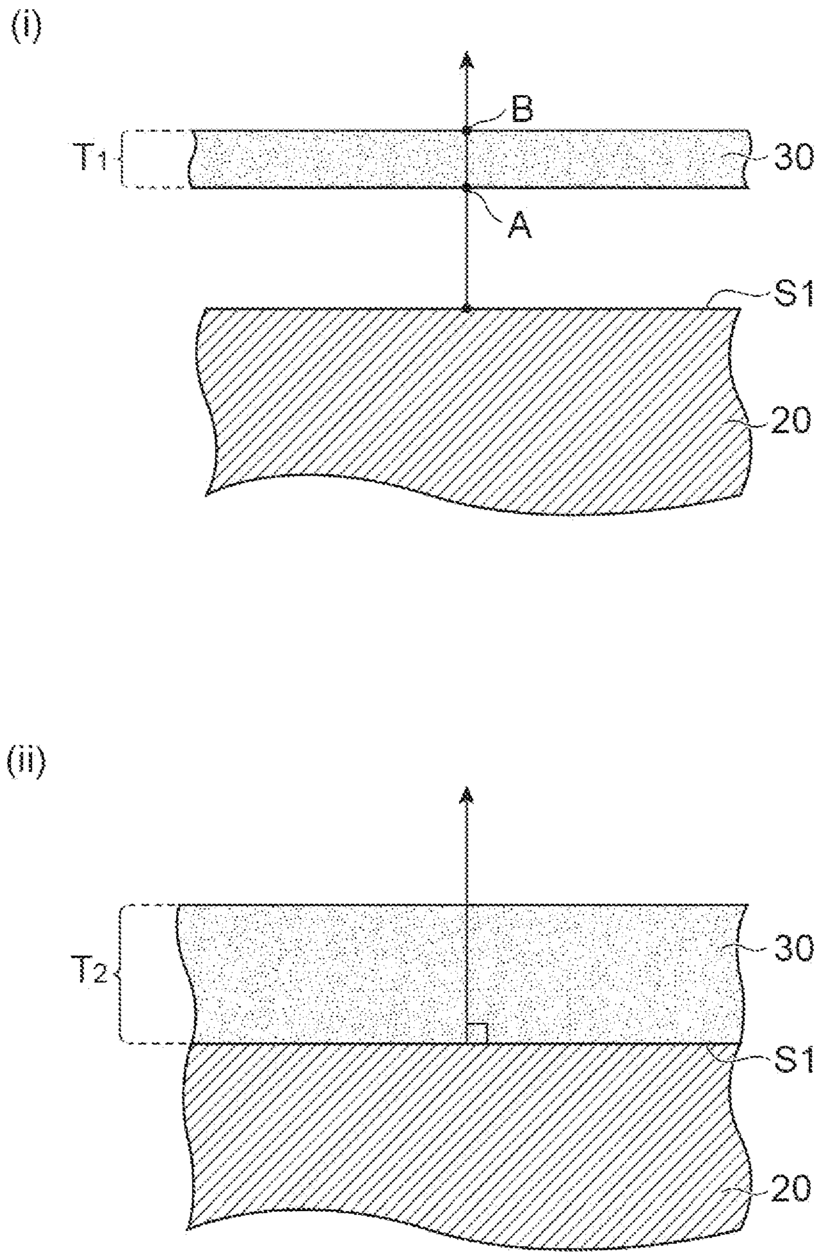
FIG. 5 is a diagram for describing a covering thickness of an insulating magnetic layer.

(i) A distance between a point A on the surface of the insulating magnetic layer on the conductor wiring side and a point B intersecting with the surface of the insulating magnetic layer on a side opposite to the conductor wiring side when extending a line connecting the point A to the conductor wiring at the shortest distance via the point A (refer to FIG. 5(*i*)).

(ii) A thickness in a direction orthogonal to the interface between the insulating magnetic layer and the conductor wiring (refer to FIG. 5(*ii*)).

From the viewpoint of suppressing a transmission loss, the relative magnetic permeability of the insulating magnetic layer 30 may be 2 to 1000, may be 10 to 1000, or may be 20 to 1000.

From the viewpoint of suppressing the transmission loss, the relative permittivity of the insulating magnetic layer 30 may be 1 to 30, may be 1 to 20, or may be 1 to 10.

The insulating magnetic layer 30 can be formed by using a composition for forming an insulating magnetic layer containing a magnetic material and an insulating material.

(Composition for Forming Insulating Magnetic Layer)

The composition for forming an insulating magnetic layer, for example, can be formed by mixing a binder resin varnish and the magnetic powder described above. As the binder resin varnish, the resin composition described above can be used.

When the total mass of the composition is set to 100 parts by mass, the content of the magnetic powder in the composition for forming an insulating magnetic layer may be 70 to 99 parts by mass, or 80 to 90 parts by mass.

The composition for forming an insulating magnetic layer may be in the shape of a paste (hereinafter, referred to as a "paste"). The paste may contain a magnetic powder, an epoxy group-containing compound, and a curing agent.

As the magnetic powder, the magnetic powder described above can be used.

The average particle diameter of the magnetic powder contained in the paste may be 0.05 to 200 μm, 0.5 to 100 μm, or 1 to 50 μm. In a case where the magnetic powder is covered, the average particle diameter of the magnetic powder including a covering film may be in the range described above.

The content of the magnetic powder in the paste may be 70% by mass or more, or 80% by mass or more, and may be 99% by mass or less, or 90% by mass or less, on the basis of the total mass of the paste. The content of the magnetic powder in the paste may be 70 to 99% by mass, or 80 to 90% by mass, on the basis of the total mass of the paste.

The epoxy group-containing compound indicates a compound having one or more epoxy groups in the molecules, and may be any form of a monomer, an oligomer and a polymer each having a structural unit formed by the polymerization of the monomer. The epoxy group-containing compound can be cured by a heating treatment to function as a binder resin binding a metal element-containing powder. Examples of the epoxy group-containing compound include an oligomer and a polymer having two or more epoxy groups in the molecules, which are generally known as an epoxy resin. Other examples of the epoxy group-containing compound include a compound that has one or more epoxy groups in the molecules but does not have a structural unit formed by polymerization (hereinafter, referred to as an epoxy compound). Such an epoxy compound is generally known as a reactive diluent. It is preferable that the epoxy group-containing compound includes at least one type selected from the group consisting of an epoxy resin and an epoxy compound.

As the epoxy resin, the same epoxy resin as that compounded in the resin composition described above can be used.

The molecular weight of the epoxy compound may be 100 or more, may be 150 or more, or may be 200 or more. In the case of using an epoxy compound with a molecular weight of 100 or more, volatilization before reacting with the curing agent can be suppressed by setting a suitable curing condition. In addition, since the epoxy compound has a low molecular weight, the occurrence of a problem such as a short distance between crosslinking points after the reaction and the brittleness of a cured product can be reduced. On the other hand, the molecular weight of the epoxy compound may be 700 or less, may be 500 or less, or may be 300 or less. In the case of using an epoxy compound having a molecular weight of 700 or less, a viscosity suitable as a diluent can be easily obtained.

The molecular weight of the epoxy compound may be 100 to 700, 150 to 500, or 200 to 300. In the case of using an epoxy compound having a molecular weight in such a range, the viscosity of the paste is easily adjusted. Unlike a component such as an organic solvent that is volatilized when heated, the epoxy compound is cured when heated and incorporated into the cured product. Accordingly, in the case of using the epoxy compound, the epoxy compound contributes to the adjustment of the viscosity of the paste, and is capable of suppressing the characteristic degradation of the cured product.

The epoxy compound may have one epoxy group or two or more epoxy groups in the molecules. The epoxy compound, for example, may be at least one type selected from the group consisting of n-butyl glycidyl ether, versatic acid glycidyl ether, styrene oxide, ethyl hexyl glycidyl ether, phenyl glycidyl ether, butyl phenyl glycidyl ether, 1,6-hexanediol diglycidyl ether, neopentyl glycol diglycidyl ether, diethylene glycol diglycidyl ether, and trimethylol propane triglycidyl ether. The epoxy compound may contain 500 ppm or less of ionic impurities such as free Na ions and free Cl ions.

The epoxy equivalent of the epoxy group-containing compound may be 80 g/eq to 350 g/eq, 100 g/eq to 300 g/eq, or 120 g/eq to 250 g/eq. In a case where the epoxy equivalent is in the range described above, since the epoxy group-containing compound itself has a low viscosity, it is easy to adjust the viscosity of the paste.

It is preferable that the epoxy group-containing compound includes an epoxy group-containing compound that is a liquid at 25° C. In this specification, "being a liquid at 25° C." indicates that the viscosity of the epoxy group-containing compound at 25° C. is 200 Pas or less. The viscosity described above is a value measured by using an E-type viscosimeter in the condition of Temperature: 25° C., Cone-Plate Type: SPP, Cone Angle: 1°34', and Rotation Rate: 2.5 rpm. As the E-type viscosimeter, for example, a TV-33-type viscosimeter, manufactured by Toki Sangyo Co., Ltd., can be used.

In the case of using the epoxy group-containing compound that is a liquid at 25° C., in general, it is possible to considerably decrease the compounded amount of a volatile component such as an organic solvent that is used to obtain fluidity. In one embodiment, it is also possible to configure a paste not containing an organic solvent. In addition, it is possible to easily increase the content of the magnetic powder while ensuring fluidity suitable as the paste. From such a viewpoint, the viscosity of the epoxy group-containing compound may be 100 Pas or less, 50 Pa·s or less, or 10 Pa·s or less.

From the viewpoint of adjusting the viscosity of the paste, the viscosity of the epoxy compound in the epoxy group-containing compound described above may be lower than the viscosity of the liquid epoxy resin. The viscosity of the epoxy compound may be 1 Pads or less, 0.5 Pa·s or less, or 0.1 Pa·s or less.

The epoxy group-containing compound that is a liquid at 25° C. may include at least one type selected from the group consisting of an epoxy resin that is a liquid at 25° C. and an epoxy compound that is a liquid at 25° C. The content of the epoxy resin that is a liquid at 25° C. may be 50% by mass or more, 70% by mass or more, 90% by mass or more, or 100% by mass, on the basis of the total mass of the epoxy group-containing compound.

The epoxy resin that is a liquid at 25° C., for example, include at least one type of liquid epoxy resin selected from a bisphenol A-type epoxy resin, a bisphenol F-type epoxy resin, a bisphenol AD-type epoxy resin, a bisphenol S-type epoxy resin, a naphthalenediol-type epoxy resin, a hydrogenated bisphenol A-type epoxy resin, and an aminoglycidyl ether-type epoxy resin.

The epoxy group-containing compound that is a liquid at 25° C. can also be obtained as a commercially available product. For example, as the liquid bisphenol A-type epoxy resin and the liquid bisphenol F-type epoxy resin, a commercially available product is sold by NIPPON STEEL Chemical & Material Co., Ltd. For example, as the liquid bisphenol F-type epoxy resin, Product Name "YDF-8170C" (an epoxy equivalent of 165, a viscosity of 1000 to 1500 mPa·s) can be used. Examples of the epoxy compound include ADEKA GLYCIROL (Product Name) Series, manufactured by ADEKA Corporation. For example, Product Name "ADEKA GLYCIROL ED-503G" (an epoxy equivalent of 135, a viscosity of 15 mPa·s) can be used.

The paste may further contain other resins in addition to the epoxy group-containing compound described above. The other resins may include at least one type selected from the group consisting of a thermosetting resin (not including an epoxy resin) and a thermoplastic resin. The thermosetting resin, for example, may be at least one type selected from the group consisting of a phenolic resin, an acrylic resin, a polyimide resin, and a polyamide imide resin. In the case of using the phenolic resin in addition to the epoxy group-containing compound, the phenolic resin may function as a curing agent of the epoxy group-containing compound.

The thermoplastic resin, for example, may be at least one type selected from the group consisting of an acrylic resin, polyethylene, polypropylene, polystyrene, polyvinyl chloride, and polyethylene terephthalate. The resin component may further contain a silicone resin in addition to the epoxy group-containing compound.

In a case where the paste contains other resins in addition to the epoxy group-containing compound, it is preferable to adjust the content of the other resins within a range not degrading the effect of the epoxy group-containing compound. For example, the content of the other resins may be 50% by mass or less, 30% by mass or less, or 10% by mass or less, on the basis of the total mass of the resin in the paste. The compounded amount can be adjusted within a range where the viscosity of a mixture of the epoxy group-containing compound and the other resins is 50 Pa·s or less at 25° C. The viscosity described above is a value measured by using an E-type viscosimeter in the condition of Temperature: 25° C., Cone-Plate Type: SPP, Cone Angle: 1°34', and Rotation Rate: 2.5 rpm. As the E-type viscosimeter, for example, a TV-33-type viscosimeter, manufactured by Toki Sangyo Co., Ltd., can be used.

As the curing agent, a compound that is capable of imparting appropriate viscous properties to the paste and reacting with the epoxy group of the epoxy group-containing compound to form the cured product can be used. As the curing agent, a well-known curing agent generally used as the curing agent of the epoxy resin can be used. Examples of the curing agent include a phenolic curing agent, an acid anhydride-based curing agent, and an amine-based curing agent.

The curing agent is classified into a curing agent curing the epoxy resin in a temperature range from a low temperature to a room temperature and a heating-curable curing agent curing the epoxy resin by heating. Examples of the curing agent curing the epoxy resin in the temperature range from the low temperature to the room temperature include aliphatic polyamine, polyaminoamide, and polymercaptan. Examples of the heating-curable curing agent include aromatic polyamine, an acid anhydride, a phenol novolac resin, and dicyandiamide (DICY). In the case of using the curing agent curing the epoxy resin in the temperature range from the low temperature to the room temperature, there is a tendency that the glass transition point of the cured product of the epoxy resin is low and the cured product of the epoxy resin is soft. As a result, there is a tendency that the insulating magnetic layer formed of the paste is also softened. From the viewpoint of improving the heat resistance and the mechanical strength of the insulating magnetic layer, it is preferable that the curing agent contains the heating-curable curing agent.

Among the heating-curable curing agents, a curing agent that is a liquid at 25° C. can be used from the viewpoint of decreasing the viscosity of the paste. As the liquid curing agent, for example, at least one type selected from the group consisting of aliphatic polyamine, polymercaptan, aromatic polyamine, an acid anhydride, and an imidazole-based curing agent can be used. Insofar as an increase in the viscosity of the paste can be suppressed, a curing agent that is a solid at 25° C. may be used, or the liquid curing agent and a solid curing agent may be used together. As the solid curing agent, for example, dicyandiamide, tertiary amine, an imidazole-based curing agent, and an imidazoline-based curing agent can be used. Since the exemplified solid curing agent is polyfunctional or acts catalytically, the solid curing agent may function sufficiently in small amount.

The curing agent may include at least one type selected from the group consisting of an amine-based curing agent, an imidazole-based curing agent, and an imidazoline-based curing agent. The curing agent may include at least the amine-based curing agent. The amine-based curing agent (more specifically, tertiary amine), the imidazole-based curing agent, and the imidazoline-based curing agent can also be used as a curing accelerator in combination with other curing agents.

The amine-based curing agent may be a compound having at least two amino groups in the molecules. The amine-based curing agent contains at least one type selected from the group consisting of aliphatic amine and aromatic amine. Examples of the aliphatic amine compound include diethylene triamine, triethylene tetramine, n-propyl amine, 2-hydroxy ethyl aminopropyl amine, cyclohexyl amine, and 4,4'-diamino-dicyclohexyl methane. Examples of the aromatic amine compound include 4,4'-diaminodiphenyl methane, 2-methyl aniline, an amine compound represented by Formula (1) described below, and an amine compound represented by Formula (2) described below.

(1)

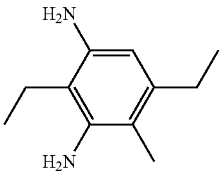

(2)

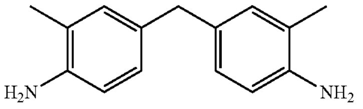

The imidazole-based curing agent is a compound having an imidazole skeleton, and may be an imidazole-based compound in which a hydrogen atom in the molecules is substituted with a substituent. The imidazole-based curing agent may be a compound having an imidazole skeleton such as alkyl group-substituted imidazole. Examples of the imidazole-based curing agent include imidazole, 2-methyl imidazole, 2-ethyl imidazole, and 2-isopropyl imidazole. As the imidazole-based curing agent, a commercially available product such as "CUREZOL 2E4MZ" (2-ethyl-4-methyl imidazole), manufactured by SHIKOKU CHEMICALS CORPORATION, can be used.

The imidazoline-based curing agent is a compound having an imidazoline skeleton, and may be an imidazoline-based compound in which a hydrogen atom in the molecules is substituted with a substituent. The imidazoline-based curing agent may be a compound having an imidazoline skeleton such as alkyl group-substituted imidazoline. Examples of the imidazoline-based curing agent include imidazoline, 2-methyl imidazoline, and 2-ethyl imidazoline.

From the viewpoint of compatibility and preservation stability with the epoxy resin that is a liquid at 25° C., the curing agent may contain aromatic amine. An aromatic ring of the aromatic amine may have a substituent other than an amino group. For example, the aromatic ring of the aromatic amine may have an alkyl group having 1 to 5 carbon atoms, or may have an alkyl group having 1 or 3 carbon atoms. The number of aromatic rings in the aromatic amine may be 1, or may be 2 or more. In a case where the number of aromatic rings is 2 or more, the aromatic rings may be bonded by a single bond, or may be bonded via a linking group such as an alkylene group.

From the viewpoint of the viscosity of the paste, it is preferable that the curing agent contains a liquid aromatic amine. For example, at least one type selected from the group consisting of the compound represented by Formula (1) described above and the compound represented by Formula (2) described above can be used.

The liquid aromatic amine that can be used as the curing agent can also be obtained as a commercially available product. Examples of the commercially available product include Product Name "Grade: jERCURE WA", manufactured by Mitsubishi Chemical Corporation, and Product Name "KAYAHARD AA", manufactured by Nippon Kayaku Co., Ltd.

The content of the curing agent in the paste can be set in consideration of a ratio of the number of equivalent of the epoxy group of the epoxy group-containing compound such as an epoxy resin and the number of equivalent of an active group in the curing agent. For example, a ratio of the curing agent to 1 equivalent of the epoxy group of the epoxy group-containing compound may be 0.5 to 1.5 equivalent, may be 0.9 to 1.4 equivalent, or may be 1.0 to 1.2 equivalent.

In a case where the ratio of the active group in the curing agent is 0.5 equivalent or more, the amount of OH per unit weight of the epoxy resin after heating and curing decreases, and a decrease in the curing rate of the epoxy resin can be suppressed. In addition, a decrease in the glass transition temperature of the cured product to be obtained, and a decrease in the elastic modulus of the cured product can be suppressed. Further, a decrease in the insulating reliability of the cured product due to the unreacted resin component in the binder resin can be suppressed. On the other hand, in a case where the ratio of the active group in the curing agent is 1.5 equivalent or less, a decrease in the mechanical strength of the insulating magnetic layer formed of the paste after heating and curing can be suppressed. In addition, a decrease in the insulating properties of the cured product due to the unreacted curing agent can be suppressed.

The paste may further contain a curing accelerator, as necessary. The paste may contain the magnetic powder, the epoxy group-containing compound, the curing agent, and the curing accelerator. In another embodiment, in addition to the components described above, the paste, for example, may further contain additives such as a coupling agent and a flame retardant.

The curing accelerator is not limited insofar as the curing accelerator is a compound capable of accelerating a curing reaction between the epoxy resin and the curing agent. Examples of the curing accelerator include tertiary amine, an imidazole-based curing accelerator, an imidazoline-based curing accelerator, and a phosphorus compound. As the imidazole-based curing accelerator and the imidazoline-based curing accelerator, the compounds exemplified above as the imidazole-based curing agent and the imidazoline-based curing agent may be used. In the case of using the liquid acid anhydride among the liquid curing agents, the curing accelerator can be used together. The paste may contain one type or two or more types of curing accelerators. In the case of using the curing accelerator, the mechanical strength of the insulating magnetic layer formed of the paste can be improved, and the curing temperature of the paste can be easily decreased.

The compounded amount of the curing accelerator is not particularly limited insofar as a curing accelerating effect can be obtained. However, from the viewpoint of improving the curing properties and the fluidity of the paste when absorbing moisture, the compounded amount of the curing accelerator may be 0.001 parts by mass or more with respect to a total of 100 parts by mass of the epoxy resin and the curing agent. The compounded amount of the curing accelerator may be 0.01 parts by mass or more, or may be 0.1 parts by mass or more. On the other hand, the compounded amount of the curing accelerator may be 5 parts by mass or less, may be 4 parts by mass or less, or may be 3 parts by mass or less. In a case where the compounded amount of the curing accelerator is 0.001 parts by mass or more, a sufficient curing accelerating effect can be easily obtained. In a case where the compounded amount of the curing accelerator is 5 parts by mass or less, excellent preservation stability in the paste can be easily obtained.

In the case of using the coupling agent, the dispersibility of the magnetic powder in the paste is improved, and the viscosity of the paste is easily controlled. In addition, adhesiveness between the binder resin and the magnetic powder is easily improved. Further, the adhesiveness, the flexibility, and the mechanical strength of the insulating magnetic layer formed of the paste with respect to the conductor wiring are easily improved. The coupling agent, for example, may be at least one type selected from the group consisting of a silane-based compound (a silane coupling agent), a titanium-based compound, an aluminum compound (aluminum chelates), and an aluminum/zirconium-based compound. The silane coupling agent, for example, may be at least one type selected from the group consisting of epoxy silane, mercaptosilane, aminosilane, alkyl silane, ureidosilane, acid anhydride-based silane, and vinyl silane. In addition, the silane coupling agent may be an aminophenyl-based silane coupling agent. The paste may contain at least one type of coupling agent described above, or may contain two or more types of coupling agents described above.

In order for the environmental safety, the recyclability, the moldability, and the low cost of the paste, the paste may contain a flame retardant. The flame retardant, for example, may be at least one type selected from the group consisting of a bromine-based flame retardant, a phosphorus-based flame retardant, a hydrated metal compound-based flame retardant, a silicone-based flame retardant, a nitrogen-containing compound, a hindered amine compound, an organic metal compound, and an aromatic engineering plastic. The paste may contain only one type of flame retardant exemplified as described above, or may contain two or more types thereof.

The paste may contain an organic solvent, as necessary. The organic solvent is not particularly limited. For example, an organic solvent capable of dissolving the binder resin can be used. The organic solvent, for example, may be at least one type selected from the group consisting of acetone, methyl ethyl ketone, methyl isobutyl ketone, benzene, toluene, carbitol acetate, butyl carbitol acetate, cyclohexane, and xylene. From the viewpoint of workability, the organic solvent may be a liquid at an ordinary temperature)(25° C. From the viewpoint of the workability, the boiling point of the organic solvent may be 50° C. or higher and 160° C. or lower.

In a case where the paste contains the organic solvent, the content thereof may be 5% by mass or less, 3% by mass or less, or 1% by mass or less, on the basis of the total mass of the paste. The paste may not substantially contain the organic solvent. In this specification, “not substantially containing” indicates that the organic solvent is not intentionally added to the paste. Accordingly, the paste, for example, may contain an organic solvent that is used when manufacturing a resin and remains in the resin.

The viscosity of the paste may be 1 Pa·s or more, 10 Pa·s or more, or 100 Pa·s or more. By adjusting the viscosity to 1 Pa·s or more, it is possible to suppress liquid dripping after coating, and easily prevent a pattern shape from collapsing after printing. In addition, it is possible to inhibit the precipitation of the magnetic powder in the paste, and easily improve a decrease in coating properties due to time lapse after stirring the paste. On the other hand, the viscosity of the paste may be 600 Pa·s or less, 400 Pa·s or less, or 200 Pa·s or less. By adjusting the viscosity to 600 Pa·s or less, the paste has fluidity, and excellent coating properties can be easily obtained.

In the case of applying the paste to screen printing, the viscosity of the paste may be 10 Pa·s to 400 Pa·s, 50 Pa·s to 300 Pas, or 100 Pa·s to 250 Pa·s. In the case of adjusting the viscosity to the range described above, in the screen printing, it is possible to suppress the occurrence of a problem that the paste does not pass through an opening portion of a plate. The viscosity of the paste can be freely adjusted in accordance with the structure and the characteristics of the epoxy group-containing compound, the structure and the characteristics of the curing agent, the combination and the compounding ratio thereof, the structure and the compounding ratio of the additives such as the curing accelerator and the coupling agent, and the like. The paste may contain additives such as a viscosity adjuster, a thixotropy imparting agent, and a dispersion stabilizer.

<Method for Manufacturing Wiring Substrate>

Hereinafter, a method for manufacturing a wiring substrate will be described in several embodiments. Note that, in the following embodiments, the composition for forming an insulating magnetic layer of the embodiment described above can be used.

First Embodiment

Figure 6:
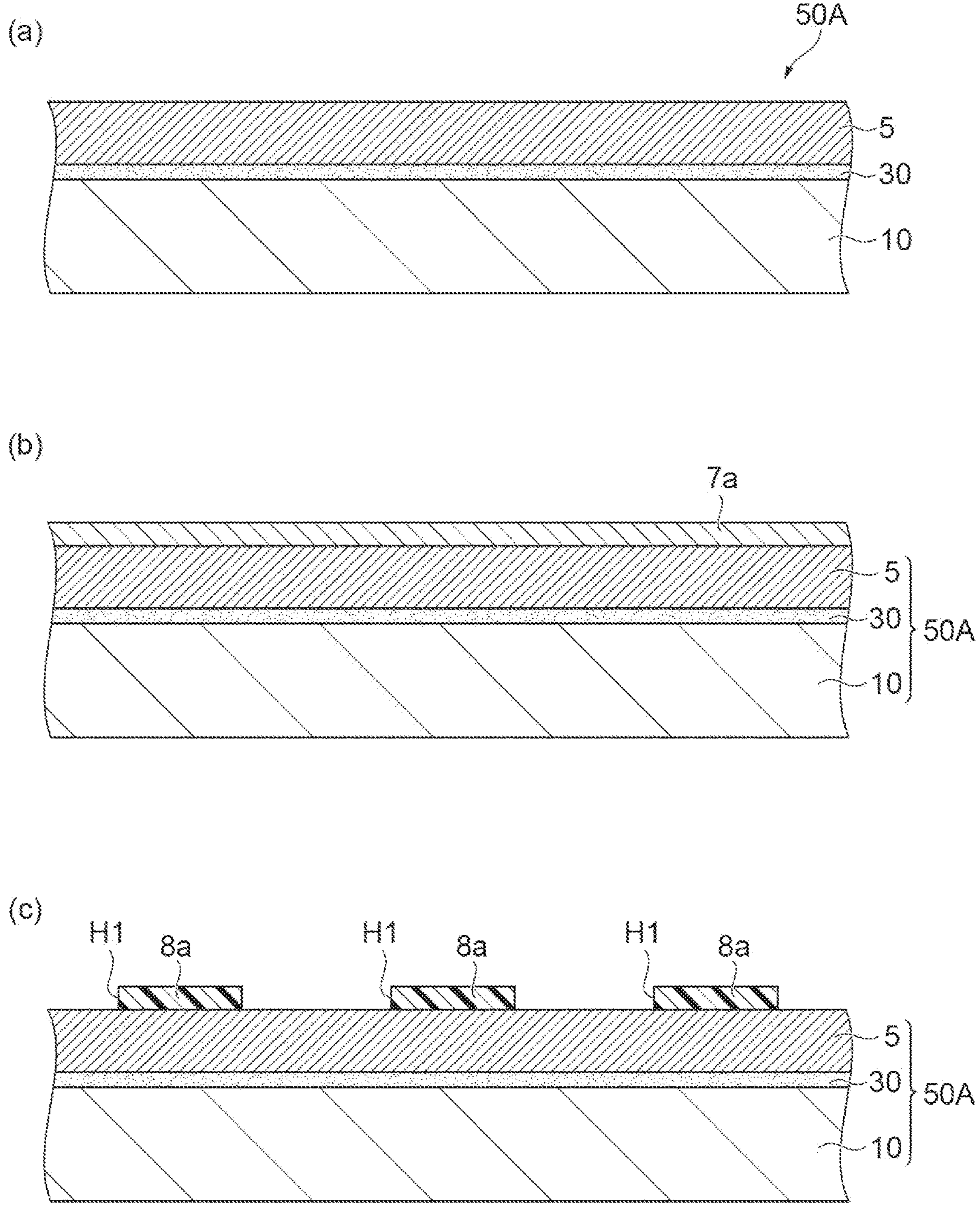
FIG. 6 is a schematic sectional view for describing a first embodiment of a method for manufacturing a wiring substrate.
Figure 7:
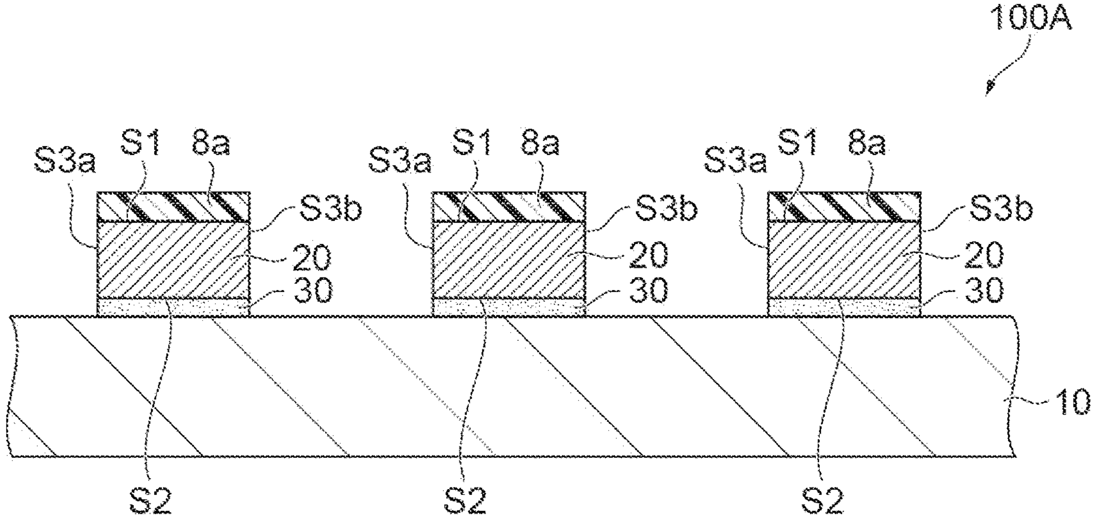
FIG. 7 is a schematic sectional view for describing the first embodiment of the method for manufacturing a wiring substrate, following FIG. 6.
Figure 7:
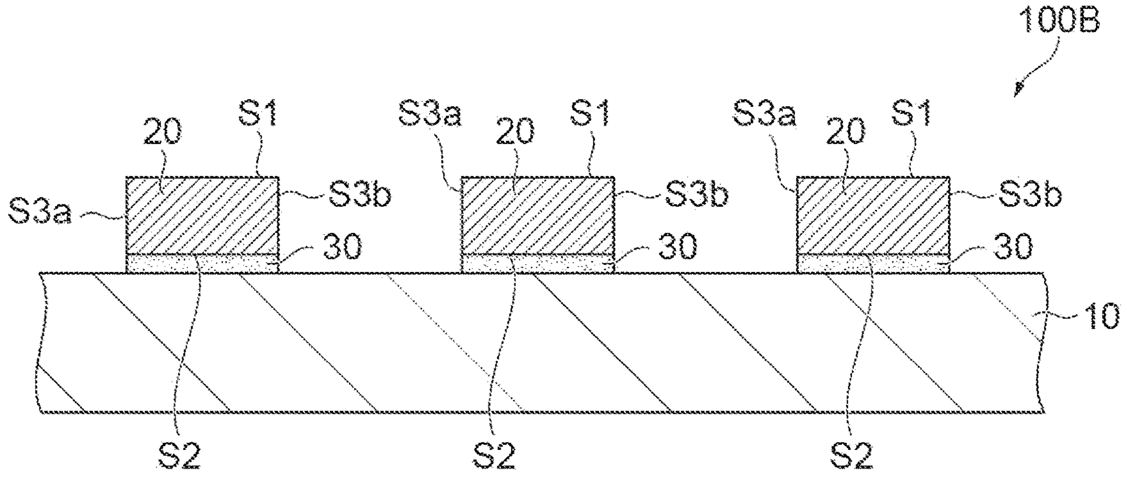

FIG. 6 and FIG. 7 are schematic sectional views for describing a first embodiment of the method for manufacturing a wiring substrate. The manufacturing method of the first embodiment includes a step a1 of preparing a laminate 50A including the substrate 10, the insulating magnetic layer 30 provided on the substrate 10, and a conductor layer 5 provided on the insulating magnetic layer 30 on a side opposite to the substrate 10, a step a2 of forming a photosensitive layer 7*a* on the laminate 50A on the conductor layer 5 side, a step a3 of forming a resist film 8*a* including an opening portion H1 by exposing the photosensitive layer 7*a* in a predetermined pattern and developing the exposed photosensitive layer, and a step a4 of forming the conductor wiring 20 by removing a portion positioned between the substrate 10 and the opening portion H1 of the resist film 8*a* in the conductor layer 5 (and the insulating magnetic layer 30). The manufacturing method of the first embodiment may further include a step a5 of removing the resist film 8*a*. Hereinafter, the steps a1 to a5 will be described.

[Step a1]

In the step a1, the laminate 50A is prepared (refer to FIG. 6(*a*)). The step a1 may be a step of laminating the substrate 10 on the insulating magnetic layer 30 after forming the insulating magnetic layer 30 on the conductor layer 5, or may be a step of forming the conductor layer 5 on the insulating magnetic layer 30 after forming the insulating magnetic layer 30 on the substrate 10. In the step a1, the laminate 50A may be obtained by preparing a laminate in which the conductor layer 5, a layer consisting of the composition for forming an insulating magnetic layer, and the substrate 10 are laminated in this order, and curing the composition for forming an insulating magnetic layer to form the insulating magnetic layer 30.

As the substrate 10, the substrate described above can be used.

The conductor layer 5 contains a conductor. Examples of the conductor include a metal such as copper, gold, silver, and nickel.

The thickness of the conductor layer 5 may be suitably set in accordance with the intended thickness of the conductor wiring 20. The thickness of the conductor layer 5, for example, is 1 to 50 μm.

In the case of forming the conductor layer 5 on the insulating magnetic layer 30, for example, the conductor layer 5 may be formed by laminating a conductor film such as a metal foil on the insulating magnetic layer 30, or the conductor layer 5 may be formed on the insulating magnetic layer 30 by plating or the like.

The insulating magnetic layer 30 consists of an insulator containing a magnetic material. The magnetic material may be dispersed in the insulating magnetic layer 30. In addition, in a case where the magnetic material has insulating properties, the insulator containing the magnetic material may be formed of the magnetic material having the insulating properties.

The thickness of the insulating magnetic layer 30 in the laminate 50A may be adjusted such that the covering thickness of the insulating magnetic layer 30 in the wiring substrate 100 is in the range described above.

The insulating magnetic layer 30 can be formed of the composition for forming an insulating magnetic layer described above. Specifically, for example, a method for forming a layer consisting of the composition for forming an insulating magnetic layer by applying the composition for forming an insulating magnetic layer containing the magnetic material onto the substrate 10 or the conductor layer 5 or laminating a sheet (for example, a film-shaped sheet) consisting of the composition for forming an insulating magnetic layer containing the magnetic material on the substrate or the conductor layer, and curing the composition for forming an insulating magnetic layer is exemplified.

A coating method of the composition for forming an insulating magnetic layer is not particularly limited, and examples thereof include a coating method using screen printing, transfer printing, offset printing, a jet printing method, a dispenser, a jet dispenser, a needle dispenser, a comma coater, a slit coater, a die coater, a gravure coater, slit coating, anastatic printing, intaglio printing, gravure printing, stencil printing, soft lithography, bar coating, an applicator, a particle deposition method, a spray coater, a spin coater, a dip coater, and the like.

The sheet consisting of the composition for forming an insulating magnetic layer, for example, can be formed by applying the composition for forming an insulating magnetic layer onto a support film in accordance with the coating method described above. A laminating method of the sheet consisting of composition for forming an insulating magnetic layer is not particularly limited, and a roll laminator, a diaphragm laminator, a vacuum roll laminator, a vacuum diaphragm laminator, and the like can be adopted.

The composition for forming an insulating magnetic layer can be cured, for example, by heating. The curing of the composition for forming an insulating magnetic layer may be the curing of the composition for forming an insulating magnetic layer by drying, or may be the thermal curing of the composition for forming an insulating magnetic layer in a case where the composition for forming an insulating magnetic layer contains a thermosetting resin. A heating temperature and a heating time may be suitably adjusted in accordance with the type of solvent, the type of thermosetting resin, or the like contained in the composition for forming an insulating magnetic layer.

The laminate 50A may further include a layer in addition to the substrate 10, the insulating magnetic layer 30, and the conductor layer 5, insofar as the effects of the present invention are not impaired.

[Step a2]

In the step a2, the photosensitive layer 7*a* is formed on the laminate 50A on the conductor layer 5 side (refer to FIG. 6(*b*)). The photosensitive layer 7*a* is a layer having photosensitivity. The photosensitive layer 7*a*, for example, may consist of a photosensitive resin composition containing a binder polymer, a photopolymerizable compound, and a photopolymerization initiator. The photosensitive layer 7*a* illustrated in FIG. 6 is a negative photosensitive layer, but may be a positive photosensitive layer.

The photosensitive layer 7*a* can be formed by applying the photosensitive resin composition or laminating a sheet (for example, a film-shaped sheet) consisting of the photosensitive resin composition onto the laminate 50A on the conductor layer 5 side. As a coating method of the photosensitive resin composition and a laminating method of the sheet consisting of the photosensitive resin composition, the coating method of the composition for forming an insulating magnetic layer and the laminating method of the sheet consisting of the composition for forming an insulating magnetic layer described above can be adopted.

The thickness of the photosensitive layer 7*a*, for example, is 10 to 100 μm.

[Step a3]

In the step a3, the photosensitive layer 7*a* is exposed in the predetermined pattern and developed to form the resist film 8*a* including the opening portion H1 (refer to FIG. 6(*c*)).

Specifically, first, the photosensitive layer 7*a* is exposed in the predetermined pattern via a predetermined mask pattern. Examples of an active light ray used in the exposure include a light ray using a g-line stepper as a light source; an ultraviolet ray using a low-pressure mercury lamp, a high-pressure mercury lamp, a metal halide lamp, an i-line stepper, and the like as a light source; an electron beam; and a laser light ray. An exposure amount is suitably selected in accordance with a light source to be used, the thickness of the photosensitive layer 7*a*, and the like.

Next, the photosensitive layer 7*a* after exposure is developed by a developer. As illustrated in FIG. 6, in a case where the photosensitive layer 7*a* is a negative photosensitive layer, an exposed portion is cured by exposure, and an unexposed portion is removed by development. Accordingly, the resist film 8*a* including the opening portion H1 with a shape corresponding to the removed unexposed portion is formed. In a case where the photosensitive layer 7*a* is a positive photosensitive layer, since the exposed portion is soluble in the developer by the exposure, the exposed portion is removed by development, and the resist film including the opening portion with a shape corresponding to the removed exposed portion is formed.

The developer, for example, is an alkaline developer, and an aqueous alkaline solution in which an alkaline compound such as sodium hydroxide, potassium hydroxide, tetramethyl ammonium hydroxide, and choline is dissolved in water such that the concentration is approximately 1 to 10% by mass, an aqueous alkaline solution such as ammonia water, and the like can be used. Examples of a developing method include a shower developing method, a spray developing method, an immersion developing method, and a paddle developing method.

[Step a4]

In the step a4, the portion positioned between the substrate 10 and the opening portion H1 of the resist film 8*a* in the conductor layer 5 (and the insulating magnetic layer 30) is removed to form the conductor wiring 20 (refer to FIG. 7(*d*).).

Specifically, wet etching is performed by using a known etchant such as a cupric chloride solution and a ferric chloride solution. Accordingly, the portion positioned between the substrate 10 and the opening portion H1 of the resist film 8*a* (a portion that is not protected with the resist film) in the conductor layer 5 and the insulating magnetic layer 30 is removed.

In FIG. 7, the portion positioned between the substrate 10 and the opening portion H1 of the resist film 8*a* in the insulating magnetic layer 30 is removed together with the conductor layer 5, and a part or the entire portion may remain on the substrate 10 without being removed.

[Step a5]

In the step a5, the resist film 8*a* is removed (refer to FIG. 7(*e*)). The resist film 8*a*, for example, can be removed by using an aqueous alkaline solution stronger than the alkaline developer used for the development in the step a3. Examples of a removing method of the resist film 8*a* include an immersion method and a spray method.

According to the operation described above, a wiring substrate 100A illustrated in FIG. 7(*d*) and a wiring substrate 100B illustrated in FIG. 7(*e*) are obtained. The wiring substrates 100A and 100B include the substrate 10, the conductor wiring 20 provided on the main surface of the substrate 10, and the insulating magnetic layer 30 provided on the periphery of the conductor wiring 20. The conductor wiring 20 includes the bottom surface S2 positioned on the substrate 10 side, the top surface S1 positioned on a side opposite to the substrate, and the pair of lateral surfaces S3*a* and S3*b* positioned between the bottom surface S2 and the top surface S1. The insulating magnetic layer 30 consists of the insulator containing the magnetic material, and covers the bottom surface S2 of the conductor wiring 20.

The thickness of the conductor wiring 20, for example, is 1 to 50 μm, and may be 5 to 50 μm. The width of the conductor wiring 20, for example, may be 5 to 300 μm.

From the viewpoint of ease of the signal propagation, the covering thickness of the insulating magnetic layer 30 may be 0.1 to 100 μm, may be 0.2 to 30 μm, or may be 0.5 to 10 μm.

From the viewpoint of suppressing the transmission loss, the relative magnetic permeability of the insulating magnetic layer 30 may be 2 to 1000, may be 10 to 1000, or may be 20 to 1000.

From the viewpoint of suppressing the transmission loss, the relative permittivity of the insulating magnetic layer 30 may be 1 to 30, may be 1 to 20, or may be 1 to 10.

Second Embodiment

Figure 8:
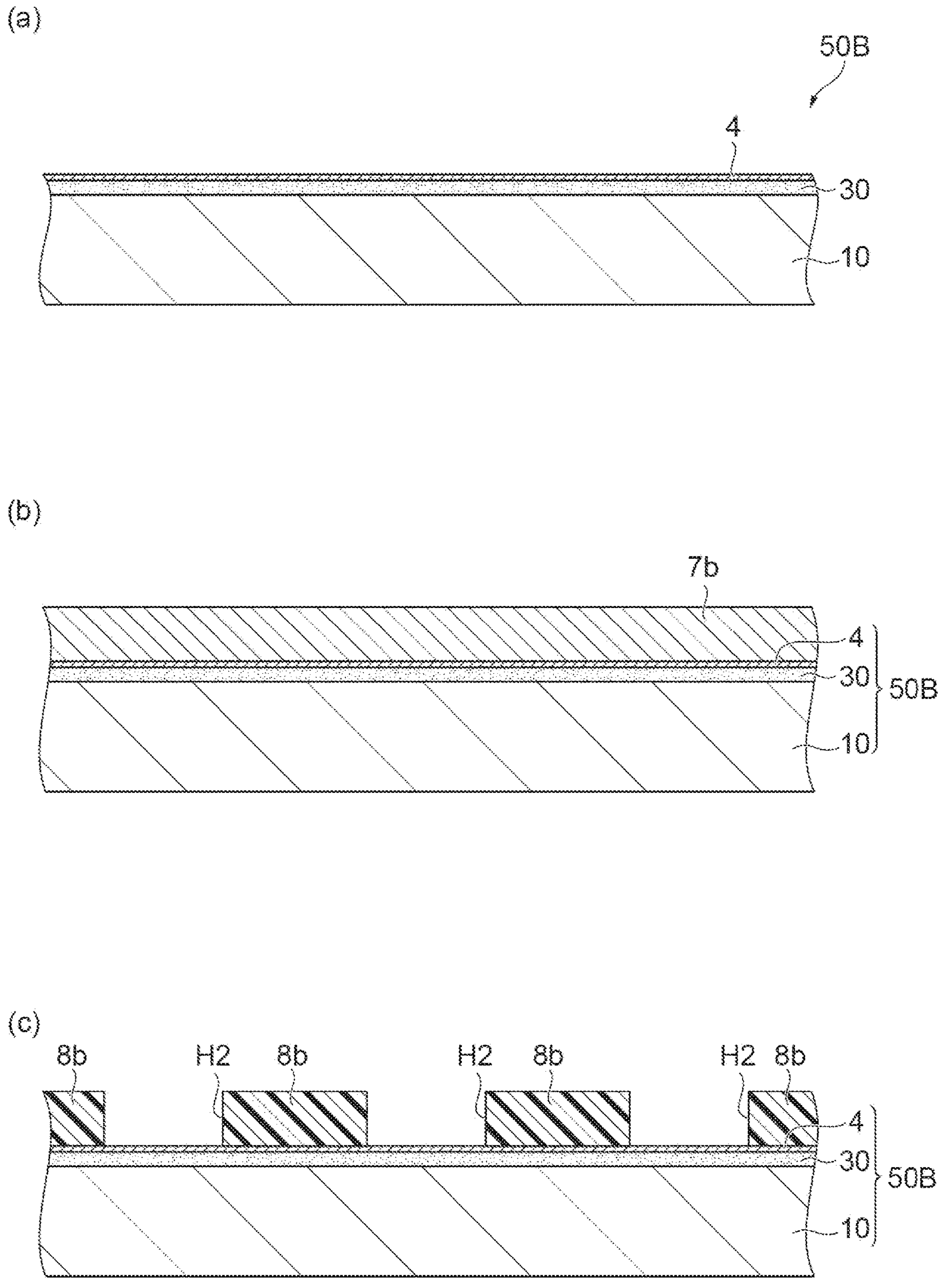
FIG. 8 is a schematic sectional view for describing a second embodiment of the method for manufacturing a wiring substrate.
Figure 9:
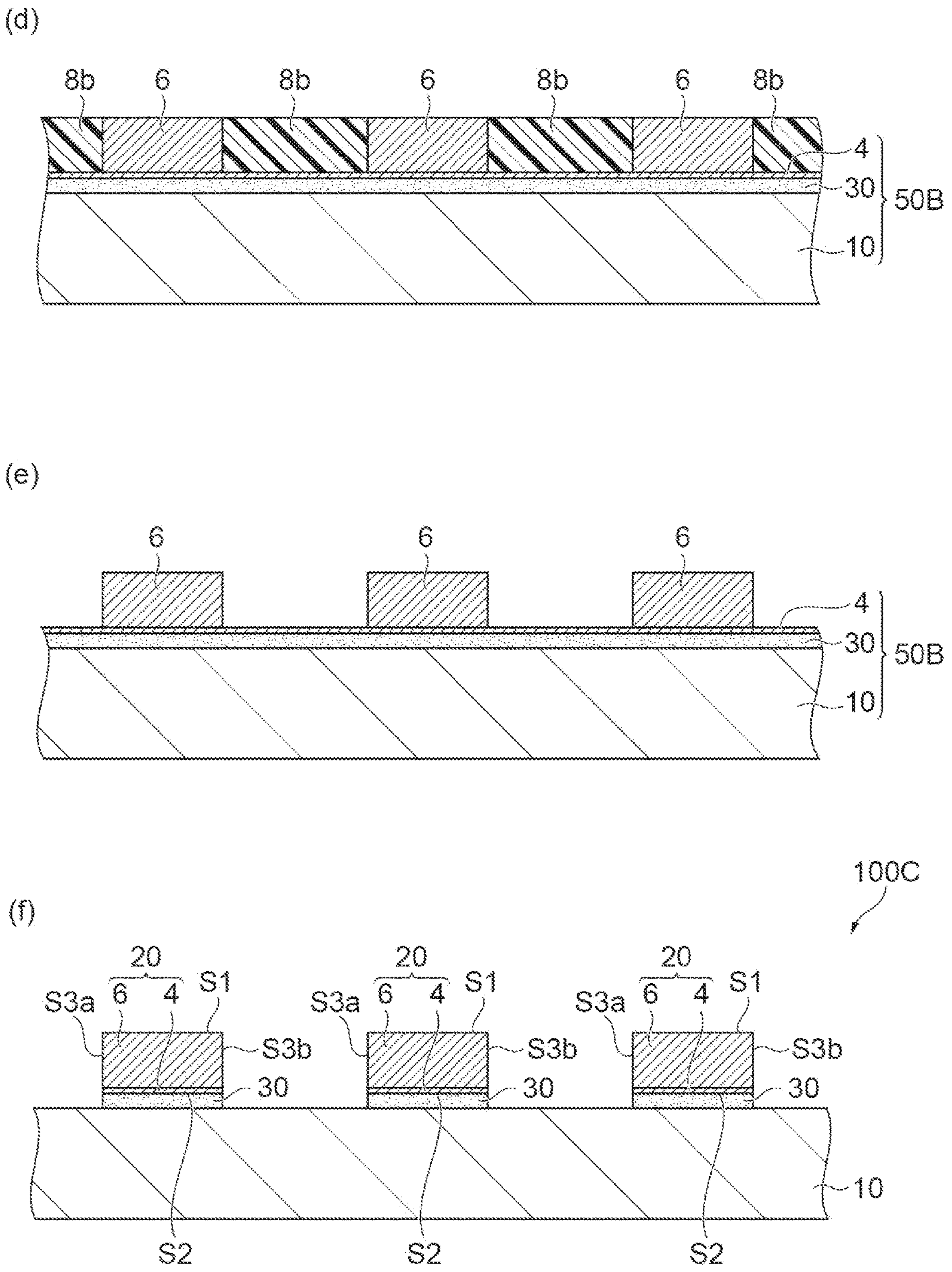
FIG. 9 is a schematic sectional view for describing the second embodiment of the method for manufacturing a wiring substrate, following FIG. 8.

FIG. 8 and FIG. 9 are schematic sectional views for describing a second embodiment of the method for manufacturing a wiring substrate. The manufacturing method of the second embodiment includes a step b1 of preparing a laminate 50B including the substrate 10, the insulating magnetic layer 30 provided on the substrate 10, and a plating seed layer 4 provided on the insulating magnetic layer 30 on a side opposite to the substrate 10, a step b2 of forming a photosensitive layer 7*b* on the laminate 50B on the insulating magnetic layer 30 side, a step b3 of forming a resist film 8*b* including an opening portion H2 by exposing the photosensitive layer 7*b* in a predetermined pattern and developing the exposed photosensitive layer, and a step b4 of forming the conductor wiring 20 on a region exposed from the opening portion H2 of the resist film 8*b* in the laminate 50B. Hereinafter, the steps b1 to b4 will be described.

[Step b1]

In the step b1, the laminate 50B is prepared (refer to FIG. 8(*a*)). The step b1 may include a step of forming the insulating magnetic layer 30 on the substrate 10, or may include a step of forming the plating seed layer 4 on the insulating magnetic layer 30. The details of the substrate 10 and the insulating magnetic layer 30, and the details of a forming method of the insulating magnetic layer 30 are the same as those in the step a1 of the first embodiment.

The plating seed layer 4, for example, can be formed by electroless plating or sputtering. A conductor (for example, a metal) configuring the plating seed layer 4 may be the same conductor as the conductor (for example, a metal) configuring the conductor wiring 20. The thickness of the plating seed layer 4, for example, may be 0.001 to 5 μm.

In FIG. 8(*a*), the laminate 50B includes the plating seed layer 4 on the insulating magnetic layer 30, and a laminate not including the plating seed layer 4 (a laminate 50C described below) can also be used. For example, in a case where plating is performed by electroless plating or sputtering in a step b4-1 described below, the laminate not including the plating seed layer 4 may be used. In the case of using a laminate including the plating seed layer 4 (the laminate 50B), there is a tendency that bonding adhesiveness to the insulating magnetic layer 30 of the conductor wiring 20 formed in the step b4 is improved.

[Step b2]

In the step b2, the photosensitive layer 7*b* is formed on the laminate 50B on the insulating magnetic layer 30 side (refer to FIG. 8(*b*)). The details of the photosensitive layer 7*b* and a forming method thereof are the same as the photosensitive layer 7*a* and the forming method thereof in the step a2 of the first embodiment.

The thickness of the photosensitive layer 7*b* may be suitably set in accordance with the intended thickness of the conductor wiring 20. The thickness of the photosensitive layer 7*b*, for example, is 10 to 100 μm.

[Step b3]

In the step b3, the photosensitive layer 7*b* is exposed in the predetermined pattern and developed to form the resist film 8*a* including the opening portion H2 (refer to FIG. 8(*c*)). The details of an exposing method and a developing method are the same as those in the step a3 of the first embodiment.

[Step b4]

In the step b4, the conductor wiring 20 is formed on the region exposed from the opening portion H2 of the resist film 8*b* in the laminate 50B. The step b4, for example, includes a step b4-1 of forming a plating layer 6 on the region exposed from the opening portion H2 of the resist film 8*b* in the laminate 50B by plating (refer to FIG. 9(*d*)), a step b4-2 of removing the resist film 8*b* (refer to FIG. 9(*e*)), and a step b4-3 of removing the plating seed layer 4 and/or the insulating magnetic layer 30 in a portion covered with the resist film 8*b* (refer to FIG. 9(*f*)). In the case of using the laminate not including the plating seed layer 4 (the laminate 50C described below) instead of the laminate 50B, the step b4 may not include the step b4-2. In this case, a wiring substrate including the resist film 8*b* between the conductor wirings 20 and 20 adjacent to each other is obtained. In addition, in the case of using the laminate 50B including the plating seed layer 4, it is necessary to remove the plating seed layer 4 by the step b4-3, but in the case of using the laminate not including the plating seed layer 4, the step b4 may not include the step b4-3. That is, the portion covered with the resist film 8*a* in the insulating magnetic layer 30 may remain on the substrate 10 without being removed.

Step b4-1

A plating method in the step b4-1 is not particularly limited, and for example, may be a method using electrolytic plating, electroless plating, or sputtering. Even though it is not illustrated, in the case of using the laminate not including the plating seed layer 4 (the laminate 50C described below), the plating layer 6 configures the conductor wiring 20. That is, the conductor wiring 20 is formed by the step b4-1.

Step b4-2

The details of a removing method of the resist film in the step b4-2 are the same as those in the step a5 of the first embodiment.

Step b4-3

In the step b4-3, the plating seed layer 4 and/or the insulating magnetic layer 30 in the portion covered with the resist film 8*b* is removed. In the case of using the laminate not including the plating seed layer 4 (the laminate 50C described below), in the step b4-3, only the insulating magnetic layer 30 is removed. In the step b4-3, only the plating seed layer 4 may be removed.

In the step b4-3, the removal of the plating seed layer 4 and the removal of the insulating magnetic layer 30 may be simultaneously implemented, or may be sequentially implemented. A method using a mechanical drill, a laser, etching, sandblast, and the like can be applied to the removal of the plating seed layer 4 and the insulating magnetic layer 30 in the step b4-3. The etching, for example, may be wet etching using a known etchant such as a cupric chloride solution and a ferric chloride solution. In the case of removing a part of the plating seed layer 4 and the insulating magnetic layer 30 by wet etching, since a part of the plating layer 6 formed in the step b4-1 is also simultaneously removed, it is preferable that the thickness of the plating layer 6 formed in the step b4-1 is thicker than the intended thickness of the conductor wiring 20 by adjusting the thickness of the resist film in the step b3.

According to the operation described above, a wiring substrate 100C illustrated in FIG. 9(*f*) is obtained. The details of the wiring substrate 100C are the same as those of the wiring substrate 100B obtained in the first embodiment, except that the conductor wiring 20 is composed of the plating layer 6 and the plating seed layer 4.

Third Embodiment and Fourth Embodiment

In a third embodiment and a fourth embodiment, a wiring substrate (a substrate on which conductor wiring is formed) including a substrate, conductor wiring provided on the main surface of the substrate, and an insulating magnetic layer provided to cover the bottom surface S2 of the conductor wiring is used. That is, a method for manufacturing a wiring substrate of the third embodiment and the fourth embodiment can be implemented after the step a5 of the method for manufacturing a wiring substrate of the first embodiment or after the step b4-2 of the method for manufacturing a wiring substrate of the second embodiment (after the step b4-3 in the case of implementing the step b4-3). Hereinafter, the method for manufacturing a wiring substrate of the third embodiment and the fourth embodiment will be described with a method using the wiring substrate (the substrate on which the conductor wiring 20 is formed) 100B obtained by the manufacturing method of the first embodiment as an example.

The method for manufacturing a wiring substrate of the third embodiment and the fourth embodiment includes a step c1 of forming the insulating magnetic layer 30 covering the top surface S1 and/or at least one of the pair of lateral surfaces S3*a* and S3*b* of the conductor wiring 20 in the wiring substrate (the substrate on which the conductor wiring 20 is formed) 100B. Hereinafter, the details will be described by using FIGS. 10 to 12.

Figure 10:
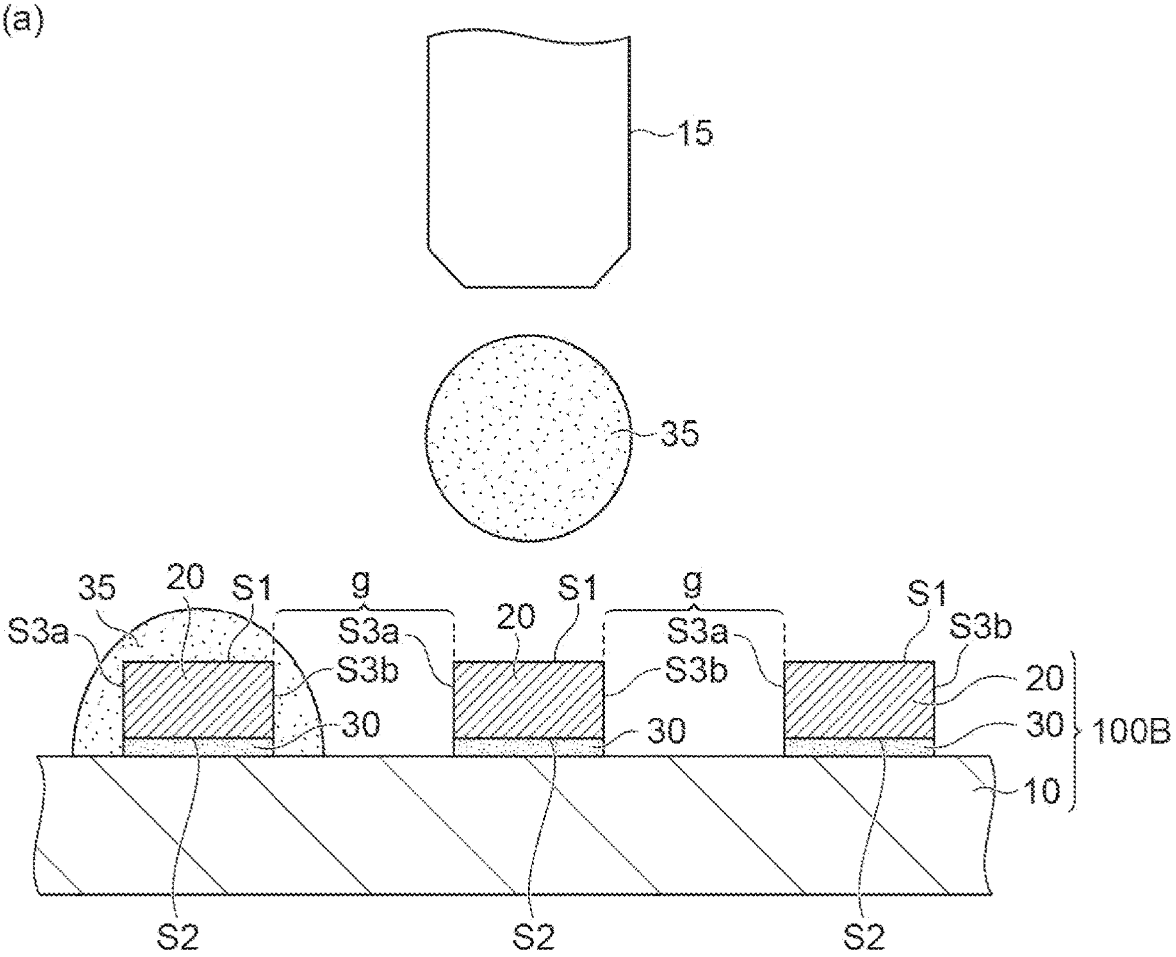
FIG. 10 is a schematic sectional view for describing a third embodiment of the method for manufacturing a wiring substrate.
Figure 10:
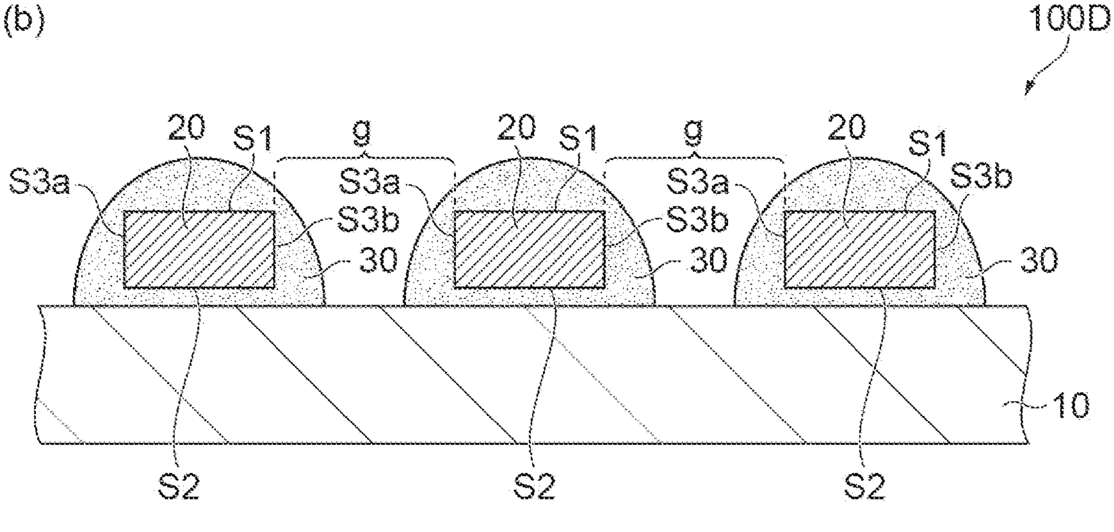

FIG. 10 is a schematic sectional view for describing the third embodiment of the method for manufacturing a wiring substrate. In the third embodiment, the step c1 described above includes a step d1 of applying a composition 35 for forming an insulating magnetic layer containing a magnetic material to the conductor wiring 20 to cover the top surface S1 of the conductor wiring 20 without filling a gap g between the conductor wirings 20 and 20 adjacent to each other (refer to FIG. 10(*a*)), and a step d2 of curing the composition 35 for forming an insulating magnetic layer to form the insulating magnetic layer 30 consisting of the cured product of the composition 35 for forming an insulating magnetic layer (refer to FIG. 10(*b*)). Hereinafter, the steps d1 and d2 will be described.

[Step d1]

In the step d1, the composition 35 for forming an insulating magnetic layer is applied to the conductor wiring 20 to cover the top surface S1 of the conductor wiring 20. In this case, as illustrated in FIG. 10(*a*), the composition 35 for forming an insulating magnetic layer may be applied to the conductor wiring 20 to cover not only the top surface S1 of the conductor wiring 20 but also at least one of the pair of lateral surfaces S3*a* and S3*b*. However, the gap g between the conductor wirings 20 and 20 adjacent to each other is not filled with the composition 35 for forming an insulating magnetic layer. More specifically, the composition 35 for forming an insulating magnetic layer covering one of the conductor wirings 20 and 20 adjacent to each other and the composition 35 for forming an insulating magnetic layer covering the other one are not in contact with each other. In FIG. 10(*a*), the composition 35 for forming an insulating magnetic layer is applied to the conductor wiring 20 to cover not only the top surface S1 of the conductor wiring 20 but also the pair of lateral surfaces S3*a* and S3*b*, but the composition 35 for forming an insulating magnetic layer may be applied to the conductor wiring 20 such that one or both of the pair of lateral surfaces S3*a* and S3*b* are not covered with the composition 35 for forming an insulating magnetic layer.

As the composition 35 for forming an insulating magnetic layer, for example, a paste-shaped or ink-shaped composition is used. A coating method of the composition 35 for forming an insulating magnetic layer is not particularly limited insofar as the coating method is a method capable of applying the composition 35 for forming an insulating magnetic layer in a width equivalent to the width of the fine conductor wiring 20. For example, as illustrated in FIG. 10, the composition 35 for forming an insulating magnetic layer can be applied (printed) to the conductor wiring 20 by a printing method for discharging the composition 35 for forming an insulating magnetic layer from a nozzle 15. The coating method of the composition 35 for forming an insulating magnetic layer may be a jet printing method, a dispenser, a jet dispenser, a needle dispenser, a particle deposition method, a spray coater, a spin coater, a dip coater, and the like.

[Step d2]

In the step d2, the composition 35 for forming an insulating magnetic layer is cured. A curing method of the composition 35 for forming an insulating magnetic layer is the same as the curing method of the composition for forming an insulating magnetic layer in the step a1 of the first embodiment.

According to the operation described above, a wiring substrate 100D illustrated in FIG. 10(*b*) is obtained. The wiring substrate 100D includes the substrate 10, the conductor wiring 20 provided on the main surface of the substrate 10, and the insulating magnetic layer 30 covering the top surface S1, the bottom surface S2, and the pair of lateral surfaces S3*a* and S3*b* of the conductor wiring 20. The insulating magnetic layer 30 has a cross-sectional surface in the shape of a dome that swells toward the top surface S1 side, and covers the top surface S1, the bottom surface S2, and the pair of lateral surfaces S3*a* and S3*b* of the conductor wiring 20.

The details of the covering thickness and the like of the insulating magnetic layer 30 are the same as those of the wiring substrates 100A and 100B of the first embodiment described above. In the third embodiment, it is preferable that the covering thickness at a spot where the covering thickness is maximized is less than the maximum value of the range described above, and the covering thickness at a spot where the covering thickness is minimized is greater than the minimum value of the range described above.

In FIG. 10, the insulating magnetic layer 30 is formed to cover the top surface S1 and the pair of lateral surfaces S3*a* and S3*b* of the conductor wiring 20, and the top surface S1 may be covered with the insulating magnetic layer 30, but one or both of the pair of lateral surfaces S3*a* and S3*b* may not be covered with the insulating magnetic layer 30. In addition, one or both of the pair of lateral surfaces S3*a* and S3*b* may be covered with the insulating magnetic layer 30, but the top surface S1 may not be covered with the insulating magnetic layer 30. For example, in the step d1, the composition 35 for forming an insulating magnetic layer may cover only the top surface S1 of the conductor wiring 20 such that both of the pair of lateral surfaces S3*a* and S3*b* are not covered. According to such a method, the insulating magnetic layer 30 covering the pair of lateral surfaces S3*a* and S3*b* is not formed. In addition, for example, in the step d1, the composition 35 for forming an insulating magnetic layer may be applied to the conductor wiring 20 such that one of the pair of lateral surfaces S3*a* and S3*b* is covered but the other one is not covered. According to such a method, the insulating magnetic layer 30 covering one of the pair of lateral surfaces S3*a* and S3*b* is formed, but the insulating magnetic layer 30 covering the other one is not formed. In addition, for example, the step c1 may further include a step of removing the insulating magnetic layer 30 covering the top surface S1 of the conductor wiring 20 by grinding or polishing, after the step d2. In this case, in the step d1, the composition 35 for forming an insulating magnetic layer is applied to the conductor wiring 20 to cover not only the top surface S1 of the conductor wiring 20 but also at least one of the pair of lateral surfaces S3*a* and S3*b*. According to such a method, the insulating magnetic layer 30 covering the top surface S1 of the conductor wiring 20 is not formed. A grinding method and a polishing method are not particularly limited, and for example, may be grinding according to a fly cutting method, polishing according to chemical mechanical polishing (CMP), and the like. In the fly cutting method, a grinding device with a diamond bite can be used, and for example, an automatic surface planer compatible with a wafer of 300 mm (Product Name "DAS8930", manufactured by DISCO Corporation) can be used.

Figure 11:
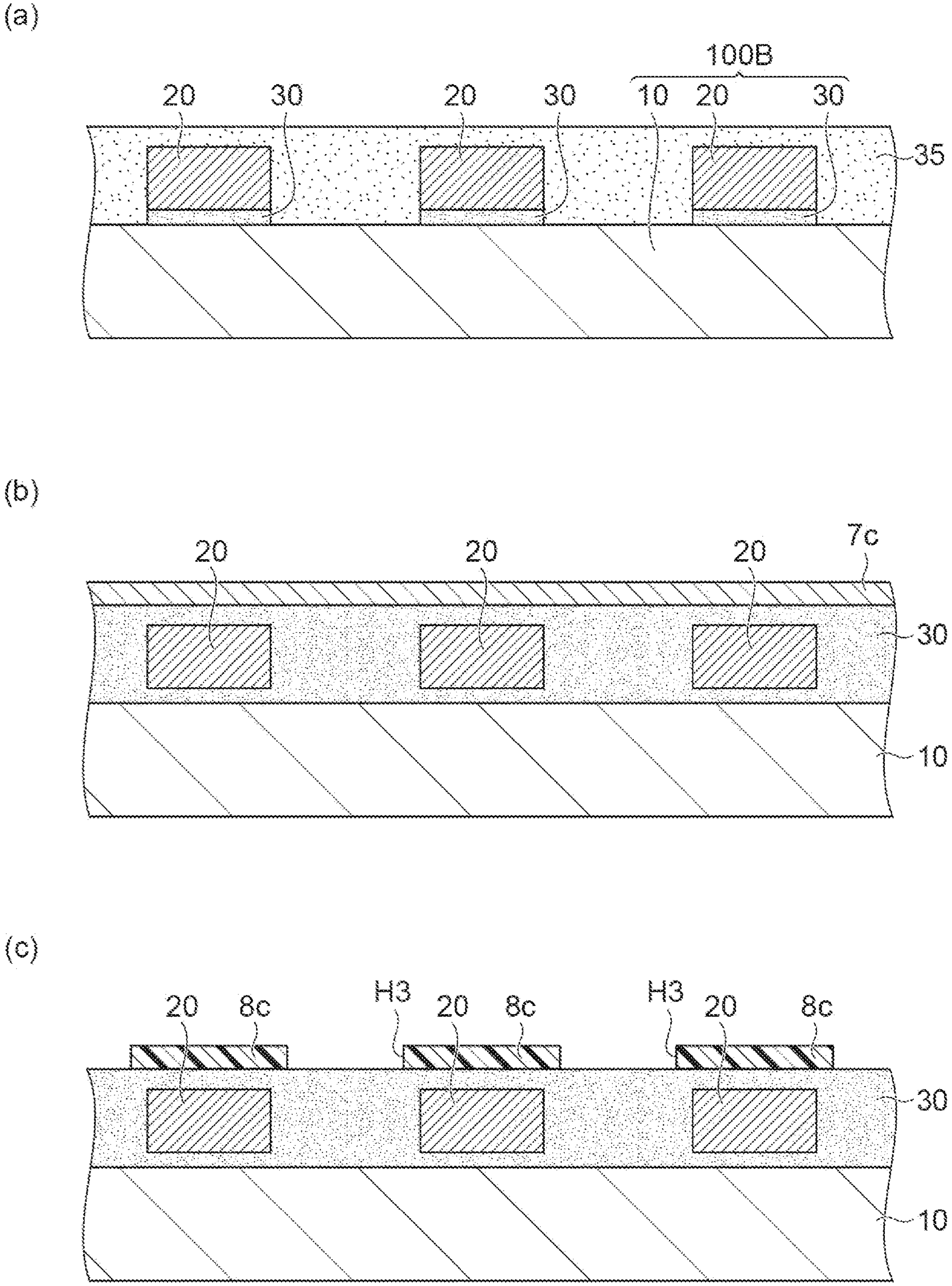
FIG. 11 is a schematic sectional view for describing a fourth embodiment of the method for manufacturing a wiring substrate.
Figure 12:
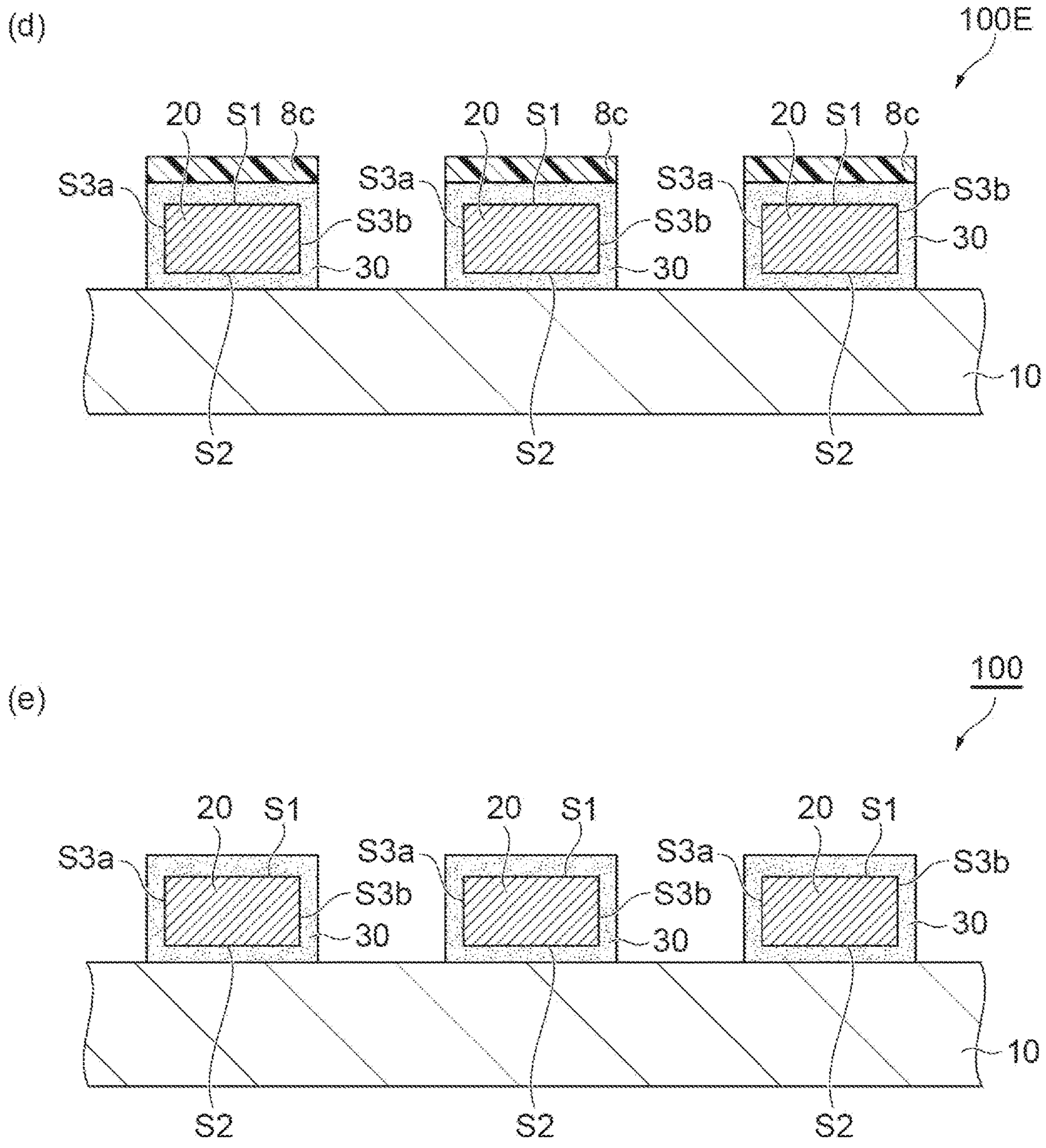
FIG. 12 is a schematic sectional view for describing the fourth embodiment of the method for manufacturing a wiring substrate, following FIG. 11.

FIG. 11 and FIG. 12 are schematic sectional views for describing the fourth embodiment of the method for manufacturing a wiring substrate. In the fourth embodiment, the step c1 described above includes a step e1 of forming a layer consisting of the composition 35 for forming an insulating magnetic layer containing the magnetic material on a region in which the conductor wiring 20 is formed of the substrate on which the conductor wiring 20 is formed (the wiring substrate) 100B to cover the conductor wiring 20 with the layer (refer to FIG. 11(*a*)), a step e2 of curing the composition 35 for forming an insulating magnetic layer to form the insulating magnetic layer 30 consisting of the cured product of the composition 35 for forming an insulating magnetic layer, a step e3 of forming a photosensitive layer 7*c* on the layer consisting of the composition 35 for forming an insulating magnetic layer or the insulating magnetic layer 30 on a side opposite to the substrate 10 (refer to FIG. 11(*b*)), a step e4 of forming a resist film 8*c* including an opening portion H3 in at least a part of a portion other than on the conductor wiring 20 by exposing the photosensitive layer 7*c* in a predetermined pattern and developing the exposed photosensitive layer (refer to FIG. 11(*c*)), and a step e5 of removing a portion positioned between the substrate 10 and the opening portion H3 of the resist film 8*c* in the layer consisting of the composition 35 for forming an insulating magnetic layer or the insulating magnetic layer 30 (refer to FIG. 12(*d*)). In the fourth embodiment, the step c1 may further include a step e6 of removing the resist film 8*c* (refer to FIG. 13(*e*)). Hereinafter, the steps e1 to e6 will be described.

[Step e1]

In the step e1, by forming the layer consisting of the composition 35 for forming an insulating magnetic layer on the region in which the conductor wiring 20 is formed of the substrate 100B on which the conductor wiring 20 is formed (on the substrate 10 and on the conductor wiring 20) to fill the gap between the conductor wirings 20 and 20 adjacent to each other, the top surface S1 and the pair of lateral surfaces S3*a* and S3*b* of the conductor wiring 20 are covered with the composition 35 for forming an insulating magnetic layer.

Specifically, the step e1 may be a step of applying the composition 35 for forming an insulating magnetic layer to the region described above, or may be a step of laminating a sheet (for example, a film-shaped sheet) consisting of the composition 35 for forming an insulating magnetic layer on the region described above. The layer consisting of the composition 35 for forming an insulating magnetic layer may be formed to cover a part of the region of the substrate 100B in which the conductor wiring 20 is formed, or may be formed to cover the entire region of the substrate 100B in which the conductor wiring 20 is formed (for example, the entire surface of the substrate 100B). The details of a coating method of the composition 35 for forming an insulating magnetic layer and a laminating method of the sheet consisting of the composition 35 for forming an insulating magnetic layer are the same as the coating method of the composition for forming an insulating magnetic layer and the laminating method of the sheet consisting of the composition for forming an insulating magnetic layer in the step a1 of the first embodiment.

[Step e2 to Step e6]

The step e2 can be implemented as with the curing of the composition for forming an insulating magnetic layer in the step a1 of the first embodiment. In FIG. 11, the step e2 is implemented before the step e3, and the step e2 may be implemented after the step e3. The step e2, for example, may be implemented after the step e5. In a case where the step e2 is implemented after the step e3, the step e3 is a step of forming the photosensitive layer 7*c* on the layer consisting of the composition 35 for forming an insulating magnetic layer on a side opposite to the substrate 10, and in a case where the step e2 is implemented before the step e3, the step e3 is a step of forming the photosensitive layer 7*c* on the insulating magnetic layer 30 on a side opposite to the substrate 10. Similarly, in a case where the step e2 is implemented after the step e5, the step e5 is a step of removing the portion positioned between the substrate 10 and the opening portion H3 of the resist film 8*c* in the layer consisting of the composition 35 for forming an insulating magnetic layer, and in a case where the step e2 is implemented before the step e5, the step e5 is a step of removing the portion positioned between the substrate 10 and the opening portion H3 of the resist film 8*c* in the insulating magnetic layer 30. In addition, the step e3 and the step e4 can be implemented as with the step a2 and the step a3 of the first embodiment. In addition, the step e5 can be implemented as with the removal of the conductor layer 5 in the step a4 of the first embodiment. In addition, the step e6 can be implemented as with the step a5 of the first embodiment.

According to the operation described above, a wiring substrate 100E illustrated in FIG. 12(*d*) and a wiring substrate 100 illustrated in FIG. 12(*e*) are obtained. The details of the wiring substrates 100E and 100 are the same as those of the wiring substrate 100D obtained in the third embodiment, except that the insulating magnetic layers 30 on the top surface S1 side, the lateral surface S3*a* side, and the lateral surface S3*b* side of the conductor wiring 20 are each formed with a uniform covering thickness. In the top surface S1 side, the bottom surface S2 side, and the lateral surface S3*a* side and the lateral surface S3*b* side of the conductor wiring 20, the covering thickness of the insulating magnetic layer 30 may be the same, or may be different.

In FIG. 12, the insulating magnetic layer 30 is formed to cover the top surface S1 and the pair of lateral surfaces S3*a* and S3*b* of the conductor wiring 20, and the top surface S1 may be covered with the insulating magnetic layer 30, but one or both of the pair of lateral surfaces S3*a* and S3*b* may not be covered with the insulating magnetic layer 30. In addition, one or both of the pair of lateral surfaces S3*a* and S3*b* may be covered with the insulating magnetic layer 30, but the top surface S1 may not be covered with the insulating magnetic layer 30. For example, in the step e4, the resist film 8*c* may be formed such that the entire portion other than on the conductor wiring 20 is the opening portion H3. In this case, in the step e5, since the insulating magnetic layer 30 positioned between the conductor wirings 20 and 20 adjacent to each other is removed, the insulating magnetic layer 30 covering the pair of lateral surfaces S3*a* and S3*b* is not formed. By changing the size and the shape of the opening portion H3, while forming the insulating magnetic layer 30 covering one of the pair of lateral surfaces S3*a* and S3*b*, it is also possible not to form the insulating magnetic layer 30 covering the other one. In addition, for example, the step c1 may further include a step of removing the insulating magnetic layer 30 covering the top surface S1 of the conductor wiring 20 by grinding or polishing after the step e2. Such a step may be implemented after the step e6. According to such a method, the insulating magnetic layer 30 covering the top surface S1 of the conductor wiring 20 is not formed. A grinding method and a polishing method are not particularly limited, and for example, may be grinding according to a fly cutting method, polishing according to chemical mechanical polishing (CMP), and the like. In the fly cutting method, a grinding device with a diamond bite can be used, and for example, an automatic surface planer compatible with a wafer of 300 mm (Product Name "DAS8930", manufactured by DISCO Corporation) can be used.

Fifth Embodiment

Figure 13:
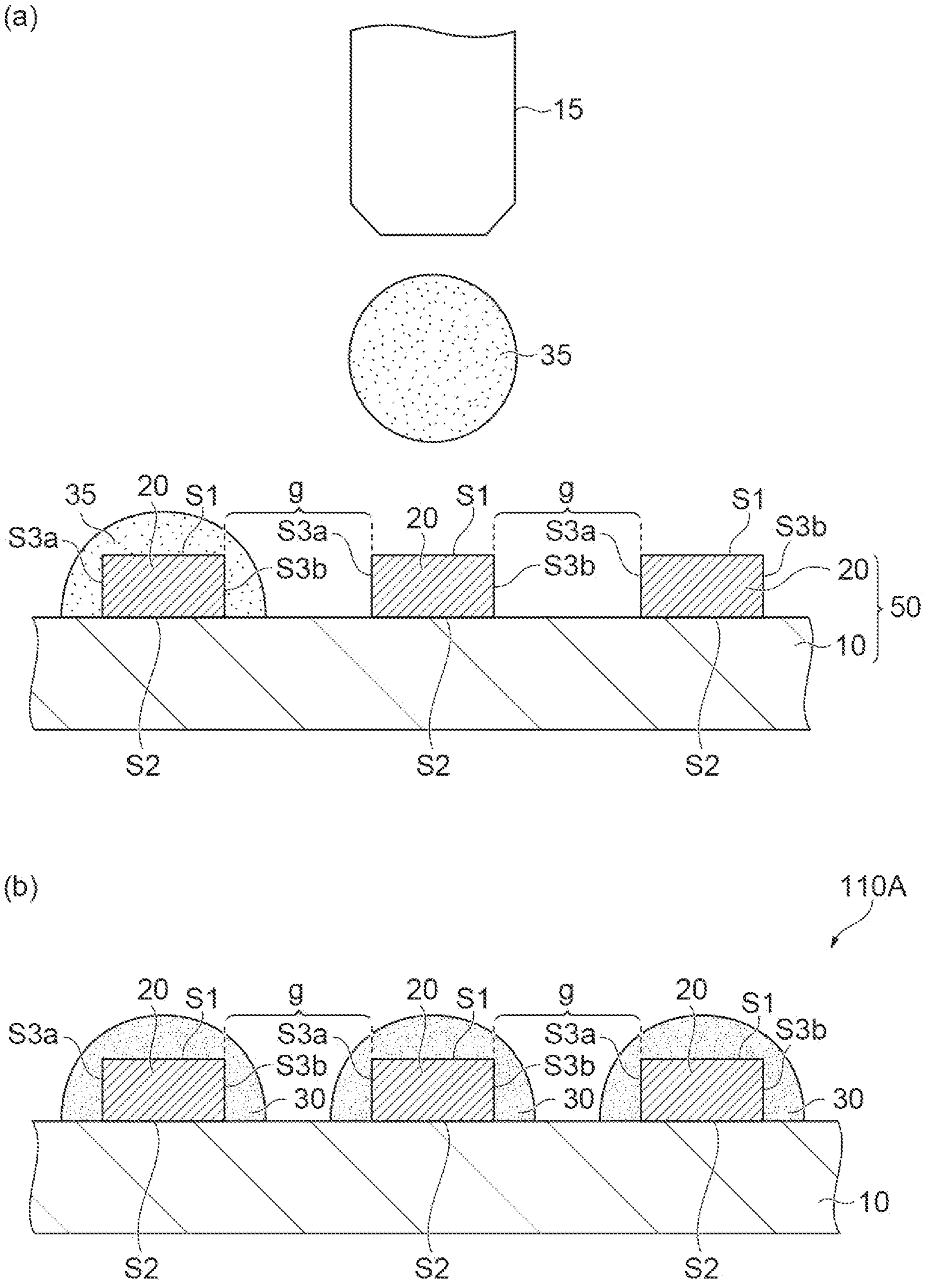
FIG. 13 is a schematic sectional view for describing a fifth embodiment of the method for manufacturing a wiring substrate.

FIG. 13 is a schematic sectional view for describing a fifth embodiment of the method for manufacturing a wiring substrate. The manufacturing method of the fifth embodiment includes a step f1 of preparing a substrate 50 with wiring including the substrate 10, and the conductor wiring 20 provided on the substrate 10, and a step f2 of covering the conductor wiring 20 with the composition 35 for forming an insulating magnetic layer containing the magnetic material and curing the composition 35 for forming an insulating magnetic layer to form the insulating magnetic layer 30 consisting of the cured product of the composition 35 for forming an insulating magnetic layer, and the step f2 includes a step g1 of applying the composition 35 for forming an insulating magnetic layer to the conductor wiring 20 to cover the top surface S1 of the conductor wiring 20 without filling the gap g between the conductor wirings 20 and 20 adjacent to each other, and a step g2 of curing the composition 35 for forming an insulating magnetic layer to form the insulating magnetic layer 30. Hereinafter, the steps f1 to f3, the step g1, and the step g2 will be described.

[Step f1]

In the step f1, the substrate 50 with wiring is prepared. The step f1 may be a step of manufacturing the substrate 50 with wiring. The substrate 50 with wiring, for example, can be obtained by a known method such as a method for forming a conductor layer on the substrate 10, and then, patterning the conductor layer by a photolithography method or the like to form the conductor wiring 20, and a method for forming the conductor wiring 20 on the substrate 10 by plating, sputtering, or the like.

As the substrate 10, the substrate described above can be used.

The conductor wiring 20, for example, is in contact with the substrate 10. The conductor wiring 20 contains a conductor.

Examples of the conductor include a metal such as copper, gold, silver, and nickel.

The thickness of the conductor wiring 20, for example, is 1 to 50 μm, and may be 5 to 50 μm. The width of the conductor wiring 20, for example, may be 5 to 300 μm.

Specific examples of the substrate 50 with wiring include a substrate on which wiring is formed by patterning a copper layer of a copper clad laminate.

[Step f2]

In the step f2, the conductor wiring 20 is covered with the composition 35 for forming an insulating magnetic layer to form the insulating magnetic layer 30. In the fifth embodiment, the step f2 includes the step g1 and the step g2 described below.

Step g1

In the step g1, the composition 35 for forming an insulating magnetic layer is applied to the conductor wiring 20 to cover the top surface S1 of the conductor wiring 20 (refer to FIG. 13(*a*)). In this case, as illustrated in FIG. 13(*a*), the composition 35 for forming an insulating magnetic layer may be applied to the conductor wiring 20 to cover not only the top surface S1 of the conductor wiring 20 but also at least one of the pair of lateral surfaces S3*a* and S3*b*. However, the gap g between the conductor wirings 20 and 20 adjacent to each other is not filled with the composition 35 for forming an insulating magnetic layer. More specifically, the composition 35 for forming an insulating magnetic layer covering one of the conductor wirings 20 and 20 adjacent to each other and the composition 35 for forming an insulating magnetic layer covering the other one are not in contact with each other. In FIG. 13(*a*), the composition 35 for forming an insulating magnetic layer is applied to the conductor wiring 20 to cover not only the top surface S1 of the conductor wiring 20 but also the pair of lateral surfaces S3*a* and S3*b*, and the composition 35 for forming an insulating magnetic layer may be applied to the conductor wiring 20 such that one or both of the pair of lateral surfaces S3*a* and S3*b* are not covered with the composition 35 for forming an insulating magnetic layer.

As the composition 35 for forming an insulating magnetic layer, for example, a paste-shaped or ink-shaped composition is used. A coating method of the composition 35 for forming an insulating magnetic layer is not particularly limited insofar as the coating method is a method capable of applying the composition 35 for forming an insulating magnetic layer in a width equivalent to the width of the fine conductor wiring 20. For example, as illustrated in FIG. 13(*a*), the composition 35 for forming an insulating magnetic layer can be applied (printed) to the conductor wiring 20 by a printing method for discharging the composition 35 for forming an insulating magnetic layer from the nozzle 15. The coating method of the composition 35 for forming an insulating magnetic layer may be a jet printing method, a dispenser, a jet dispenser, a needle dispenser, a particle deposition method, a spray coater, a spin coater, a dip coater, and the like.

Step g2

In the step g2, the composition 35 for forming an insulating magnetic layer is cured to form the insulating magnetic layer 30 (refer to FIG. 13(*b*)).

The composition 35 for forming an insulating magnetic layer, for example, can be cured by heating. The curing of the composition 35 for forming an insulating magnetic layer may be the curing of the composition 35 for forming an insulating magnetic layer by drying, or may be the thermal curing of the composition 35 for forming an insulating magnetic layer in a case where the composition 35 for forming an insulating magnetic layer contains a thermosetting resin. A heating temperature and a heating time may be suitably adjusted in accordance with the type of solvent, the type of thermosetting resin, or the like contained in the composition 35 for forming an insulating magnetic layer.

According to the operation described above, a wiring substrate 110A illustrated in FIG. 13(*b*) is obtained. The wiring substrate 110A includes the substrate 10, the conductor wiring 20 provided on the main surface of the substrate 10, and the insulating magnetic layer 30 covering the top surface S1 and the pair of lateral surfaces S3*a* and S3*b* of the conductor wiring 20. The insulating magnetic layer 30 has a cross-sectional surface in the shape of a dome that swells toward the top surface S1 side.

The insulating magnetic layer 30 consists of an insulator containing a magnetic material. The magnetic material may be dispersed in the insulating magnetic layer 30.

From the viewpoint of ease of the signal propagation, the covering thickness of the insulating magnetic layer 30 may be 0.1 to 100 μm, may be 0.2 to 30 μm, or may be 0.5 to 10 μm. In the fifth embodiment, it is preferable that the covering thickness at a spot where the covering thickness is maximized is less than the maximum value of the range described above, and the covering thickness at a spot where the covering thickness is minimized is greater than the minimum value of the range described above.

From the viewpoint of suppressing the transmission loss, the relative magnetic permeability of the insulating magnetic layer 30 may be 2 to 1000, may be 10 to 1000, or may be 20 to 1000.

From the viewpoint of suppressing the transmission loss, the relative permittivity of the insulating magnetic layer 30 may be 1 to 30, may be 1 to 20, or may be 1 to 10.

In FIG. 13, the insulating magnetic layer 30 is formed to cover the top surface S1 and the pair of lateral surfaces S3*a* and S3*b* of the conductor wiring 20, and the top surface S1 may be covered with the insulating magnetic layer 30, but one or both of the pair of lateral surfaces S3*a* and S3*b* may not be covered with the insulating magnetic layer 30. In addition, one or both of the pair of lateral surfaces S3*a* and S3*b* may be covered with the insulating magnetic layer 30, but the top surface S1 may not be covered with the insulating magnetic layer 30. For example, in the step g1, the composition 35 for forming an insulating magnetic layer may be applied only to the top surface S1 of the conductor wiring 20 such that neither of the pair of lateral surfaces S3*a* and S3*b* is not covered. According to such a method, the insulating magnetic layer 30 covering the pair of lateral surfaces S3*a* and S3*b* is not formed. In addition, for example, in the step g1, the composition 35 for forming an insulating magnetic layer may be applied to the conductor wiring 20 such that one of the pair of lateral surfaces S3*a* and S3*b* is covered, but the other one is not covered. According to such a method, the insulating magnetic layer 30 covering one of the pair of lateral surfaces S3*a* and S3*b* is formed, but the insulating magnetic layer 30 covering the other one is not formed. In addition, for example, the step f2 may further include a step of removing the insulating magnetic layer 30 covering the top surface S1 of the conductor wiring 20 by grinding or polishing after the step g2. In this case, in the step g1, the composition 35 for forming an insulating magnetic layer is applied to the conductor wiring 20 to cover not only the top surface S1 of the conductor wiring 20 but also at least one of the pair of lateral surfaces S3*a* and S3*b*. According to such a method, the insulating magnetic layer 30 covering the top surface S1 of the conductor wiring 20 is not formed. A grinding method and a polishing method are not particularly limited, and for example, may be grinding according to a fly cutting method, polishing according to chemical mechanical polishing (CMP), and the like. In the fly cutting method, a grinding device with a diamond bite can be used, and for example, an automatic surface planer compatible with a wafer of 300 mm (Product Name "DAS8930", manufactured by DISCO Corporation) can be used.

Sixth Embodiment

Figure 14:
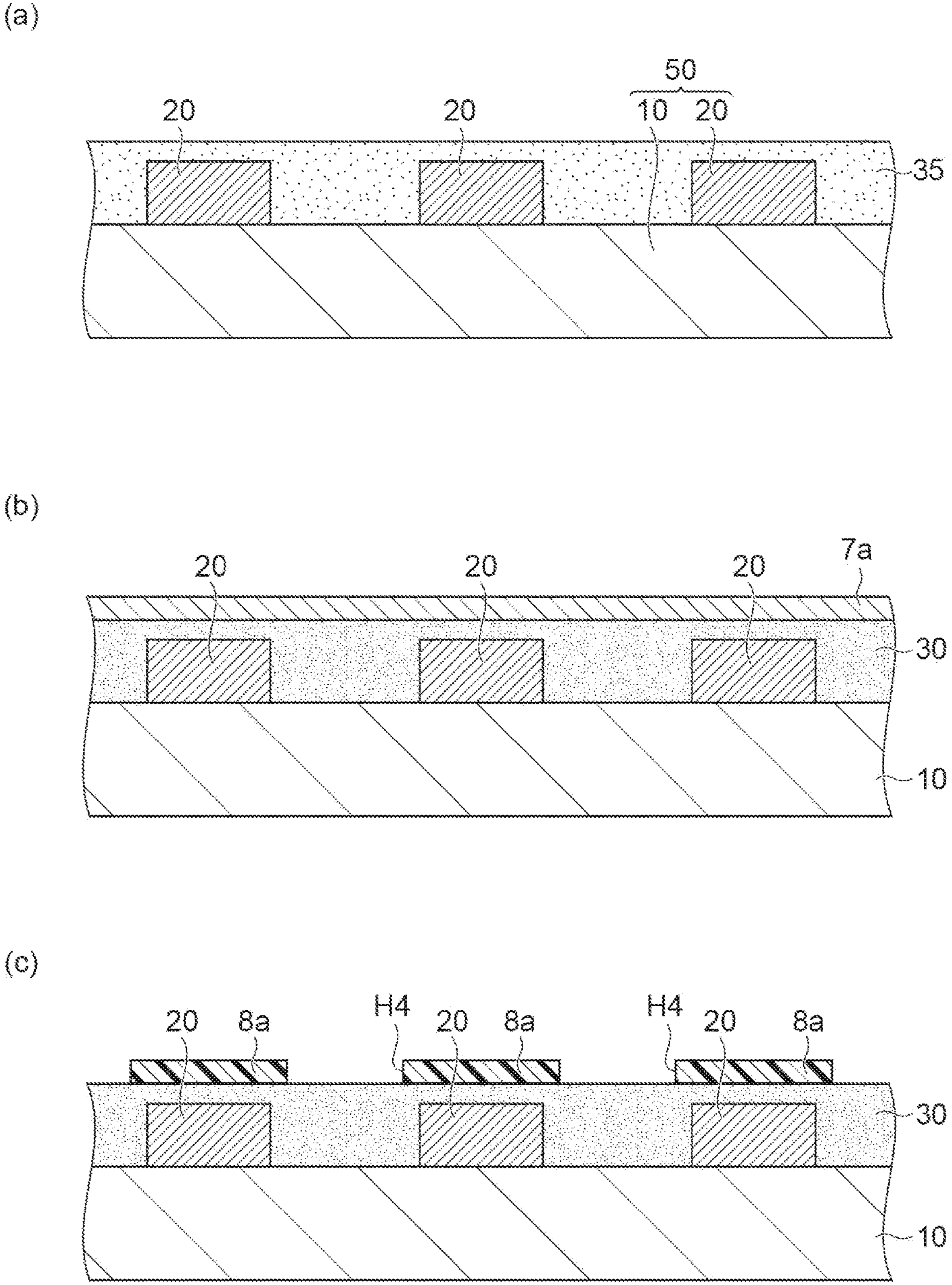
FIG. 14 is a schematic sectional view for describing a sixth embodiment of the method for manufacturing a wiring substrate.
Figure 15:
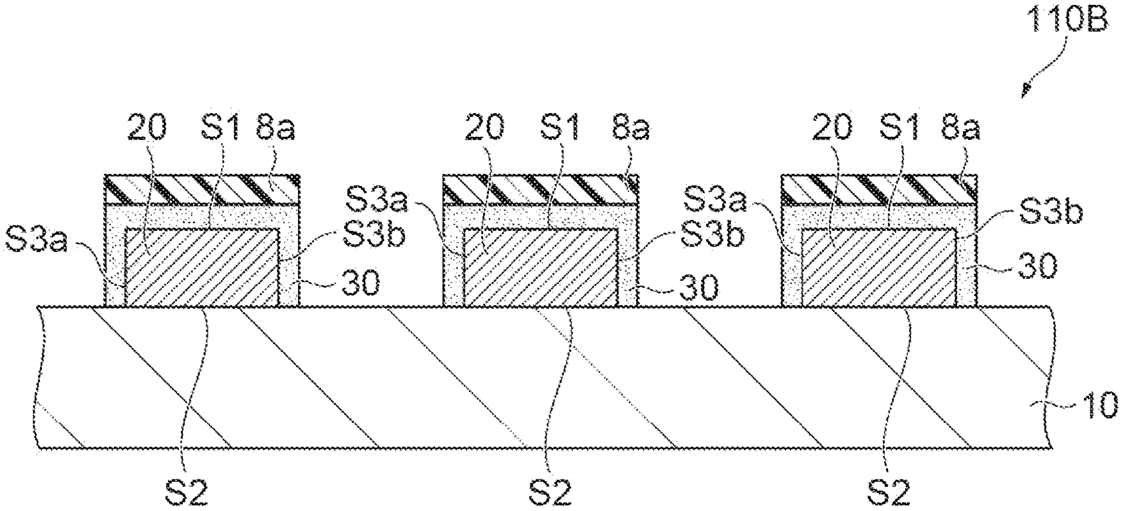
FIG. 15 is a schematic sectional view for describing the sixth embodiment of the method for manufacturing a wiring substrate, following FIG. 14.
Figure 15:
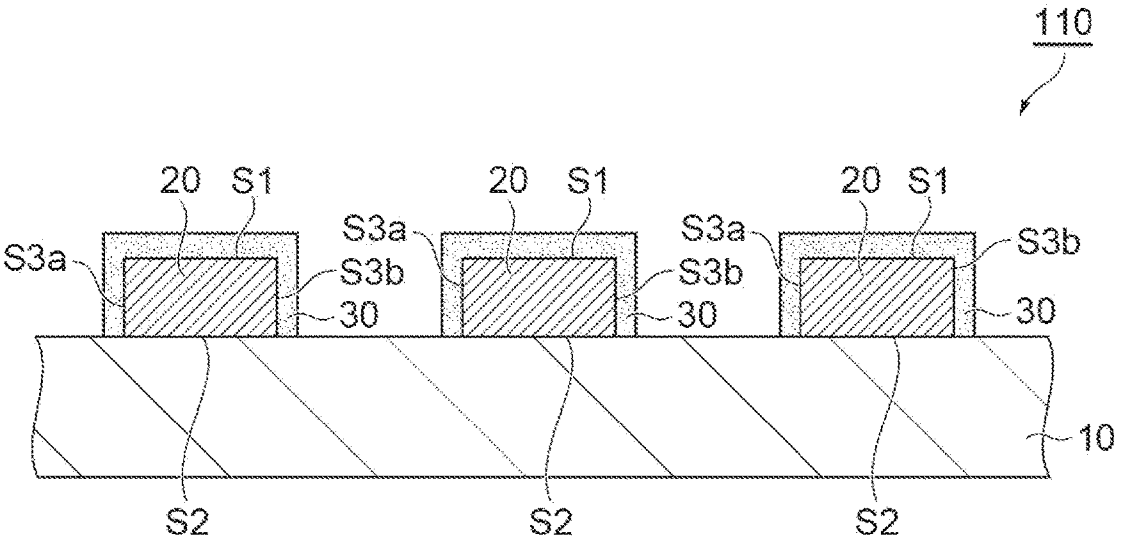

FIG. 14 and FIG. 15 are schematic sectional views for describing a sixth embodiment of the method for manufacturing a wiring substrate. As with the fifth embodiment described above, the method for manufacturing a wiring substrate of the sixth embodiment includes the step f1 and the step f2, and the step f2 includes a step h1 of forming a layer consisting of the composition 35 for forming an insulating magnetic layer on a region of the substrate 50 with wiring in which the conductor wiring 20 is formed, a step h2 of curing the layer consisting of the composition 35 for forming an insulating magnetic layer to form the insulating magnetic layer 30 consisting of the cured product of the composition 35 for forming an insulating magnetic layer, a step h3 of forming the photosensitive layer 7*a* on the layer consisting of the composition 35 for forming an insulating magnetic layer or the insulating magnetic layer 30 on a side opposite to the substrate 10, a step h4 of forming the resist film 8*a* including the opening portion H1 in at least a part other than on the conductor wiring 20 by exposing the photosensitive layer 7*a* in a predetermined pattern and developing the exposed photosensitive layer, and a step h5 of removing the portion positioned between the substrate 10 and the opening portion H1 of the resist film 8*a* in the layer consisting of the composition 35 for forming an insulating magnetic layer or the insulating magnetic layer 30. The step f2 may further include a step h6 of removing the resist film 8*a*. Hereinafter, the steps h1 to h6 will be described.

Step h1

In the step h1, by forming the layer consisting of the composition 35 for forming an insulating magnetic layer on the region of the substrate 50 with wiring in which the conductor wiring 20 is formed (on the substrate 10 and on the conductor wiring 20) to fill the gap between the conductor wirings 20 and 20 adjacent to each other, the top surface S1 and the pair of lateral surfaces S3*a* and S3*b* of the conductor wiring 20 are covered with the composition 35 for forming an insulating magnetic layer (refer to FIG. 14(*a*)).

Specifically, the step h1 may be a step of applying the composition 35 for forming an insulating magnetic layer to the region described above, or may be a step of laminating a sheet (for example, a film-shaped sheet) consisting of the composition 35 for forming an insulating magnetic layer on the region described above. The layer consisting of the composition 35 for forming an insulating magnetic layer may be formed to cover a part of the region of the substrate 50 with wiring in which the conductor wiring 20 is formed, or may be formed to cover the entire region of the substrate 50 with wiring in which the conductor wiring 20 is formed (for example, the entire surface of the substrate 50 with wiring).

A coating method of the composition 35 for forming an insulating magnetic layer is not particularly limited, and examples thereof include a coating method using screen printing, transfer printing, offset printing, a jet printing method, a dispenser, a jet dispenser, a needle dispenser, a comma coater, a slit coater, a die coater, a gravure coater, slit coating, anastatic printing, intaglio printing, gravure printing, stencil printing, soft lithography, bar coating, an applicator, a particle deposition method, a spray coater, a spin coater, a dip coater, and the like.

The sheet consisting of the composition 35 for forming an insulating magnetic layer, for example, can be formed by applying the composition 35 for forming an insulating magnetic layer onto a support film in accordance with the coating method described above. A laminating method of the sheet consisting of the composition 35 for forming an insulating magnetic layer is not particularly limited, and a roll laminator, a diaphragm laminator, a vacuum roll laminator, a vacuum diaphragm laminator, and the like can be adopted.

Step h2

In the step h2, the layer consisting of the composition 35 for forming an insulating magnetic layer is cured to form the insulating magnetic layer 30 (refer to FIG. 14(*b*)). The curing of the layer consisting of the composition 35 for forming an insulating magnetic layer can be implemented as with the curing of the composition for forming an insulating magnetic layer in the step b2 of the fifth embodiment.

In FIG. 14, the step h2 is implemented before the step h3, and the step h2 may be implemented after the step h3. The step h2, for example, may be implemented after the step h5. In a case where the step h2 is implemented after the step h3, the step h3 is a step of forming the photosensitive layer 7*a* on the layer consisting of the composition 35 for forming an insulating magnetic layer on a side opposite to the substrate 10, and in a case where the step h2 is implemented before the step h3, the step h3 is a step of forming the photosensitive layer 7*a* on the insulating magnetic layer 30 on a side opposite to the substrate 10. Similarly, in a case where the step h2 is implemented after the step h5, the step h5 is a step of removing a portion positioned between the substrate 10 and an opening portion H4 of the resist film 8*a* in the layer consisting of the composition 35 for forming an insulating magnetic layer, and in a case where the step h2 is implemented before the step h5, the step h5 is a step of removing the portion positioned between the substrate 10 and the opening portion H4 of the resist film 8*a* in the insulating magnetic layer 30.

Step h3

In the step h3, the photosensitive layer 7*a* is formed on the insulating magnetic layer 30 on a side opposite to the substrate 10 (refer to FIG. 14(*b*)).

The photosensitive layer 7*a* is a layer having photosensitivity. The photosensitive layer 7*a*, for example, may consist of a photosensitive resin composition containing a binder polymer, a photopolymerizable compound, and a photopolymerization initiator. The photosensitive layer 7*a* illustrated in FIG. 14 is a negative photosensitive layer, but may be a positive photosensitive layer.

The photosensitive layer 7*a* can be formed by applying the photosensitive resin composition or laminating a sheet (for example, a film-shaped sheet) consisting of the photosensitive resin composition onto the insulating magnetic layer 30 on a side opposite to the substrate 10. As a coating method of the photosensitive resin composition and a laminating method of the sheet consisting of the photosensitive resin composition, the coating method of the composition for forming an insulating magnetic layer and the laminating method of the sheet consisting of the composition for forming an insulating magnetic layer described above can be adopted.

The thickness of the photosensitive layer 7*a*, for example, is 10 to 100 μm.

Step h4

In the step h4, the photosensitive layer 7*a* is exposed in the predetermined pattern and developed to form the resist film including the opening portion H4 in at least a part of a portion other than on the conductor wiring 20 (refer to FIG. 14(*c*)).

Specifically, first, the photosensitive layer 7*a* is exposed in the predetermined pattern via a predetermined mask pattern. Examples of an active light ray used in the exposure include a light ray using a g-line stepper as a light source; an ultraviolet ray using a low-pressure mercury lamp, a high-pressure mercury lamp, a metal halide lamp, an i-line stepper, and the like as a light source; an electron beam; and a laser light ray. An exposure amount is suitably selected in accordance with a light source to be used, the thickness of the photosensitive layer 7*a*, and the like.

Next, the photosensitive layer 7*a* after exposure is developed by a developer. As illustrated in FIG. 14, in a case where the photosensitive layer 7*a* is a negative photosensitive layer, an exposed portion is cured by exposure, and an unexposed portion is removed by development. Accordingly, the resist film 8*a* including the opening portion H4 with a shape corresponding to the removed unexposed portion is formed. In a case where the photosensitive layer 7*a* is a positive photosensitive layer, since the exposed portion is soluble in the developer by the exposure, the exposed portion is removed by development, and the resist film including the opening portion with a shape corresponding to the removed exposed portion is formed.

The developer, for example, is an alkaline developer, and an aqueous alkaline solution in which an alkaline compound such as sodium hydroxide, potassium hydroxide, tetramethyl ammonium hydroxide, and choline is dissolved in water such that the concentration is approximately 1 to 10% by mass, an aqueous alkaline solution such as ammonia water, and the like can be used. Examples of a developing method include a shower developing method, a spray developing method, an immersion developing method, and a paddle developing method.

Step h5

In the step h5, the portion positioned between the substrate 10 and the opening portion H4 of the resist film 8*a* in the insulating magnetic layer 30 is removed (refer to FIG. 15(*d*).).

Specifically, wet etching is performed by using a known etchant such as a cupric chloride solution and a ferric chloride solution. Accordingly, the portion positioned between the substrate 10 and the opening portion H4 of the resist film 8*a* (a portion that is not protected with the resist film) in the insulating magnetic layer 30 is removed.

Step h6

In the step h6, the resist film 8*a* is removed (refer to FIG. 15(*e*)). The resist film 8*a*, for example, can be removed by using an aqueous alkaline solution stronger than the alkaline developer used for the development in the step h4. Examples of a removing method of the resist film 8*a* include an immersion method, and a spray method.

According to the operation described above, a wiring substrate 110B illustrated in FIG. 15(*d*) and a wiring substrate 110 illustrated in FIG. 15(*e*) are obtained. The details of the wiring substrates 110B and 110 are the same as those of the wiring substrate 110A obtained in the fifth embodiment, except that the insulating magnetic layers 30 on the top surface S1 side, the lateral surface S3*a* side, and the lateral surface S3*b* side of the conductor wiring 20 are each formed with a uniform covering thickness. In the top surface S1 side, the bottom surface S2 side, and the lateral surface S3*a* side and the lateral surface S3*b* side of the conductor wiring 20, the covering thickness of the insulating magnetic layer 30 may be the same, or may be different.

In FIG. 15, the insulating magnetic layer 30 is formed to cover the top surface S1 and the pair of lateral surfaces S3*a* and S3*b* of the conductor wiring 20, and the top surface S1 may be covered with the insulating magnetic layer 30, but one or both of the pair of lateral surfaces S3*a* and S3*b* may not be covered with the insulating magnetic layer 30. In addition, one or both of the pair of lateral surfaces S3*a* and S3*b* may be covered with the insulating magnetic layer 30, but the top surface S1 may not be covered with the insulating magnetic layer 30. For example, in the step h4, the resist film 8*a* may be formed such that the entire portion other than on the conductor wiring 20 is the opening portion H4. In this case, in the step h5, since the insulating magnetic layer 30 positioned between the conductor wirings 20 and 20 adjacent to each other is removed, the insulating magnetic layer 30 covering the pair of lateral surfaces S3*a* and S3*b* is not formed. By changing the size and the shape of the opening portion H4, while forming the insulating magnetic layer 30 covering one of the pair of lateral surfaces S3*a* and S3*b*, it is also possible not to form the insulating magnetic layer 30 covering the other one. In addition, for example, the step f2 may further include a step of removing the insulating magnetic layer 30 covering the top surface S1 of the conductor wiring 20 by grinding or polishing after the step h2. Such a step may be implemented after the step h6. According to such a method, the insulating magnetic layer 30 covering the top surface S1 of the conductor wiring 20 is not formed. A grinding method and a polishing method are not particularly limited, and for example, may be grinding according to a fly cutting method, polishing according to chemical mechanical polishing (CMP), and the like. In the fly cutting method, a grinding device with a diamond bite can be used, and for example, an automatic surface planer compatible with a wafer of 300 mm (Product Name "DAS8930", manufactured by DISCO Corporation) can be used.

Seventh Embodiment and Eighth Embodiment

A method for manufacturing a wiring substrate of a seventh embodiment and an eighth embodiment includes a step (I) of forming an insulating material layer on a substrate, a step (II) of forming an opening portion opening in the insulating material layer on a side opposite to the substrate, a step (III) of forming an insulating magnetic layer on at least the inner surface of the opening portion, and a step (IV) of forming conductor wiring on the insulating magnetic layer.

In the method for manufacturing a wiring substrate of the seventh embodiment and the eighth embodiment, the step (III) described above is a step of forming the insulating magnetic layer on the inner surface of the opening portion and on the surface of the insulating material layer other than the opening portion, and the step (IV) described above includes a step of producing a laminate in which a conductor layer is formed on the insulating magnetic layer, and a step of forming the conductor wiring by removing a part of the laminate on a side opposite to the substrate.

Seventh Embodiment

Figure 16:
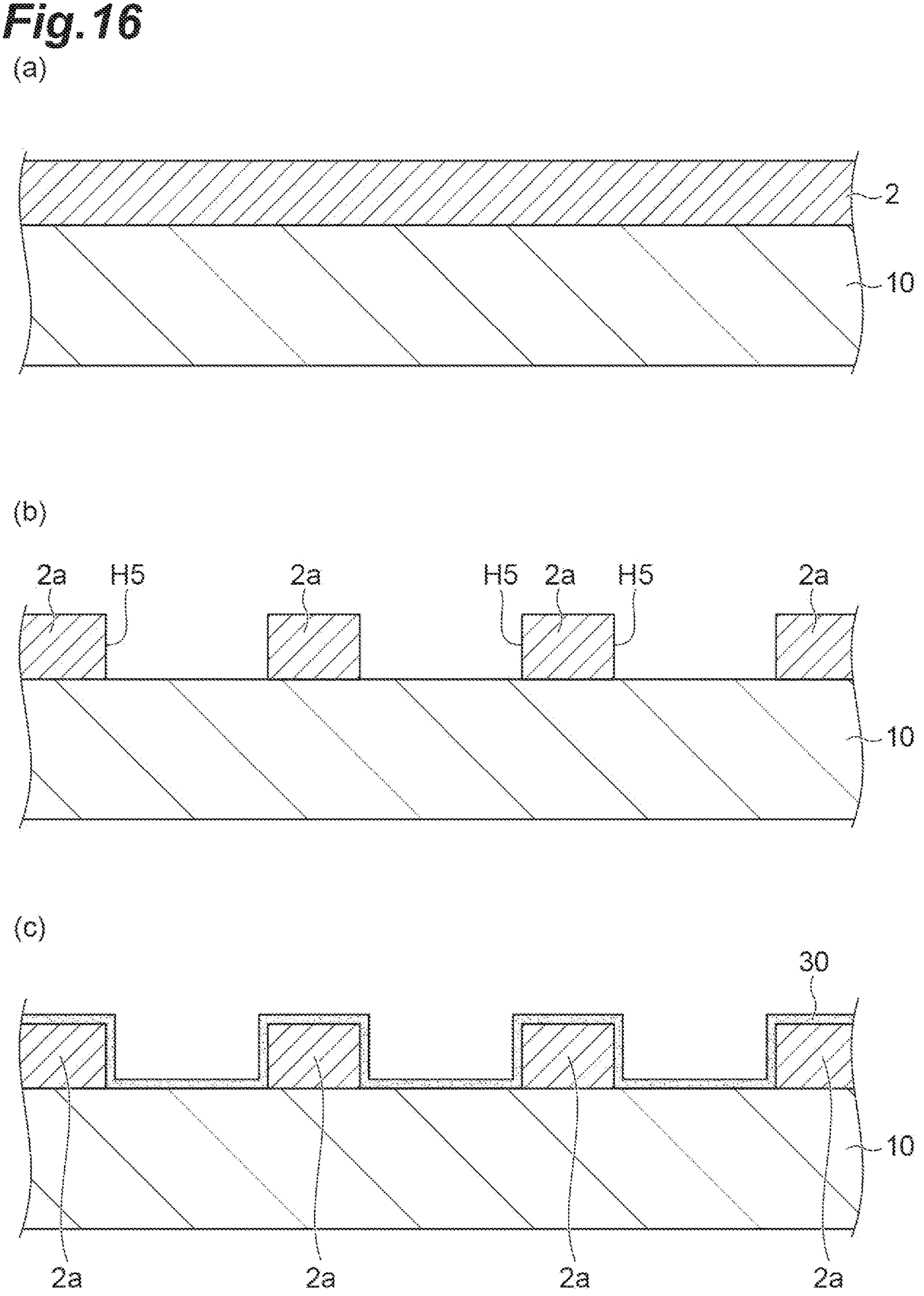
FIG. 16 is a schematic sectional view illustrating a seventh embodiment of the method for manufacturing a wiring substrate.
Figure 17:
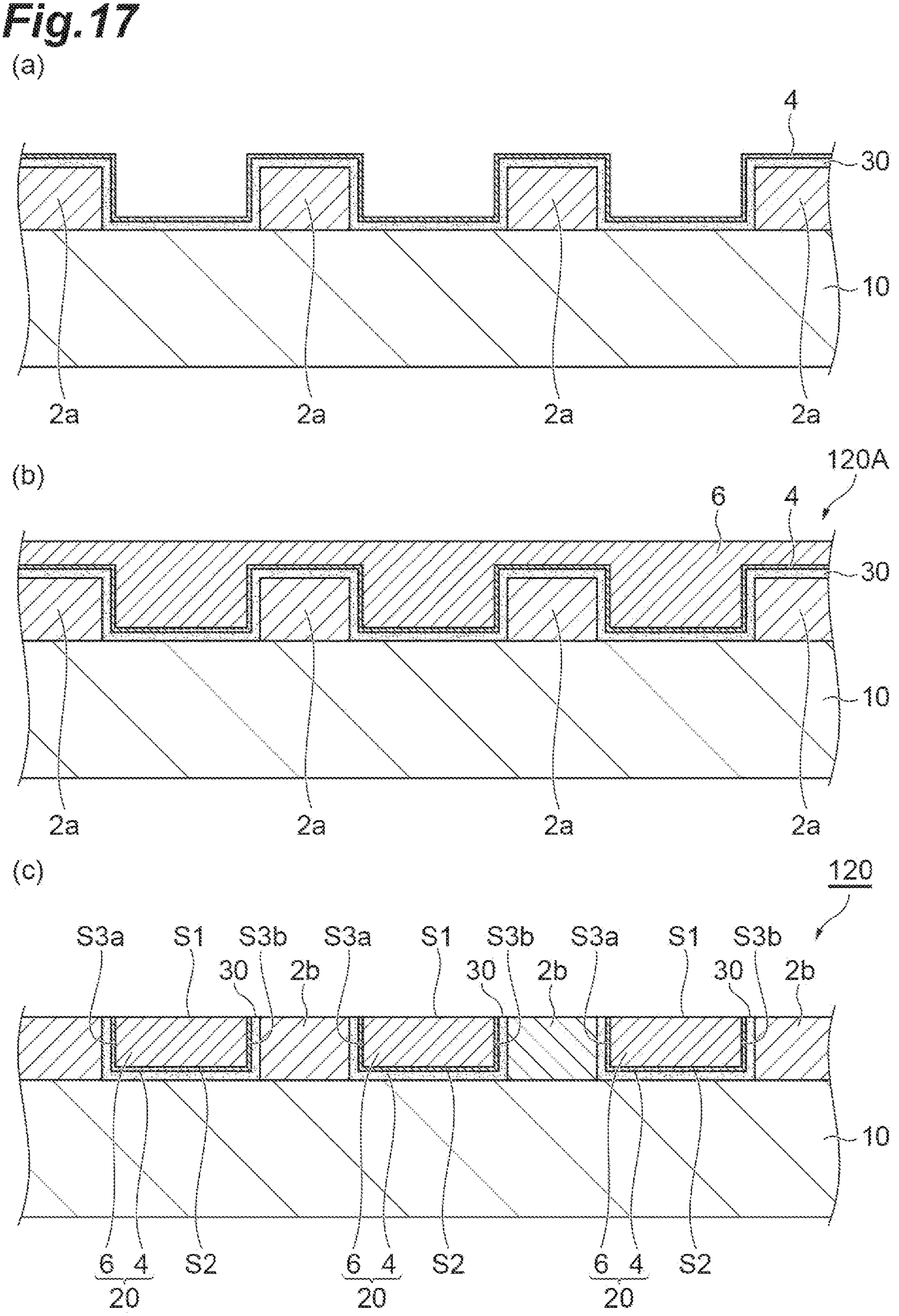
FIG. 17 is a schematic sectional view illustrating the seventh embodiment of the method for manufacturing a wiring substrate, following FIG. 16.

FIG. 16 and FIG. 17 are schematic sectional views for describing the seventh embodiment of the method for manufacturing a wiring substrate. The method for manufacturing a wiring substrate of the seventh embodiment includes the step (I) of forming the insulating material layer 2 on the substrate 10, a step (II-1) of forming an opening portion H5 leading to the substrate 10 in the insulating material layer 2, a step (III-1) of forming the insulating magnetic layer 30 on the surface of the substrate 10 in the opening portion H5 and on the surface of an insulating material layer 2*a* including the opening portion, and the step (IV) of forming the conductor wiring 20 on the insulating magnetic layer 30.

In the seventh embodiment, the step (IV) may include a step (IV-1) of producing a laminate 120A in which a conductor layer 6 is formed on the insulating magnetic layer 30, and a step (IV-2) of removing a part of the laminate 120A on a side opposite to the substrate 10.

Further, the step (IV-1) may include a step (IV-1*a*) of forming the plating seed layer 4 on the surface of the insulating magnetic layer 30, and a step (IV-1*b*) of filling at least the opening portion H5 with a conductive material by electrolytic plating.

[Step (I)]

In the step (I), the insulating material layer 2 is formed on the substrate 10 (refer to FIG. 16(*a*)). As the substrate 10, the substrate described above can be used.

In the step (I), it is preferable to adopt a photosensitive resin material as a material configuring the insulating material layer 2, from the viewpoint of easily forming a fine opening portion H5 or opening portion H6 by a photolithography process in the step (II-1) or a step (II-2) described below.

Examples of a photosensitive insulating material include a liquid or film-shaped photosensitive insulating material, and from the viewpoint of film thickness flatness and the cost, the film-shaped photosensitive insulating material is preferable. In addition, from the viewpoint of forming fine wiring, the photosensitive insulating material may contain a filler (a filling material) having an average particle diameter of 500 nm or less (more preferably 50 to 200 nm). The content of the filler in the photosensitive insulating material may be 0 to 70 parts by mass, or may be 10 to 50 parts by mass, with respect to 100 parts by mass of the mass of the photosensitive insulating material excluding the filler.

In the case of using the film-shaped photosensitive insulating material, it is preferable that a laminating step thereof is implemented at a maximally low temperature, and from the viewpoint of handleability and a decrease in warpage after laminating, a photosensitive insulating film that can be laminated at 40° C. to 120° C. can be adopted.

The coefficient of thermal expansion of the insulating material layer 2 after curing may be $80\times10^{-6}$/K or less from the viewpoint of suppressing the warpage, and may be $70\times10^{-6}$/K or less from the viewpoint of obtaining high reliability. In addition, the coefficient of thermal expansion may be $20\times10^{-6}$/K or more from the viewpoint of obtaining the stress relaxation properties of the insulating material and a high-definition pattern.

The thickness of the insulating material layer 2 can be suitably set in accordance with the thickness of the conductor wiring to be formed, and for example, may be 30 μm or less, 20 μm or less, 10 μm or less, 5 μm or less, or 3 μm or less. The thickness of the insulating material layer 2 may be 1 μm or more from the viewpoint of the insulating reliability.

[Step (II-1)]

In the step (II-1), the opening portion H5 leading to the substrate 10 is formed in the insulating material layer 2. Accordingly, the insulating material layer 2*a* including the opening portion H5 is formed on the substrate 10 (refer to FIG. 16(*b*)). Note that, the opening portion H5 indicates a recessed part that is opened in a thickness direction of the insulating material layer 2 with respect to the surface of the insulating material layer 2 and extends to the surface of the substrate 10, and includes the inner wall (the lateral surface, the bottom surface, and the like) of the opening part. The opening portion H5 can also be referred to as a groove. As illustrated in FIG. 16(*b*), it is preferable that the opening portion H5 can be formed to extend to the surface of the substrate 10, that is, the opening portion H5 is composed of lateral surfaces consisting of the insulating material layer 2*a*, and a bottom surface consisting of the surface of the substrate 10. The opening shape of the opening portion H5 can be set in accordance with the pattern of the conductor wiring to be formed.

Examples of a forming method of the opening portion H5 include laser ablation, photolithography, and imprint. Among such methods, from the viewpoint of refinement and the cost, it is preferable that in the step (I), the insulating material layer 2 consisting of the photosensitive resin material is formed, and the opening portion H5 is formed by the photolithography process (exposure and development). As an exposing method of the photosensitive resin material, general projection exposing method, contact exposing method, direct-writing exposing method, and the like can be used, and as a developing method, it is preferable to use an aqueous alkaline solution of sodium carbonate or tetramethyl ammonium hydroxide (TMAH). The opening portion H5 may be formed in the insulating material layer 2, and then, the insulating material may be further heated and cured. A heating temperature is 100° C. to 200° C., and a heating time is 30 minutes to 3 hours. In addition, in a case where there is the residue of the insulating material layer 2 on the opened surface, the residue can be removed by an oxygen plasma treatment, an argon plasma treatment, and a nitrogen plasma treatment.

[Step (III-1)]

In the step (III-1), the insulating magnetic layer 30 is formed on the surface of the substrate 10 in the opening portion H5 and on the surface of the insulating material layer 2*a* including the opening portion. The insulating magnetic layer 30 consists of an insulator containing a magnetic material. The magnetic material may be dispersed in the insulating magnetic layer 30. Note that, in the step (III-1), the surface of the substrate 10 in the opening portion H5 and the lateral surface of the insulating material layer 2*a* are the inner surface of the opening portion H5.

The insulating magnetic layer 30 can be formed of the composition for forming an insulating magnetic layer described above. Specifically, for example, a method for forming a layer consisting of the composition for forming an insulating magnetic layer by applying the composition for forming an insulating magnetic layer containing the magnetic material or laminating a sheet (for example, a film-shaped sheet) consisting of the composition for forming an insulating magnetic layer containing the magnetic material onto the surface of the substrate 10 in the opening portion H5 and onto the surface of the insulating material layer 2*a* including the opening portion, and curing the layer is exemplified.

A coating method of the composition for forming an insulating magnetic layer is not particularly limited, and examples thereof include a coating method using screen printing, transfer printing, offset printing, a jet printing method, a dispenser, a jet dispenser, a needle dispenser, a comma coater, a slit coater, a die coater, a gravure coater, slit coating, anastatic printing, intaglio printing, gravure printing, stencil printing, soft lithography, bar coating, an applicator, a particle deposition method, a spray coater, a spin coater, a dip coater, and the like.

The sheet consisting of the composition for forming an insulating magnetic layer, for example, can be formed by applying the composition for forming an insulating magnetic layer onto a support film in accordance with the coating method described above. A laminating method of the sheet consisting of the composition for forming an insulating magnetic layer is not particularly limited, and a roll laminator, a diaphragm laminator, a vacuum roll laminator, a vacuum diaphragm laminator, and the like can be adopted.

The composition for forming an insulating magnetic layer can be cured, for example, by heating. The curing of the composition for forming an insulating magnetic layer may be the curing of the composition for forming an insulating magnetic layer by drying, or may be the thermal curing of the composition for forming an insulating magnetic layer in a case where the composition for forming an insulating magnetic layer contains a thermosetting resin. A heating temperature and a heating time may be suitably adjusted in accordance with the type of solvent, the type of thermosetting resin, or the like contained in the composition for forming an insulating magnetic layer.

From the viewpoint of ease of the signal propagation, the covering thickness of the insulating magnetic layer 30 may be 0.1 to 100 μm, may be 0.2 to 30 μm, or may be 0.5 to 10 μm.

From the viewpoint of suppressing the transmission loss, the relative magnetic permeability of the insulating magnetic layer 30 may be 2 to 1000, may be 10 to 1000, or may be 20 to 1000.

From the viewpoint of suppressing the transmission loss, the relative permittivity of the insulating magnetic layer 30 may be 1 to 30, may be 1 to 20, or may be 1 to 10.

[Step (IV-1)]

In the step (IV-1), the laminate 120A in which the conductor layer 6 is formed on the insulating magnetic layer 30 can be produced by the step (IV-1*a*) and the step (IV-1*b*) (refer to FIG. 17(*b*)).

[Step (IV-1*a*)]

In the step (IV-1*a*), the plating seed layer 4 is formed on the surface of the insulating magnetic layer 30 (refer to FIG. 17(*a*)). The plating seed layer 4 is a power supply layer for electrolytic plating that is implemented in the step (IV-1*b*). The plating seed layer 4, for example, can be formed by electroless plating or sputtering. A conductor (for example, a metal) configuring the plating seed layer 4 may be the same conductor as the conductor (for example, a metal) configuring the conductor wiring 20. The thickness of the plating seed layer 4, for example, may be 0.001 to 5 μm.

[Step (IV-1*b*)]

In the step (IV-1*b*), subsequent to the step (IV-1*a*), at least the opening portion H5 is filled with the conductive material by electrolytic plating.

Specifically, for example, electrolytic copper plating can be implemented by using the plating seed layer 4 as a power supply layer. Accordingly, the opening portion H5 is filled with the conductive material (for example, a copper-containing material), and the conductor layer 6 is further formed to cover the top surface of the insulating material layer 2*a* (refer to FIG. 17(*b*)).

In the seventh embodiment, a step (PreIV-1*a*) of modifying the surface of the insulating magnetic layer 30 before providing the plating seed layer may be provided.

[Step (PreIV-1*a*)]

In the step (PreIV-1*a*), the surface of the insulating magnetic layer 30 can be modified. By roughening the surface of the insulating magnetic layer 30 to a nano-level with modification, it is possible to make excellent adhesiveness between the insulating magnetic layer 30 and the plating seed layer 4 and excellent formability of the conductor wiring to be formed thereafter compatible. Examples of a modifying method include a method such as ultraviolet ray irradiation, electron beam irradiation, an ozonized water treatment, a corona discharge treatment, and a plasma treatment. Among such methods, the ultraviolet ray irradiation that does not require a vacuum facility and does not generate an effluent or the like is preferable. Examples of a lamp of the ultraviolet ray irradiation used for the modification include a high-pressure mercury lamp, a low-pressure mercury lamp, and a vacuum ultraviolet excimer lamp, and the low-pressure mercury lamp or the excimer lamp with a large activation effect is preferable.

The modification may be performed in the atmosphere, or may be performed in an oxygen atmosphere. The temperature condition of the modification is 25° C. to 100° C., and may be 40° C. to 100° C., or 60° C. to 100° C., from the viewpoint of further accelerating reactivity. The contact angle of the surface of the insulating magnetic layer 30 after modification with pure water may be 40 degrees or less, 20 degrees or less, or 10 degrees or less. In addition, a modification treatment may be repeated a plurality of times.

In the step (IV-1), for example, in a case where the conductor layer is formed on the insulating magnetic layer by electroless plating or sputtering, the formation of the plating seed layer 4 can be omitted.

[Step (IV-2)]

In the step (IV-2), a part of the laminate 120A on a side opposite to the substrate 10 is removed. Accordingly, the conductor wiring 20 is formed on the insulating magnetic layer 30 (refer to FIG. 17(*c*)). For example, a part of the plating seed layer and the conductor layer, a part of the insulating magnetic layer, and a part of the insulating material layer can be removed such that the insulating material layer, the insulating magnetic layer, and the conductor layer are flattened on the surface on a side opposite to the substrate.

Examples of a method for removing a part of the laminate on a side opposite to the substrate include a method for grinding or polishing the surface of the laminate on a side opposite to the substrate. A grinding method and a polishing method are not particularly limited, and for example, may be grinding according to a fly cutting method, polishing according to chemical mechanical polishing (CMP), etching, and the like. Such methods can also be applied in combination.

As CMP, for example, a known method using a slurry containing abrasive grains and a liquid medium can be used. In the fly cutting method, a grinding device with a diamond bite can be used, and for example, an automatic surface planer compatible with a wafer of 300 mm (Product Name "DAS8930", manufactured by DISCO Corporation) can be used.

According to the operation described above, a wiring substrate 120 illustrated in FIG. 17(*c*) is obtained. The wiring substrate 120 includes the substrate 10, the conductor wiring 20 provided on the substrate 10, which includes the bottom surface S2 positioned on the substrate 10 side, the top surface S1 positioned on a side opposite to the substrate 10, and the pair of lateral surfaces S3*a* and S3*b* positioned between the bottom surface S2 and the top surface S1, and the insulating magnetic layer 30 covering the bottom surface S2 and the pair of lateral surfaces S3*a* and S3*b* of the conductor wiring 20.

Eighth Embodiment

Figure 18:
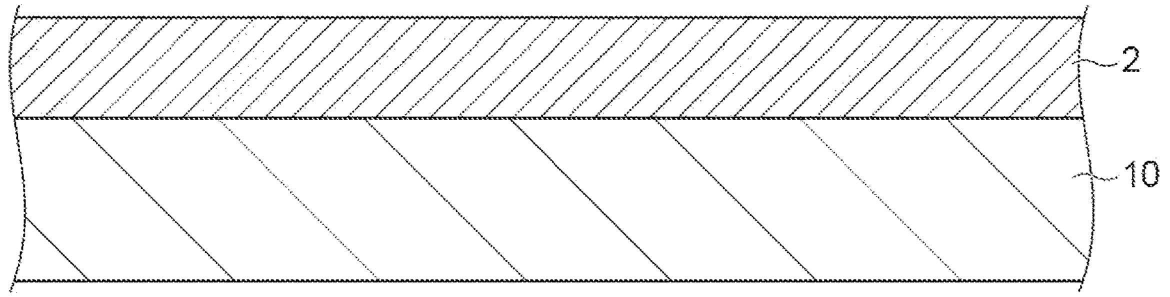
FIG. 18 is a schematic sectional view illustrating an eighth embodiment of the method for manufacturing a wiring substrate.
Figure 18:
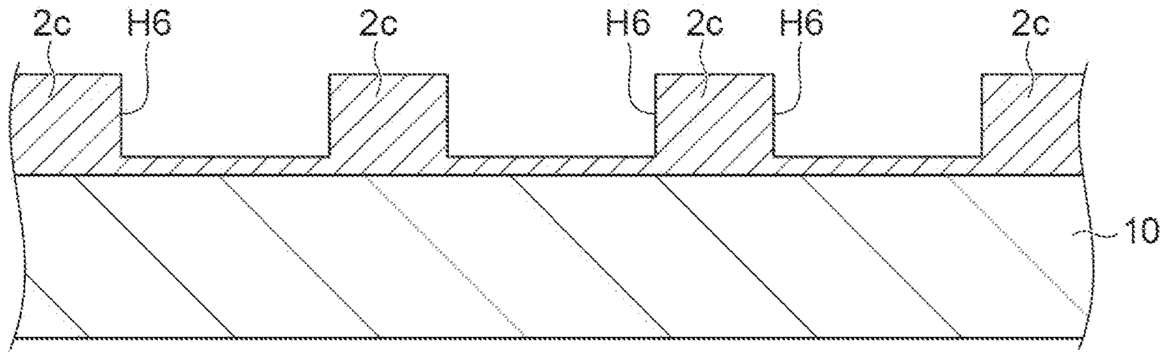
Figure 18:
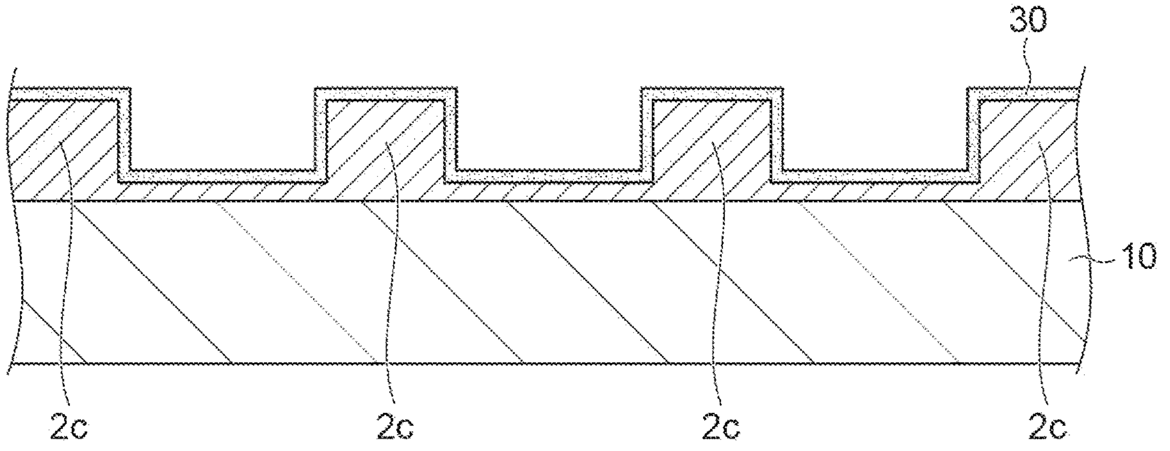
Figure 19:
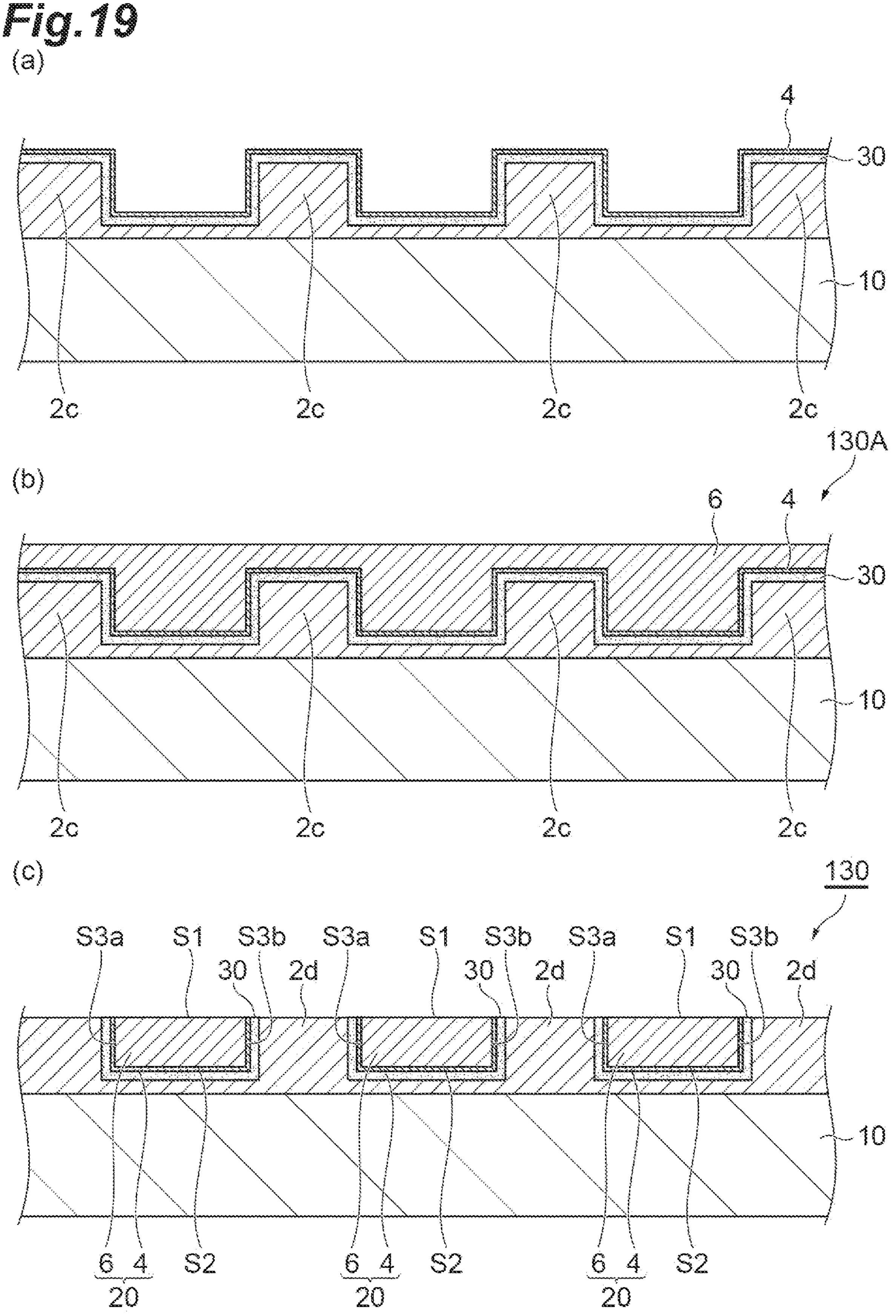
FIG. 19 is a schematic sectional view illustrating the eighth embodiment of the method for manufacturing a wiring substrate, following FIG. 18.

FIG. 18 and FIG. 19 are schematic sectional views for describing the eighth embodiment of the method for manufacturing a wiring substrate. The method for manufacturing a wiring substrate of the eighth embodiment includes the step (I) of forming the insulating material layer 2 on the substrate 10, a step (II-2) of forming the opening portion H2 that is opened in the insulating material layer 2 on a side opposite to the substrate 10 and includes a bottom surface, a step (III-2) of forming the insulating magnetic layer 30 on the inner surface of the opening portion H6 and on the surface of the insulating material layer 2*c* other than the opening portion, and the step (IV) of forming the conductor wiring 20 on the insulating magnetic layer 30.

In the eighth embodiment, the step (IV) may include a step (IV-3) of producing a laminate 130A in which the conductor layer 6 is formed on the insulating magnetic layer 30, and a step (IV-4) of removing a part of the surface of the laminate 130A on a side opposite to the substrate.

Further, the step (IV-3) may include a step (IV-3*a*) of forming the plating seed layer 4 on the surface of the insulating magnetic layer 30, and a step (IV-3*b*) of filling at least the opening portion H6 with a conductive material by electrolytic plating.

The step (I) in the eighth embodiment is the same as the step (I) in the seventh embodiment (refer to FIG. 18(*a*)).

[Step (II-2)]

In the step (II-2), the opening portion H6 that is opened on a side opposite to the substrate 10 and includes the bottom surface is formed in the insulating material layer 2. Accordingly, the insulating material layer 2*c* including the opening portion H6 is formed on the substrate 10 (refer to FIG. 18(*b*)). Note that, the opening portion H6 indicates a recessed part that is opened in a thickness direction of the insulating material layer 2 with respect to the surface of the insulating material layer 2 and includes the bottom surface, and includes the inner wall (the lateral surface, the bottom surface, and the like) of the opening part. The opening portion H6 can also be referred to as a groove. The opening shape of the opening portion H6 can be set in accordance with the pattern of the conductor wiring to be formed.

Examples of a forming method of the opening portion H6 include laser ablation, photolithography, and imprint.

[Step (III-2)]

In the step (III-2), the insulating magnetic layer 30 is formed on the inner surface of the opening portion H6 and on the surface of the insulating material layer 2*c* other than the opening portion (refer to FIG. 18(*c*)). The insulating magnetic layer 30 can be formed as with the step (III-1).

[Step (IV-3)]

In the step (IV-3), the laminate 130A in which the conductor layer 6 is formed on the insulating magnetic layer 30 can be produced by the step (IV-3*a*) and the step (IV-3*b*) (refer to FIG. 19(*b*)).

[Step (IV-3*a*)]

In the step (IV-3*a*), the plating seed layer 4 is formed on the surface of the insulating magnetic layer 30 (refer to FIG. 19(*a*)). The plating seed layer 4 can be formed as with the step (IV-1*a*).

[Step (IV-3*b*)]

In the step (IV-3*b*), subsequent to the step (IV-3*a*), at least the opening portion H6 is filled with the conductive material by electrolytic plating. Specifically, for example, electrolytic copper plating can be implemented by using the plating seed layer 4 as a power supply layer. Accordingly, the opening portion H6 is filled with the conductive material (for example, a copper-containing material), and the conductor layer 6 is further formed to cover the top surface of the insulating material layer 2*c* (refer to FIG. 19(*b*)).

In the eighth embodiment, a step (PreIV-3*a*) of modifying the surface of the insulating magnetic layer 30 before providing the plating seed layer may be provided. The surface of the insulating magnetic layer 30 can be modified as with the step (PreIV-1*a*).

In the step (IV-3), for example, in a case where the conductor layer is formed on the insulating magnetic layer by electroless plating or sputtering, the formation of the plating seed layer 4 can be omitted.

[Step (IV-4)]

In the step (IV-4), a part of the laminate 130A on a side opposite to the substrate 10 is removed. Accordingly, the conductor wiring 20 is formed on the insulating magnetic layer 30 (refer to FIG. 19(*c*)). For example, a part of the plating seed layer and the conductor layer, a part of the insulating magnetic layer, and a part of the insulating material layer can be removed such that the insulating material layer, the insulating magnetic layer, and the conductor layer are flattened on the surface on a side opposite to the substrate.

A method for removing a part of the laminate on a side opposite to the substrate can be the same as that in the step (IV-2).

According to the operation described above, a wiring substrate 130 illustrated in FIG. 19(*c*) is obtained. The wiring substrate 130 includes the substrate 10, the conductor wiring 20 provided on the substrate 10, which includes the bottom surface S2 positioned on the substrate 10 side, the top surface S1 positioned on a side opposite to the substrate 10, and the pair of lateral surfaces S3*a* and S3*b* positioned between the bottom surface S2 and the top surface S1, and the insulating magnetic layer 30 covering the bottom surface S2 and the pair of lateral surfaces S3*a* and S3*b* of the conductor wiring 20.

EXAMPLES

Hereinafter, the present invention will be described in more detail by Examples, but the present invention is not limited to Examples.

<Preparation of Composition for Forming Insulating Magnetic Layer>

All raw materials in an ointment container, which were compounded at a composition shown in Table 1, were stirred and mixed with a rotation/revolution stirrer ("ARE-500", manufactured by THINKY CORPORATION) to obtain a binder resin varnish I. Note that, in a stirring and mixing step, first, the orbital speed of the rotation/revolution stirrer was maintained at 2000 rpm, and stirring and mixing was performed for 300 seconds. Next, the revolution of the rotation/revolution stirrer was stopped, a mixture in the container was stirred with a dispensing spoon, and then, the orbital speed of the rotation/revolution stirrer was maintained again at 2000 rpm, and stirring and mixing was performed for 120 seconds.

TABLE 1

| Raw material | | Compounded amount (parts by mass) |
|---|---|---|
| Thermosetting resin | YDF-8170C | 40 |
| Curing agent | jERCURE WA | 11 |
| Curing accelerator | 2E4MZ | 0.15 |
| Thermoplastic resin | TEISANRESIN HTR-860-P3 Cyclohexanone solution | 30 (Solid content of 12%) |
| Additive | KBM-573 | 0.22 |
| | Cyclohexanone | 20 |

The details of each component shown in Table 1 are as follows.

YDF-8170C: Product Name, manufactured by NIPPON STEEL Chemical & Material Co., Ltd., a bisphenol F-type epoxy resin jERCURE WA ("jERCURE" is Registered Trademark): Product Name, manufactured by Mitsubishi Chemical Corporation, an amine-based epoxy resin curing agent 2E4MZ: a curing accelerator, manufactured by SHIKOKU CHEMICALS CORPORATION, 2-ethyl-4-methyl imidazole TEISANRESIN HTR-860-P3: Product Name, manufactured by Nagase ChemteX Corporation, an acrylic resin (a cyclohexane solution)

KBM-573: Product Name, manufactured by Shin-Etsu Chemical Co., Ltd., N-phenyl-3-aminopropyl trimethoxy silane 8.5 parts by mass of the binder resin varnish I, and 73 parts by mass of a magnetic powder (SAP-2D(C): manufactured by SINTOKOGIO, LTD.) were weighed and put in 50 ml of an ointment container. The binder resin varnish I and the magnetic powder in the ointment container were stirred with a rotation/revolution stirrer at an orbital speed of 2000 rpm for 45 seconds. Next, the revolution of the rotation/revolution stirrer was stopped, a mixture in the container was stirred with a dispensing spoon, and then, stirring was performed two times at the orbital speed of the rotation/revolution stirrer of 2000 rpm for 45 seconds.

Accordingly, a paste-shaped composition for forming an insulating magnetic layer was obtained.

<Production of Wiring Substrate>

Comparative Example 1

A prepreg (Product Name: GEA-705G, manufactured by Showa Denko Materials Co., Ltd., Thickness: 25 μm), which is a substrate, was pasted to a copper foil (Thickness: 30 μm) to obtain a laminate A (Substrate/Copper Foil).

Next, a negative photosensitive resin composition solution (Product Name: PMER P-LA900PM, manufactured by TOKYO OHKA KOGYO CO., LTD.) was applied onto the laminate A on the copper foil side to form a photosensitive layer (Thickness: 50 μm). Next, the photosensitive layer was pattern-exposed and developed such that an exposed portion became a wiring pattern with a width of 190 μm. As a developer, a PMER developer P-7G (manufactured by TOKYO OHKA KOGYO CO., LTD.) was used. Accordingly, a resist film including an opening portion was formed on the copper foil. The resist film has a wiring pattern with a width of 190 μm in a portion other than the opening portion.

Next, in the copper foil of the laminate A, a portion positioned between the opening portion of the resist film and the substrate of the laminate A was removed by using CPE-700 (Product Name, manufactured by MITSUBISHI GAS CHEMICAL COMPANY, INC.), and then, the resist film was removed by using methyl ethyl ketone. As described above, a wiring substrate including the substrate, and the conductor wiring (Thickness: 30 μm, Width: 190 μm) provided on the substrate was obtained.

Example 1

The composition for forming an insulating magnetic layer obtained as described above was applied to the surface of a PET film with a bar coater to form a sheet consisting of the composition for forming an insulating magnetic layer on the PET film. By laminating the obtained sheet on a region of the wiring substrate obtained in Comparative Example 1 in which the conductor wiring was formed, a layer consisting of the composition for forming an insulating magnetic layer was formed on the region to cover the top surface and a pair of lateral surfaces of the conductor wiring.

Next, the composition for forming an insulating magnetic layer was cured to form an insulating magnetic layer (Thickness: 5 μm), and then, as with Comparative Example 1, a photosensitive layer was formed on the insulating magnetic layer on a side opposite to the substrate. Next, a portion of the photosensitive layer, which was positioned on the conductor wiring, was exposed and developed. As a developer, a PMER developer P-7G (manufactured by TOKYO OHKA KOGYO CO., LTD.) was used. Accordingly, a resist film including an opening portion in a portion other than the portion positioned on the conductor wiring was formed.

Next, in the insulating magnetic layer covering the conductor wiring, a portion positioned between the opening portion of the resist film and the substrate was removed by using CPE-700 (Product Name, manufactured by MITSUBISHI GAS CHEMICAL COMPANY, INC.), and then, the resist film was removed by using methyl ethyl ketone. As described above, a wiring substrate including the substrate, the conductor wiring (Thickness: 30 μm, Width: 190 μm) provided on the substrate, the insulating magnetic layer with a thickness of 5 μm, covering the top surface of the conductor wiring, was obtained. The obtained wiring substrate has the same configuration as that in FIG. 3(*g*).

Example 2

A wiring substrate including the substrate, the conductor wiring (Thickness: 30 μm, Width: 190 μm) provided on the substrate, and the insulating magnetic layer with a thickness of 5 μm, covering the top surface and one lateral surface of the conductor wiring, was obtained as with Example 1, except that a portion of the photosensitive layer, which was positioned on the conductor wiring and on one of portions of the insulating magnetic layer adjacent to the pair of lateral surfaces of the conductor wiring, was exposed when exposing the photosensitive layer formed on the conductor wiring. The obtained wiring substrate has the same configuration as that in FIG. 3(*h*).

Example 3

A wiring substrate including the substrate, the conductor wiring (Thickness: 30 μm, Width: 190 μm) provided on the substrate, and an insulating magnetic layer with a thickness of 5 μm, covering the top surface and the pair of lateral surfaces of the conductor wiring, was obtained as with Example 1, except that a portion of the photosensitive layer, which was positioned on the conductor wiring and on both portions of the insulating magnetic layer adjacent to the pair of lateral surfaces of the conductor wiring, was exposed when exposing the photosensitive layer formed on the conductor wiring. The obtained wiring substrate has the same configuration as that in FIG. 2(*a*).

Example 4

The insulating magnetic layer covering the top surface of the conductor wiring in the wiring substrate obtained in Example 2 was removed by a fly cutting method. Accordingly, a wiring substrate including the substrate, the conductor wiring (Thickness: 30 μm, Width: 190 μm) provided on the substrate, and the insulating magnetic layer with a thickness of 5 μm, covering one lateral surface of the conductor wiring, was obtained. The obtained wiring substrate has the same configuration as that in FIG. 2(*e*).

Example 5

The insulating magnetic layer covering the top surface of the conductor wiring in the wiring substrate obtained in Example 3 was removed by a fly cutting method. Accordingly, a wiring substrate including the substrate, the conductor wiring (Thickness: 30 μm, Width: 190 μm) provided on the substrate, and the insulating magnetic layer with a thickness of 5 μm, covering the pair of lateral surfaces of the conductor wiring, was obtained. The obtained wiring substrate has the same configuration as that in FIG. 2(*d*).

Example 6

The composition for forming an insulating magnetic layer obtained as described above was applied onto PET with a bar coater and dried to obtain a sheet consisting of the composition for forming an insulating magnetic layer. The obtained sheet was laminated on a prepreg (Product Name: GEA-705G, manufactured by Showa Denko Materials Co., Ltd., Thickness: 25 μm), which is a substrate, by vacuum pressing. The pressing was performed in vacuum (30 to 40 torr) by increasing the temperature to 130° C. from a room temperature at 4° C./minute, performing retention for 10 minutes, and then, performing pressurization at 3 MPa (a product pressure), increasing the temperature to 230° C., and retaining the pressure and the temperature for 120 minutes. Accordingly, an insulating magnetic layer (Thickness: 5 μm) was formed on the substrate. Next, a plating seed layer consisting of copper (Thickness: 0.5 μm) was formed on the insulating magnetic layer on a side opposite to the substrate by electroless plating. Accordingly, a laminate A (Substrate/Insulating Magnetic Layer/Plating Seed Layer) was obtained.

Next, a negative photosensitive resin composition solution (Product Name: PMER P-LA900PM, manufactured by TOKYO OHKA KOGYO CO., LTD.) was applied onto the laminate A on the plating seed layer side to form a photosensitive layer (Thickness: 50 μm). Next, the photosensitive layer was pattern-exposed and developed such that an unexposed portion was developed to form an opening portion having a wiring pattern with a width of 190 μm. As a developer, a PMER developer P-7G (manufactured by TOKYO OHKA KOGYO CO., LTD.) was used. Accordingly, a resist film including the opening portion having a wiring pattern with a width of 190 μm was formed on the plating seed layer.

Next, a plating layer consisting of copper (Thickness: 29.5 μm) was formed on a region of the laminate A exposed from the opening portion of the resist film by plating, and then, the resist film was removed by using methyl ethyl ketone. Next, in the plating seed layer and the insulating magnetic layer of the laminate A, a portion covered with the resist film was removed by using CPE-700 (Product Name, manufactured by MITSUBISHI GAS CHEMICAL COMPANY, INC.). As described above, a wiring substrate including the substrate, the conductor wiring (Thickness: 30 μm, Width: 190 μm) provided on the substrate, and the insulating magnetic layer with a thickness of 5 μm, covering the bottom surface of the conductor wiring, was obtained. The obtained wiring substrate has the same configuration as that in FIG. 2(*b*).

Example 7

The composition for forming an insulating magnetic layer obtained as described above was applied to the surface of a copper foil (Thickness: 30 μm) by spin coating, dried, and cured. Accordingly, an insulating magnetic layer (Thickness: 5 μm) was formed on the copper foil. Next, a prepreg (Product Name: GEA-705G, manufactured by Showa Denko Materials Co., Ltd., Thickness: 25 μm), which is a substrate, was pasted to the insulating magnetic layer on a side opposite to the copper foil to obtain a laminate B (Substrate/Insulating Magnetic Layer/Copper Foil).

Next, as with Example 6, a photosensitive layer was formed on the laminate B on the copper foil side. Next, the photosensitive layer was pattern-exposed and developed such that an exposed portion became a wiring pattern with a width of 190 μm. As a developer, a PMER developer P-7G (manufactured by TOKYO OHKA KOGYO CO., LTD.) was used. Accordingly, a resist film including an opening portion was formed on the copper foil. The resist film has a wiring pattern with a width of 190 μm in a portion other than the opening portion.

Next, in the copper foil and the insulating magnetic layer of the laminate B, a portion positioned between the opening portion of the resist film and the substrate of the laminate B was removed by using CPE-700 (Product Name, manufactured by MITSUBISHI GAS CHEMICAL COMPANY, INC.), and then, the resist film was removed by using methyl ethyl ketone. As described above, a wiring substrate including the substrate, the conductor wiring (Thickness: 30 μm, Width: 190 μm) provided on the substrate, and the insulating magnetic layer with a thickness of 5 μm, covering the bottom surface of the conductor wiring, was obtained.

Next, the composition for forming an insulating magnetic layer obtained as described above was applied to the surface of a PET film with a bar coater to form a sheet consisting of the composition for forming an insulating magnetic layer on the PET film. By laminating the obtained sheet on a region of the wiring substrate obtained as described above in which the conductor wiring was formed, a layer consisting of the composition for forming an insulating magnetic layer was formed on the region to cover the top surface and the pair of lateral surfaces of the conductor wiring.

Next, the composition for forming an insulating magnetic layer was cured to form an insulating magnetic layer (Thickness: 5 μm), and then, as with Example 6, a photosensitive layer was formed on the insulating magnetic layer on a side opposite to the substrate. Next, a portion of the photosensitive layer positioned on the conductor wiring was exposed and developed. As a developer, a PMER developer P-7G (manufactured by TOKYO OHKA KOGYO CO., LTD.) was used. Accordingly, a resist film including an opening portion in a portion other than the portion positioned on the conductor wiring was formed.

Next, in the insulating magnetic layer covering the conductor wiring, a portion positioned between the opening portion of the resist film and the substrate was removed by using CPE-700 (Product Name, manufactured by MITSUBISHI GAS CHEMICAL COMPANY, INC.), and then, the resist film was removed by using methyl ethyl ketone. As described above, a wiring substrate including the substrate, the conductor wiring (Thickness: 30 μm, Width: 190 μm) provided on the substrate, and the insulating magnetic layer with a thickness of 5 μm, covering the bottom surface and the top surface of the conductor wiring, was obtained. The obtained wiring substrate has the same configuration as that in FIG. 2(*c*).

Example 8

A wiring substrate including the substrate, the conductor wiring (Thickness: 30 μm, Width: 190 μm) provided on the substrate, and the insulating magnetic layer with a thickness of 5 μm, covering the bottom surface, the top surface, and one lateral surface of the conductor wiring, was obtained as with Example 7, except that a portion of the photosensitive layer, which was positioned on the conductor wiring and on one of portions of the insulating magnetic layer adjacent to the pair of lateral surfaces of the conductor wiring, was exposed when exposing the photosensitive layer formed on the conductor wiring. The obtained wiring substrate has the same configuration as that in FIG. 3(*j*).

Example 9

A wiring substrate including the substrate, the conductor wiring (Thickness: 30 μm, Width: 190 μm) provided on the substrate, and the insulating magnetic layer with a thickness of 5 μm, covering the bottom surface, the top surface, and the pair of lateral surfaces of the conductor wiring, was obtained as with Example 7, except that a portion of the photosensitive layer, which was positioned on the conductor wiring and on both portions of the insulating magnetic layer adjacent to the pair of lateral surfaces of the conductor wiring, was exposed when exposing the photosensitive layer formed on the conductor wiring. The obtained wiring substrate has the same configuration as that in FIG. 1.

Example 10

The insulating magnetic layer covering the top surface of the conductor wiring in the wiring substrate obtained in Example 8 was removed by a fly cutting method. Accordingly, a wiring substrate including the substrate, the conductor wiring (Thickness: 30 μm, Width: 190 μm) provided on the substrate, and the insulating magnetic layer with a thickness of 5 μm, covering the bottom surface and one lateral surface of the conductor wiring, was obtained. The obtained wiring substrate has the same configuration as that in FIG. 3(*i*).

Example 11

The insulating magnetic layer covering the top surface of the conductor wiring in the wiring substrate obtained in Example 9 was removed by a fly cutting method. Accordingly, a wiring substrate including the substrate, the conductor wiring (Thickness: 30 μm, Width: 190 μm) provided on the substrate, and the insulating magnetic layer with a thickness of 5 μm, covering the bottom surface and the pair of lateral surfaces of the conductor wiring, was obtained. The obtained wiring substrate has the same configuration as that in FIG. 2(*f*).

<Evaluation of Transmission Loss of Wiring Substrate>

A transmission loss of the wiring substrate produced as described above was evaluated by a triplate line resonator method. Note that, in the triplate line resonator method, a vector network analyzer (E8364B, manufactured by Keysight Technologies) was used. A measurement condition was set to Line Width: 0.15 mm, Line Length: 10 mm, Characteristic Impedance: approximately 50 (2, Frequency: 10, 30, and 50 GHZ, and Measurement Temperature: 25° C. On the basis of the measured value of Comparative Example 1, a case where the transmission loss was decreased was evaluated as "A", and a case where the transmission loss was not changed or increased was evaluated as "B".

TABLE 2

| | Conductor wiring | Insulating magnetic layer (μm) Top surface | Bottom surface | Lateral surface 1 | Lateral surface 2 | Transmission loss |
|---|---|---|---|---|---|---|
| Example 1 | Cu | 5 | — | — | — | A |
| Example 2 | Cu | 5 | — | 5 | — | A |
| Example 3 | Cu | 5 | — | 5 | 5 | A |
| Example 4 | Cu | — | — | 5 | — | A |
| Example 5 | Cu | — | — | 5 | 5 | A |
| Example 6 | Cu | — | 5 | — | — | A |
| Example 7 | Cu | 5 | 5 | — | — | A |
| Example 8 | Cu | 5 | 5 | 5 | — | A |
| Example 9 | Cu | 5 | 5 | 5 | 5 | A |

TABLE 2-continued

| | Conductor wiring | Insulating magnetic layer (μm) Top surface | Bottom surface | Lateral surface 1 | Lateral surface 2 | Transmission loss |
|---|---|---|---|---|---|---|
| Example 10 | Cu | — | 5 | 5 | — | A |
| Example 11 | Cu | — | 5 | 5 | 5 | A |
| Comparative Example 1 | Cu | — | — | — | — | — |

REFERENCE SIGNS LIST

2, 2*a*, 2*b*, 2*c*, 2*d*: insulating material layer, 4: plating seed layer, 5: conductor layer, 6: plating layer, 7*a*, 7*b*, 7*c*: photosensitive layer, 8*a*, 8*b*, 8*c*: resist film, 10: substrate, 12: substrate with insulating magnetic layer, 20: conductor wiring, 30: insulating magnetic layer, 35: composition for forming insulating magnetic layer, 50A, 50B: laminate, 100, 100A, 100B, 100C, 100D, 100E, 110, 110A, 110B, 120, 130: wiring substrate, H1, H2, H3, H4, H5, H6: opening portion.

The invention claimed is:

1. A wiring substrate, comprising:

a substrate;

conductor wiring provided on the substrate, the conductor wiring including a bottom surface facing the substrate, a top surface facing away from the substrate, and a pair of lateral surfaces positioned between the bottom surface and the top surface; and an insulating magnetic layer provided on a periphery of the conductor wiring, wherein the insulating magnetic layer consists of an insulator containing a magnetic material, wherein the insulating magnetic layer has a cross-sectional surface in the shape of a dome that swells away from the substrate, and wherein the insulating magnetic layer covers at least the top surface and the pair of lateral surfaces of the conductor wiring.

2. The wiring substrate according to claim 1, wherein a maximum covering thickness of the insulating magnetic layer is less than 100 μm, and a minimum covering thickness of the insulating magnetic layer is greater than 0.1 μm.

3. The wiring substrate according to claim 1, wherein the magnetic material is a metal oxide or an amorphous metal.

4. The wiring substrate according to claim 1, wherein a relative magnetic permeability of the insulator is 2 to 1000.

5. The wiring substrate according to claim 1, wherein a relative permittivity of the insulator is 1 to 30.

6. The wiring substrate according to claim 1, wherein the insulating magnetic layer covers the top surface, the bottom surface, and the pair of lateral surfaces of the conductor wiring.

7. The wiring substrate according to claim 6, wherein a portion of the insulating magnetic layer is located between the bottom surface of the conductor wiring and the substrate.

8. The wiring substrate according to claim 1, wherein the bottom surface of the conductor wiring contacts the substrate.

* * * * *